United States Patent
Asai et al.

(10) Patent No.: US 6,491,250 B1
(45) Date of Patent: Dec. 10, 2002

(54) ROTARY-TYPE CIRCUIT-COMPONENT SUPPLYING APPARATUS

(75) Inventors: Koichi Asai, Nagoya (JP); Shinsuke Suhara, Kariya (JP)

(73) Assignee: Fuji Machine Mfg. Co., Ltd., Chiryu (JP)

( * ) Notice: Subject to any disclaimer, the term of this patent is extended or adjusted under 35 U.S.C. 154(b) by 0 days.

(21) Appl. No.: 09/626,920

(22) Filed: Jul. 27, 2000

Related U.S. Application Data

(62) Division of application No. 09/061,187, filed on Apr. 17, 1998, now Pat. No. 6,189,206.

(30) Foreign Application Priority Data

May 12, 1997 (JP) .............................................. 9-121187

(51) Int. Cl.$^7$ ................................................ B23P 19/00
(52) U.S. Cl. .................. 242/559.1; 29/740; 414/223.01; 414/403; 242/559.2; 242/558; 242/566
(58) Field of Search .................. 29/740, 714, 739, 29/564.6; 414/403, 404, 416, 417, 223.01, 223.02, 331.01, 331.05; 104/35, 36; 242/559, 559.1, 558, 566, 550, 559.2

(56) References Cited

U.S. PATENT DOCUMENTS

| 4,313,251 A | * | 2/1982 | Asai et al. ................. 29/739 X |
| 4,453,347 A |   | 6/1984 | Redeker et al. |
| 4,745,679 A | * | 5/1988 | Shinano et al. ............... 29/741 |
| 5,062,763 A |   | 11/1991 | Maier |
| 5,222,285 A |   | 6/1993 | Horikawa |
| 5,299,902 A |   | 4/1994 | Fujiwara et al. |
| 5,515,600 A | * | 5/1996 | Iwasaki et al. ............... 29/740 |
| 5,873,691 A |   | 2/1999 | Asai et al. |

FOREIGN PATENT DOCUMENTS

JP    A-86197    3/1990

\* cited by examiner

Primary Examiner—Frank E. Werner
(74) Attorney, Agent, or Firm—Oliff & Berridge PLC

(57) ABSTRACT

A rotary-type circuit-component supplying apparatus including a plurality of feeders each of which stores a plurality of circuit components of a same sort and which supplies the components one by one from a component-supply portion thereof, at least one rotary table which is rotatable about a first axis line which is substantially vertical and which holds the feeders such that the respective component-supply portions of the feeders are arranged along a circle having a center on the first axis line, and a table-driving device which rotates and stops the rotary table to position the component-supply portion of each of the feeders at a predetermined component-supplying position, the feeders including at least one pendent feeder which includes a main portion which is held by the rotary table such that the main portion extends in a substantially horizontal direction, and which supports a tape-feeding mechanism which feeds a tape carrying the circuit components to the component-supply portion of the pendent feeder, and a reel-holding portion which is pendent from the main portion and which holds a reel around which the tape is wound, such that a whole of the reel is positioned below the main portion.

11 Claims, 21 Drawing Sheets

FIG. 13

TIME

BUCKET 400 AND REEL HOLDERS 310

CIRCULAR TABLE 202 AND FEEDER MAIN DEVICES 254

ANGLE OF ROTATION

ROTARY-TYPE CIRCUIT-COMPONENT SUPPLYING APPARATUS

This is a Division of application Ser. No. 09/061,187 filed Apr. 17, 1998, now U.S. Pat. No. 6,189,206. The entire disclosure of the prior applications is hereby incorporated by reference herein in its entirety.

BACKGROUND OF THE INVENTION

1. Field of the Invention

The present invention relates to a rotary-type circuit-component supplying apparatus, a circuit-component feeder, and a circuit-component supplying method, and relates particularly to the art of improving the circuit-component supplying efficiency.

2. Related Art Statement

There is known a rotary-type circuit-component supplying apparatus which includes a circular (i.e., full-circular) table, and a plurality of feeders which are held by the circular table and each of which includes a component-supply portion. When the table is rotated, the component-supply portion of each of the feeders is sequentially positioned at a component-supplying position where the each feeder supplies at least one circuit component from the component-supply portion thereof. In this rotary-type circuit-component supplying apparatus, each of the feeders stores a plurality of circuit components of a same sort and supplies the components one by one from the component-supply portion thereof, and the circular table is rotatable about an axis line which is substantially vertical and holds the feeders such that the respective component-supply portions of the feeders are arranged along a circle having a center on the axis line. The present apparatus further includes a table-driving device which rotates and stops the circular table to position the component-supply portion of each of the feeders at a predetermined component-supplying position.

Each feeder may be one which includes a main portion which supports a feeding mechanism which feeds a tape carrying circuit components to a component-supply portion thereof, and a reel-holding portion which holds a reel around which the tape is wound. In the known feeder, the component-supply portion thereof is provided by one of opposite end portions thereof in a tape-feeding direction in which the tape is fed by the feeding mechanism, and the reel-holding portion thereof is provided by the other end portion thereof. The main portion and the reel-holding portion are arranged in series in the tape-feeding direction, and are provided in a common plane such that at least a portion of the reel-holding portion overlaps the main portion in a direction perpendicular to the tape-feeding direction and the direction of width of the main portion.

The rotary-type circuit-component supplying apparatus enjoys a more compact construction than a linear-type circuit-component supplying apparatus which includes a plurality of feeders, a movable table which is movable along a straight line and which supports the feeders such that respective component-supply portions of the feeders are arranged along the straight line, and a driving device which moves and stops the table along the straight line to position the component-supply portion of each of the feeders at a component-supplying position where the each feeder supplies at least one circuit component from the component-supply portion thereof. The linear-type apparatus needs, in addition to a space which is occupied by the table, a space in which the table is moved. Thus, the linear-type apparatus needs at least two times as much space as that needed by the rotary-type apparatus. In addition, it can be generally said that when the circular table is rotated, the table generates only the momentum about the axis line of rotation thereof. Therefore, the rotary-type apparatus produces less vibration than the linear-type apparatus. Accordingly, the vibration of the floor on which the rotary-type apparatus is placed is reduced, which leads to prevent operators working on the floor from feeling discomfort and which leads to preventing other apparatuses placed on the same floor, from suffering problems which would otherwise be caused by the vibration, for example, lowered accuracy of positioning of a movable member.

However, the known rotary-type circuit-component supplying apparatus has some problems to be solved for improving its circuit-component supplying efficiency. For example, when the tape carrying the circuit components has been completely consumed on each feeder, the reel of the feeder, or the feeder itself, should be replaced by another reel or feeder. To this end, the operation of the supplying apparatus must be stopped. Accordingly, in recent years, it has been practiced to employ a long tape for reducing the frequency of the replacing or stopping operations and thereby improving the supplying efficiency. However, the longer the tape is, the greater the size of the reel or the reel-holding portion should be. Thus, it is more difficult for each feeder to be mounted on the circular table. As described above, in the known feeder, the component-supply portion thereof is provided by one of opposite end portions of the main portion thereof, and the reel-holding portion thereof is connected to the other end portion of the main portion. The known feeder must be mounted on the circular table, such that the component-supply portion thereof is located along the outer peripheral portion of the table and the reel-holding portion is located on the side of the axis line of rotation of the table. Accordingly, in order to mount, on a circular table, a feeder having a great reel-holding portion which can hold a reel having a great diameter, the circular table should also have a great diameter. In addition, generally, the reel-holding portion has a greater width than that of the main portion. Since the feeders are mounted on the circular table having an annular shape such that the reel-holding portions of the feeders are located along the inner peripheral portion of the annular table, it is easy to provide a sufficient space between each pair of adjacent main portions, whereas it is difficult to provide a sufficient space between each pair of adjacent reel-holding portions. Thus, the maximum number of feeders that can be mounted on the circular table is limited to a small one. Accordingly, the frequency of the reel or feeder replacing operations cannot be reduced and the circuit-component supplying efficiency cannot be improved. An increased number of feeders can be mounted on a circular table having an increased diameter. In the last case, however, the inertial moment of the circular table and the feeders held thereby is increased, and the acceleration and deceleration at which the table is rotated should be lowered for reducing the vibration produced thereby. Eventually, a longer time is needed for positioning each feeder, which lowers the supplying efficiency.

SUMMARY OF THE INVENTION

It is therefore an object of the present invention to provide a rotary-type circuit-component supplying apparatus which enjoys an improved circuit-component supplying efficiency.

It is another object of the present invention to provide a circuit-component feeder which is employed in a circuit-component supplying apparatus and contributes to improving the circuit-component supplying efficiency of the apparatus.

It is another object of the present invention to provide a circuit-component mounting system which employs a rotary-type circuit-component supplying apparatus and enjoys an improved circuit-component mounting efficiency.

It is another object of the present invention to provide a circuit-component supplying method wherein respective component-supply portions of a plurality of circuit-component feeders are sequentially positioned at a component-supplying position, when at least one rotary table is rotated and stopped, and circuit components are supplied from the feeders with improved efficiency.

The present invention provides a rotary-type circuit-component supplying apparatus, a circuit-component feeder, a circuit-component mounting system, and a circuit-component supplying method which have one or more of the technical features which are described below in respective paragraphs given parenthesized sequential numbers (1) to (31). Any technical feature which includes another technical feature shall do so by referring, at the beginning, to the parenthesized sequential number given to that technical feature. Thus, two or more of the following technical features may be combined, if appropriate. Each technical feature may be accompanied by a supplemental explanation, as needed.

(1) According to a first feature of the present invention, there is provided a rotary-type circuit-component supplying apparatus comprising a plurality of feeders each of which stores a plurality of circuit components of a same sort and which supplies the components one by one from a component-supply portion thereof; at least one rotary table which is rotatable about a first axis line which is substantially vertical and which holds the feeders such that the respective component-supply portions of the feeders are arranged along a circle having a center on the first axis line; and a table-driving device which rotates and stops the rotary table to position the component-supply portion of each of the feeders at a predetermined component-supplying position, the feeders comprising at least one pendent feeder which comprises a main portion which is held by the rotary table such that the main portion extends in a substantially horizontal direction, and which supports a tape-feeding mechanism which feeds a tape carrying the circuit components to the component-supply portion of the pendent feeder, and a reel-holding portion which is pendent from the main portion and which holds a reel around which the tape is wound, such that a whole of the reel is positioned below the main portion. All of the plurality of feeders may be ones each of which includes a main portion and a reel-holding portion, or only one or more (not all) of the feeders may be one or ones each of which includes a main portion and a reel-holding portion. In the latter case, one or more feeders other than the feeder or feeders each of which includes the main portion and the reel-holding portion may be, e.g., one or ones each of which arranges, by utilizing vibration, tilt, or air flow, circuit components stored in its casing, into an array, and feeds the components one by one to its component-supply portion. All of the plurality of feeders may be pendent feeders, or only one or more (not all) of the feeders may be a pendent feeder or feeders. In the latter case, one or more feeders other than the pendent feeder or feeders may be, e.g., a known one or ones each of which includes a main portion and a reel-holding portion which is connected in series to one end portion of the main portion. The known feeder or feeders may be employed for supplying circuit components of a particular sort which is rarely supplied or which has a very small size. The at least one rotary table may consist of a single circular (full-circular) table, or a plurality of sectorial tables. A space may be provided around the first axis line of the rotary table and below a portion of the table which holds the main portions of the feeders, and the reel-holding portions of the feeders may be accommodated in the space, without being interfered with by the table-driving device, such that the reel of each of the feeders is entirely located below the main portion of the each feeder and such that at least a portion of the reel-holding portion of the each feeder overlaps the main portion in a component-feeding direction. Accordingly, the pendent feeder may have, in the component-feeding direction, a dimension smaller than that of the known feeder whose main portion and reel-holding portion are connected to each other in series in that direction. Thus, the rotary table or tables may have a smaller radius for holding a number of pendent feeders than for holding the same number of known feeders. Therefore, the frequency of the reel or feeder replacing operations can be reduced. In addition, the rotary table or tables can be rotated and stopped at higher acceleration and deceleration. Thus, the present apparatus can enjoy a higher component-supplying efficiency. The present apparatus is free from the disadvantage of the known rotary-type circuit-component supplying apparatus that the known apparatus is not suitable for use with feeders which have large reel-holding portions capable of holding large reels. The feeders, the rotary table or tables, and the table-driving device may be covered by a compact cover member for preventing safety hazards and/or noise generation.

(2) According to a second feature of the present invention which includes the first feature (1), the at least one pendent feeder further comprises a reel-holding-portion connecting device which connects the reel-holding portion to the main portion such that a center of gravity of the reel-holding portion and the reel held thereby is movable relative to the main portion in a direction substantially parallel to a direction in which the pendent feeder is moved by the rotation of the rotary table. In the present apparatus, since the main portion of the pendent feeder is held by the rotary table, the main portion is rotated as if it were an integral portion of the table, when the table is rotated. However, the reel-holding portion and the reel whose center of gravity is movable relative to the main portion in the direction of movement of the pendent feeder do not have to be rotated as if they were integral portions of the table. More specifically described, since the reel-holding-portion connecting device connects the reel-holding portion to the main portion, the reel-holding portion and the reel are also rotated when the main portion is rotated, but are delayed, because of their inertial mass, from the main portion. Thus, the reel-holding portion and the reel are rotated at an acceleration and deceleration which are lower than an acceleration and a deceleration at which the main portion is rotated. Therefore, the vibration generated by the present apparatus as a whole is small. On the other hand, if the reel-holding portion and the reel are rotated at the same acceleration and deceleration as those of the main portion, the vibration generated by the present apparatus would be large. Accordingly, in the present apparatus, the rotary table may be rotated at higher acceleration and deceleration to more rapidly position the component-supply portion of each feeder at the component-supplying position, if the present apparatus is allowed to vibrate at the same level as that at which the apparatus would vibrate when the reel-holding portion and the reel are rotated at the same acceleration and deceleration as those of the main portion. Thus, the present apparatus can improve its component-supplying efficiency. Alternatively, the present apparatus can reduce the vibration and thereby improve the accuracy of positioning of each feeder at the component-supplying position, without improving the component-supplying efficiency. In the latter case, the present apparatus can employ the table-driving device which has a small capacity or low performance. The longer the circuit-component carrying tape is, and the larger the total mass of the reel and the tape wound around the reel is, the more advantageous the present apparatus is. In the case where the at least one rotary table consists of a single circular table, the circular table produces a moment about the first axis line only. Accordingly, the vibration generated by the present apparatus as a whole is naturally smaller than that generated in the case where the rotary table is replaced by a linearly movable table which is linearly movable. In the present apparatus, additionally, the reel-holding portion and the reel can be rotated at low acceleration and deceleration. Thus, the vibration generated by the apparatus is still smaller. Accordingly, the present apparatus can still more improve its component-supplying efficiency. In the case where the at least one rotary table comprises at least one sectorial table which is rotatable about an axis line, like the circular table, but whose center of gravity does not ride on the axis line, unlike the circular table, the sectorial table have some natures similar to those of the linearly movable table. However, owing to the sectorial table, the present apparatus generates only smaller vibration as compared with an apparatus employing the linearly movable table. In addition, since the component-holding portion and the circuit components are rotated at lower acceleration and deceleration than the sectorial table, the vibration generated by the present apparatus is still smaller. Accordingly, the present apparatus can still more improve its component-supplying efficiency. The reel-holding-portion connecting device may be one, described later, which includes a connecting member and two hinge devices and which allows the whole of the reel-holding portion to be substantially parallel-translated relative to the main portion. However, it is not limited to that. For example, the connecting device may be provided by an attachment portion of the reel-holding portion which is attached to the main portion and which is formed of an elastically deformable material. In this case, too, the attachment portion allows the center of gravity of the reel-holding portion and the reel to be moved relative to the main portion. That is, without any connecting device independent of the reel-holding portion, the center of gravity of the reel-holding portion and the reel may be allowed to move relative to the main portion.

(3) According to a third feature of the present invention which includes the second feature (2), the feeders comprises a plurality of the pendent feeders, and the apparatus further comprises a reel-holding-portion binder including a plurality of engaging portions which are engaged with the reel-holding portions of the pendent feeders, respectively, such that the reel-holding-portion binder is substantially immovable relative to the reel-holding portions in a direction parallel to a circle having a center on the first axis line. The reel-holding-portion binder may be one which simply binds the reel-holding portions of the pendent feeders with each other, is held by the reel-holding portions, and prevents the reel-holding portions from swinging independent of each other. However, as described later, the binder may be provided by a bucket which is attached by a binder attaching device to the rotary table such that the bucket is rotatable relative to the table. In this case, the weight of the binder is supported by the rotary table, and accordingly the reel-holding portion of each pendent feeder does not have to be strong enough to support the binder. Alternatively, at least a portion of the weight of the reel-holding portion may be supported by the binder. In either case, the reel-holding portion and/or the connecting device may be simplified. When the rotary table is rotated, the reel-holding portions that are prevented by the binder from being moved relative to each other are delayed together with each other from the corresponding main portions. Thus, those reel-holding portions are effectively prevented from individually moving relative to each other and thereby colliding with each other. Therefore, the generation of vibration and noise is minimized.

(4) According to a fourth feature of the present invention which includes the third feature (3), the circuit-component supplying apparatus further comprises a shock-absorbing following-causing device which causes the reel-holding-portion binder to follow the rotary table being rotated, while absorbing a shock produced by the binder following the table. The shock-absorbing following-causing device allows the reel-holding-portion binder to be delayed from the rotary table and causes the binder to follow the table being rotated, while reducing the vibration produced by the binder. Thus, the following-causing device causes the reel-holding portions to follow the corresponding main portions. That is, the reel-holding portions follow the corresponding main portions, while being delayed therefrom. The following-causing device causes the binder to follow the table, while preventing a great shock from being produced when the movement of the binder is started or stopped. Therefore, the reel-holding portions can slowly and reliably follow the corresponding main portions, respectively.

(5) According to a fifth feature of the present invention which includes the fourth feature (4), the shock-absorbing following-causing device comprises a delay-allowing and returning device which allows, when the rotary table is accelerated, the reel-holding-portion binder to delay from a reference phase thereof relative to the table, and which returns, when the acceleration of the table continues to be zero, the binder to the reference phase thereof relative to the table. In the present apparatus, when the rotary table is accelerated, the reel-holding-portion binder is delayed with the reel-holding portions, from the table, which leads to preventing a larger vibration which would be produced if the binder and the reel-holding portions are moved at the same acceleration as that of the table. When the acceleration of the rotary table continues to be zero in a state in which the table is stopped, or is moved at a constant speed, the binder is returned with the reel-holding portions to its reference phase relative to the table.

(6) According to a sixth feature of the present invention which includes the fifth feature (5), the delay-allowing and returning device comprises a biasing device which biases, between the reel-holding-portion binder and the rotary table, the binder toward the reference phase thereof relative to the table; and a damping device which reduces a speed of the movement of the binder relative to the table. In the present apparatus, the reel-holding-portion binder is returned to its reference phase relative to the rotary table, by the biasing force of the biasing device. In addition, the damping device lowers the speed of movement of the binder relative to the table. Thus, the vibration of the binder relative to the table is effectively attenuated. The damping device may be one which lowers the speed of movement of the binder relative to the table when the binder is returned to its reference position relative to the table by the biasing force of the biasing device, as will be described in connection with the preferred embodiments of the invention; or one which lowers the speed of movement of the binder relative to the table when the table is accelerated and accordingly the binder is delayed from the table, as will be also described in connection with the embodiments of the invention. Moreover, in the case where the attenuating force of the damping device increases as the amount of delaying of the binder from the table increases, the damping device prevents the generation of a large shock and also functions as a stopping device which limits the amount of delaying of the binder from the table, i.e., defines the maximum delaying amount of the binder from the table. All those advantages are possessed by the preferred embodiments of the invention, described later, wherein the damping effect and the delaying-amount limiting effect, in particular, are exhibited irrespective of in which direction the table is rotated.

(7) According to a seventh feature of the present invention which includes any one of the third to sixth features (3) to (6), the reel-holding-portion binder comprises a bucket which opens upward and which accommodates the respective reel-holding portions of the pendent feeders. In this case, the reel-holding portions of the pendent feeders are protected by the bucket and are prevented from being interfered with by the other elements.

(8) According to an eighth feature of the present invention which includes any one of the second to seventh features (2) to (7), the reel-holding-portion connecting device comprises connecting means for connecting the reel-holding portion of the pendent feeder to the main portion thereof such that a whole of the reel-holding portion is substantially parallel-translateable relative to the main portion in the direction substantially parallel to the direction in which the pendent feeder is moved by the rotation of the rotary table. In the present apparatus, the reel-holding portion of the pendent feeder is substantially parallel-translateable relative to the main portion thereof. Therefore, the angle of inclination of the reel-holding portion when the reel-holding portion is delayed from the main portion is smaller (or zero) than that in the case, described later, where the reel-holding portion is connected to the main portion such that the reel-holding portion is pivotable relative to the main portion about an axis line.

(9) According to a ninth feature of the present invention which includes the eighth feature (8), the connecting means comprises at least one connecting member which extends in a direction parallel to the first axis line; a first hinge device which connects one of opposite end portions of the connecting member to the main portion of the pendent feeder, such that the connecting member is pivotable about a second axis line which is perpendicular to the direction of movement of the pendent feeder; and a second hinge device which connects the other end portion of the connecting member to the reel-holding portion of the pendent feeder, such that the connecting member is pivotable about a third axis line which is perpendicular to the direction of movement of the pendent feeder and which is distant from the second axis line in the direction parallel to the first axis line. The connecting member is pivotable about the second axis line relative to the main portion of the pendent feeder, and is pivotable about the third axis line relative to the reel-holding portion of the same feeder. Thus, the connecting member allows the reel-holding portion to be parallel translated relative to the main portion. Meanwhile, the connecting means may be provided by an elastic or flexible member (e.g., a leaf spring positioned in a plane containing the first axis line) which extends in the direction parallel to the first axis line. In this case, the elastic deformation of the elastic member allows the relative movement of the main portion and the reel-holding portion. However, the elastic member has the problem of fatigue failure. In contrast, the connecting means in accordance with the ninth feature (9) is free from that problem. The connecting means has another advantage that when the respective reel-holding portions of a plurality of pendent feeders are delayed from the corresponding main portions, each pair of adjacent reel-holding portions are prevented from being moved relative to each other in a direction parallel to the side surfaces of the reel-holding portions.

(10) According to a tenth feature of the present invention which includes any one of the second to ninth features (2) to (9), the reel-holding-portion connecting device comprises means for connecting the reel-holding portion of the pendent feeder to the main portion thereof such that the reel-holding portion is pivotable relative to the main portion about a second axis line which is perpendicular to the direction of movement of the pendent feeder. In the present apparatus, when the rotary table is rotated and accordingly the main portion of the pendent is moved, the reel-holding portion of the feeder feeder is rotated relative to the main portion, so that the reel-holding portion is delayed from the main portion. This contributes to reducing the vibration of the present apparatus as a whole. Since the reel-holding portion is connected to the main portion such that the reel-holding portion is pivotable about the single, second axis line, the connecting device or means enjoys a simple construction. In the present apparatus, too, it is preferable to employ a reel-holding portion binder which binds the respective reel-holding-portions of a plurality of pendent feeders with each other, so that the reel-holding-portions are prevented from swinging independent of each other. However, in the present apparatus, when the reel-holding-portions are delayed from the main portions, each pair of adjacent reel-holding-portions are moved relative to each other in a direction parallel to the side surfaces of those reel-holding portions. Therefore, the reel-holding portion binder should be one which can bind the reel-holding-portions while allowing each pair of adjacent reel-holding-portions to be moved relative to each other in the direction parallel to the side surfaces thereof. For example, the binder may be provided by a highly flexible member formed of rubber or the like. In addition, it is possible to cover each of the respective contact (i.e., side) surfaces of the reel-holding portions with a cover member (e.g., a rubber member) having a friction coefficient higher than at least that of the material of the reel-holding portions. In this modified form, the swinging (vibration) of the reel-holding portions is effectively attenuated because of the friction between each pair of adjacent cover members. The reel-holding-portion binder may be omitted, and each of the contact surfaces of the reel-holding portions may be provided with a cushion member for reducing the noise generated when each pair of adjacent reel-holding portions collide with each other. In the case where the cushion members have a high friction coefficient, those cushion members exhibit the effect of attenuating the swinging of the reel-holding portions.

(11) According to an eleventh feature of the present invention which includes the fifth or sixth feature (5) or (6), the delay-allowing and returning device comprises at least one connecting member which extends in a direction parallel to the first axis line; a first hinge device which connects one of opposite end portions of the connecting member to the rotary table, such that the connecting member is pivotable about a second axis line which is perpendicular to the direction of movement of the pendent feeder; and a second hinge device which connects the other end portion of the connecting member to the reel-holding-portion binder, such that the connecting member is pivotable about a third axis line which is perpendicular to the direction of movement of the pendent feeder and which is distant from the second axis line in the direction parallel to the first axis line. When the rotary table is rotated, the pivotal movement of the connecting member permits the reel-holding-portion binder to be delayed from the table, so that the binder is slightly moved up, like a pendulum, by the pivotal movement of the connecting member. Thus, the binder stores a potential energy, which provides a force to return the binder to its reference phase relative to the table. Accordingly, without any biasing device or any damping device, the delay-allowing and returning device permits the binder to delay from the table and causes the binder to follow the table at a lower acceleration. Therefore, it is not essentially needed to employ both the first combination of the connecting member and the hinge devices, and the second combination of the biasing device and the damping device, though all of them are employed in the embodiments of the invention which will be described later. The delay-allowing and returning device also functions as a binder attaching (or connecting) device which attaches (or connects) the binder to the table. The delay-allowing and returning device may, or may not, be used with the delay-allowing and returning device in accordance with the sixth feature (6), or vice versa. The delay-allowing and returning device is particularly advantageous when it is used with the pendent feeder including the connecting means in accordance with the ninth feature (9). In this case, when the rotary table is rotated, the reel-holding portion of the feeder and the reel-holding-portion binder behave like each other, with respect to both the direction of movement of the feeder and the vertical direction, so that the relative movement of the reel-holding portion and the binder is reduced. In a particular case where the connecting member of the delay-allowing and returning device has the same length as that of the connecting member of the connecting means of the feeder, the reel-holding portion and the binder behave in the same manner, so that the relative movement of the reel-holding portion and the binder is zeroed. The present circuit-component supplying apparatus may employ an exclusive binder attaching (or connecting) device, in addition to the delay-allowing and returning device. For example, the exclusive binder attaching device may be provided by a pair of annular guide members which extend along a circle whose center rides on the first axis line and which are engaged with each other such that the two guide members are movable relative to each other in a direction along the circle. One of the two guide members is fixed to the binder, and the other guide member is fixed to the table. The pair of guide members has the function of allowing the binder to be delayed from the table, but does not have the function of returning the binder to its reference phase relative to the table. Accordingly, a biasing device as a sort of returning device is employed for returning the binder to its reference phase. In addition, a damping device may be employed for lowering the speed of movement of the binder when it is returned to its reference phase.

(12) According to a twelfth feature of the present invention which includes any one of the first to eleventh features (1) to (11), the main portion of the pendent feeder is elongate in a direction perpendicular to the first axis line, and the reel-holding portion of the pendent feeder is pendent from an intermediate portion of the elongate main portion. In this case, the main portion of the pendent feeder can have, in the component-feeding direction, a dimension which is reduced by the dimension of the reel-holding portion in the same direction. Thus, the present feeder enjoys a compact construction, which contributes to improving the degree of freedom of designing of various peripheral devices of the present apparatus.

(13) According to a thirteenth feature of the present invention which includes the twelfth feature (12), the main portion of the pendent feeder includes a held portion which is located on one side of the intermediate portion thereof and which is held by the rotary table.

(14) According to a fourteenth feature of the present invention which includes the thirteenth feature (13), the main portion of the pendent feeder includes the component-supply portion thereof which is located on the other side of the intermediate portion of the main portion and is more distant from the first axis line than the held portion of the main portion.

(15) According to a fifteenth feature of the present invention which includes any one of the second to eleventh features (2) to (11), the reel-holding-portion connecting device comprises relative-rotation allowing means for allowing the reel-holding portion of the pendent feeder to be rotated relative to the main portion thereof about a second axis line parallel to the first axis line. The pendent feeder is held by the rotary table which is rotatable about the first axis line and, when the table is rotated and accordingly the reel-holding portion is moved relative to the main portion, a small difference is produced between the angular or rotation position of the reel-holding portion and that of the main portion about the first axis line. This difference increases in an radially outward direction from the first axis line. The relative-rotation allowing means allows the generation of this difference, thereby preventing the connecting device from being damaged.

(16) According to a sixteenth feature of the present invention which includes the eleventh feature (11), at least one of the connecting member and the first and second hinge devices of the delay-allowing and returning device comprises relative-rotation allowing means for allowing the reel-holding-portion binder to be rotated relative to the rotary table, about an axis line of the connecting member parallel to the first axis line, when the binder is rotated relative to the table about the first axis line. When the rotary table is rotated, the rotation of the reel-holding-portion binder is delayed from that of the table. Since the binder is attached to the table, a small difference is produced between the rotation position of the binder and that of the table. However, the relative-rotation allowing means allows this difference, thereby preventing the connecting member from being damaged. Even if the binder may not be attached to the table, a small difference is produced between the rotation position of the binder and that of the main portions of the feeders. Hence, it is preferable to employ relative-rotation allowing means for allowing the generation of the difference.

(17) According to a seventeenth feature of the present invention which includes the sixteenth feature (16), the connecting member comprises a torsion member which is elastically twistable about an axis line thereof parallel to the first axis line, and which provides the relative-rotation allowing means. In the case where the connecting means of the pendent feeder comprises the connecting member and the two hinge devices as described above, that connecting member may be likewise provided by a torsion member which is elastically twistable about an axis line thereof parallel to the first axis line, and which provides relative-rotation allowing means for allowing the reel-holding portion to be rotated relative to the main portion.

(18) According to an eighteenth feature of the present invention, there is provided a feeder for storing a plurality of circuit components of a same sort and supplying the components one by one from a component-supply portion thereof, the feeder comprising a main portion which is adapted to be held by a movable table such that the main portion extends in a substantially horizontal direction, and which supports a tape-feeding mechanism which feeds a tape carrying the circuit components to the component-supply portion; and a reel-holding portion which is pendent from the main portion and which holds a reel around which the tape is wound, such that a whole of the reel is positioned below the main portion.

(19) According to a nineteenth feature of the present invention, there is provided a rotary-type circuit-component supplying apparatus comprising a plurality of feeders each of which stores a plurality of circuit components of a same sort and which supplies the components one by one from a component-supply portion thereof; a plurality of rotary tables which are rotatable about a first axis line which is substantially vertical and which hold the feeders such that the respective component-supply portions of the feeders are arranged along a circle having a center on the first axis line; and a table-driving device which rotates and stops the rotary tables to position the component-supply portion of each of the feeders at a predetermined component-supplying position, the plurality of rotary tables comprising a plurality of sectorial tables, a sum of respective central angles of the sectorial tables being smaller than an angle obtained by subtracting, from 360 degrees, a greatest central angle of the respective central angles, the table-driving device comprising an independently driving device which rotates at least one first sectorial table of the plurality of sectorial tables, independent of at least one second sectorial table of the plurality of sectorial tables. The respective central angles of the plurality of sectorial tables may be equal to, or different from, each other. The plurality of feeders may comprise one or more feeders each of which includes a main portion and a reel-holding portion for holding a reel around which a tape carrying circuit components is wound, and/or one or more feeders each of which arranges, by utilizing vibration, tilt, or air flow, circuit components stored in its casing, into an array, and feeds the components one by one to its component-supply portion. The moment of inertia of each of the sectorial tables is smaller than that of a circular table having the same radius. Accordingly, each sectorial table can be rotated and stopped at higher acceleration and deceleration, without increasing its vibration. Thus, the component-supply portion of each of the feeders can be positioned at the component-supplying position in a shorter time, which leads to improving the component-supplying efficiency of the present apparatus. That is, the present apparatus rotates the first and second sectorial tables independent of each other, thereby reducing the overall moment of inertia of the two tables and thus solving the problem of improving the component-supplying efficiency. Each sectorial table is rotated about the first axis line, like a circular table. However, the center of gravity of each sectorial table does not ride on the first axis line, unlike the circular table. Therefore, each sectorial table have some natures similar to those of a linearly movable table. However, owing to the sectorial tables, the present apparatus generates only small vibration as compared with an apparatus employing the linearly movable table. The maximum number of feeders that can be held by each sectorial table is smaller than that of a circular table. However, this raises no problem if the total number of the sorts of the circuit components to be supplied is smaller than the above maximum number. Even in the case where the total number is greater than the maximum number, all the feeders needed may be shared by two or more sectorial tables. In the last case, the plurality of sectorial tables are used for supplying the components. In the case where the plurality of sectorial tables are alternately used for supplying the components, a portion of the 360-degree area around the first axis line is used as a component-supplying area or an operating area, and another portion of the same is used as a waiting area (or a non-operating area into which each sectorial table can be retracted away from the operating area). The plurality of sectorial tables can share the single waiting area. In contrast, in the case where a plurality of tables each of which is linearly movable with feeders are alternately used for supplying circuit components, each table needs its own waiting area. Thus, the present apparatus can employ a smaller waiting area and thereby enjoy a more compact construction. The sum of the respective central angles of the plurality of sectorial tables is determined depending on the number of the sectorial table or tables which is or are simultaneously used for supplying the components, and/or the central angle of each sectorial table. In the case where two or more (not all) of the plurality of sectorial tables are used for supplying the components, the sum is so determined that the two or more sectorial tables may be simultaneously rotated and the component-supply portion of each of the feeders held by each of those sectorial tables may be positioned at the component-supplying position. In the present apparatus, the sum of the respective central angles of the sectorial tables is smaller than the angle obtained by subtracting, from 360 degrees, the greatest central angle of those respective central angles. Therefore, the present apparatus can at least assure that one of the plurality of sectorial tables is rotated for supplying the components without being interfered with by the remaining sectorial table or tables which waits or wait. The table-driving device may comprise two independently driving devices for the first and second sectorial tables, respectively, or a single independently driving device commonly for the first and second tables. In the former case, the first and second tables can be rotated independent of each other. For example, the first and second tables are operated such that initially the first table is used for supplying the components while the second table waits and, just before the first table terminates its component-supplying operation, the second table is moved to follow the first table and, immediately after the termination, the second table starts its component-supplying operation in place of the first table. Thus, two or more independently driving devices can be controlled to rotate two or more sectorial tables as if those tables were an integral unit. In this case, each independently driving device may be one whose capacity is small, because it is required to rotate a single sectorial table only. Meanwhile, in the latter case, it is possible to employ a connecting device which selectively connects the single independently driving device to just one of the first and second tables, so that only the one table connected to the driving device is rotated. Alternatively, it is possible to employ a connecting device which selectively connects the single independently driving device to one or both of the first and second tables, so that the table or tables connected to the driving device is or are rotated. Moreover, it is possible to employ a connecting device which connects two or more sectorial tables to each other and to engage the single independently driving device with one sectorial table which is not currently connected by the connecting device, so that only the one table engaged with the driving device is rotated. Alternatively, it is possible to employ a connecting device which connects two or more sectorial tables to each other and to engage the single independently driving device with at least one of the sectorial tables which are currently connected by the connecting device, so that the two or more tables are rotated as if those tables were an integral unit. In either case, the total number of the independently driving device or devices employed is minimized.

(20) According to a twentieth feature of the present invention which includes the nineteenth feature (19), the feeders comprises at least one pendent feeder which comprises a main portion which is held by the first sectorial table such that the main portion extends in a substantially horizontal direction, and which supports a tape-feeding mechanism which feeds a tape carrying the circuit components to the component-supply portion of the pendent feeder, and a reel-holding portion which is pendent from the main portion and which holds a reel around which the tape is wound, such that a whole of the reel is positioned below the main portion. In the present supplying apparatus, the pendent feeder can be used such that at least a portion of the reel-holding portion overlaps the main portion of the pendent feeder in the component-feeding direction. Therefore, even if the reel-holding portion may be large, the pendent feeder may not have a correspondingly great dimension in the component-feeding direction. Thus, each sectorial table can hold a necessary number of feeders without increasing its radius. Accordingly, each sectorial table can be rotated and stopped at high acceleration and deceleration, while the generation of large vibration is prevented. Thus, the present apparatus enjoys an improved component-supplying efficiency.

(21) According to a twenty-first feature of the present invention which includes the nineteenth or twentieth feature (19) or (20), the plurality of sectorial tables consist of a predetermined number, N, of sectorial tables having respective central angles which are equal to each other and each of which is smaller than $360/(N+1)$. For example, in the case where the plurality of sectorial tables are operated such that one of the sectorial tables supplies the components while the remaining table or tables waits or wait, the operating table supplying the components can be prevented from being interfered with by the waiting table or tables, even when the operating table is located at a supplying-operation starting position or a supplying-operation ending position.

(22) According to a twenty-second feature of the present invention which includes any one of the nineteenth to twenty-first features (19) to (21), the table-driving device comprises table-group-rotating-mode control means for concurrently rotating the at least one first sectorial table and the at least one second sectorial table and thereby sequentially positioning, at the predetermined component-supplying position, the respective component-supply portions of the feeders held by the first and second sectorial tables. The present apparatus can supply a number of sorts of circuit components. The first and second sectorial tables may be rotated concurrently in a literal sense, that is, rotated as a unit, or in a broader sense as explained below in connection with the twenty-third feature (23).

(23) According to a twenty-third feature of the present invention which includes the twenty-second feature (22), the table-group-rotating-mode control means comprises table-following control means for controlling the independently driving device to rotate the first sectorial table as a main-control-target table and thereby sequentially position, at the predetermined component-supplying position, the respective component-supply portions of the feeders held by the main-control-target table, and rotating the second sectorial table to follow the main-control-target table at an acceleration and a deceleration which are lower than an acceleration and a deceleration, respectively, at which the main-control-target table is rotated. Since the second sectorial table is rotated at an acceleration and a deceleration which are lower than an acceleration and a deceleration, respectively, at which the main-control-target table is rotated, the vibration generated by the present apparatus as a whole is small though the angular moment produced by the first and second tables being concurrently rotated is large.

(24) According to a twenty-fourth feature of the present invention which includes any one of the nineteenth to twenty-third features (19) to (23), the table-driving device comprises table-rotating-and-changing-mode control means for rotating, as an operating table, the first sectorial table and thereby sequentially positioning, at the predetermined component-supplying position, the respective component-supply portions of the feeders held by the operating table, keeping the second sectorial table as a waiting table in a waiting area, and changing the operating table with the waiting table. An operator can replace one or more feeders held by the waiting table, with one or more new or different feeders, or replace one or more used reels with one or more new reels. Thus, the waiting table is supplied with new circuit components, or the sorts of the circuit components to be supplied from the waiting table are changed. In addition, the operator can check the waiting table. The table-rotating-and-changing-mode control means may concurrently rotate, as a plurality of operating tables, a plurality of first sectorial tables for supplying circuit components, keep a plurality of second sectorial tables as a plurality of waiting tables in a waiting area, and change the operating tables with the waiting tables, in particular in the case where the total number of the sorts of the circuit components to be supplied is large and accordingly a plurality of sectorial tables are needed for supplying those sorts of circuit components. The present apparatus is more versatile if the table-driving device comprises both the table-group-rotating-mode control means and the table-rotating-and-changing-mode control means.

(25) According to a twenty-fifth feature of the present invention, there is provided a circuit-component mounting system comprising the circuit-component supplying apparatus according to the first feature (1); a circuit-substrate supporting device which supports a circuit substrate; and a circuit-component mounting device which receives the circuit components supplied by the circuit-component supplying apparatus and mounts the components on the circuit substrate supported by the circuit-substrate supporting device. The present system is very advantageous if it employs the circuit-component mounting device in accordance with the twenty-sixth feature (26) described below. However, the present system may employ a circuit-component mounting device of a type which includes one or more component-mounting heads and a movable member which supports the component-mounting head or heads and which is movable to any desired position in one direction, or in each of two directions perpendicular to each other, in a horizontal plane. The latter mounting device may also be so required, for the purpose of, e.g., improving its component-mounting efficiency, that the or each mounting head be able to receive the components at a predetermined position. In particular, in the case where the latter mounting device is provided by the former mounting device of a type wherein the head-revolving device thereof is supported on a movable member which is movable to any desired position in one direction, or in each of two directions perpendicular to each other, in a horizontal plane, it is preferred that each of the component-mounting or -holding heads be able to receive circuit components at a predetermined position.

(26) According to a twenty-sixth feature of the present invention which includes the twenty-fifth feature (25), the circuit-component mounting device comprises a plurality of component-holding heads which are revolveable about a second axis line which is inclined with respect to a horizontal plane, and a head-revolving device which revolves the component-holding heads about the second axis line and sequentially stops the heads at a predetermined component-mounting position, and wherein the circuit-substrate supporting device comprises a circuit-substrate supporting member which supports the circuit substrate, and a supporting-member moving device which moves the circuit-substrate supporting member to a desired position on a substantially horizontal plane. The head-revolving device may be one which includes (a) a plurality of rotary members which supports the plurality of component-holding heads, respectively, and which are rotatable about a common axis line, and (b) a rotation-causing device which causes the rotary members to rotate about the common axis line in such a manner that each of the rotary members is stopped at least one time during its full (360 degrees) rotation and such that a predetermined time difference is maintained between each pair of angularly adjacent rotary members. This head-revolving device will be described in connection with the preferred embodiments of the invention. Alternatively, the head-revolving device may be one which includes (a) an intermittent-rotation body which is intermittently rotatable about an axis line and which supports the plurality of component-holding heads such that the heads are equi-angularly spaced from each other about the axis line, and (b) a driving device which intermittently rotates the rotation body. In the latter case, the driving device may be one which can intermittently rotate the rotation body by a predetermined angular pitch in a predetermined direction, or one which can rotate and stop the rotation body by any desired angle in any desired direction. Moreover, in the case where the plurality of component-holding heads are supported on a rotatable body which is rotatable about an axis line, the central angle contained by one pair of angularly adjacent heads may be different from that of another or other pairs of adjacent heads.

(27) According to a twenty-seventh feature of the present invention which includes the twenty-fifth or twenty-sixth feature (25) or (26), the reel-holding portion of the pendent feeder comprises means for holding the reel at a position below the circuit-substrate supporting device. The circuit-substrate supporting device is disposed at a height position suitable for the mounting of components in relation with the component mounting device. Thus, a vacant space may be left under the supporting device, and the reel-holding portion of the pendent feeder may be positioned in that space. That is, a portion of the component supplying device may overlap the substrate supporting device in a horizontal direction. Thus, the present system enjoys a compact construction. In the case where the main portion of the pendent feeder is held at a position higher than that of the circuit-substrate supporting device and, when the components are mounted, the circuit substrate is moved into a space between the main portion and the reel-holding portion, as will be described in connection with the embodiments of the invention, the circuit-component mounting system enjoys a more compact construction.

(28) According to a twenty-eighth feature of the present invention which includes any one of the twenty-fifth to twenty-seventh features (25) to (27), the plurality of rotary tables comprise a plurality of sectorial tables, a sum of respective central angles of the sectorial tables being smaller than an angle obtained by subtracting, from 360 degrees, a greatest central angle of the respective central angles, the table-driving device comprising an independently driving device which rotates at least one first sectorial table of the plurality of sectorial tables, independent of at least one second sectorial table of the plurality of sectorial tables, the table-driving device comprising table-rotating-and-changing-mode control means for rotating, as an operating table, the first sectorial table and thereby sequentially positioning, at the predetermined component-supplying position, the respective component-supply portions of the feeders held by the operating table, keeping the second sectorial table as a waiting table in a waiting area, and changing the operating table with the waiting table, and the table-rotating-and-changing-mode control means comprises means for changing the operating table with the waiting table, depending on a sort of a circuit substrate subsequent to the circuit substrate to which the operating table supplies the circuit components. In this case, the sorts of the feeders held by one of the sectorial tables may be different from those of the feeders held by another or the other of the sectorial tables. While the operating table supplies the circuit components, an operator can change one or more feeders held by the waiting table, with one or more different feeders, depending upon the sort of the circuit substrate subsequent or next to the current circuit substrate for which the operating table supplies the components. Therefore, the present mounting system can immediately start its component mounting operation on a circuit substrate of any sort different from the sort of the preceding circuit substrate.

(29) According to a twenty-ninth feature of the present invention which includes any one of the twenty-fifth to twenty-eighth features (25) to (28), the plurality of rotary tables comprise a plurality of sectorial tables, a sum of respective central angles of the sectorial tables being smaller than an angle obtained by subtracting, from 360 degrees, a greatest central angle of the respective central angles, the table-driving device comprising an independently driving device which rotates at least one first sectorial table of the plurality of sectorial tables, independent of at least one second sectorial table of the plurality of sectorial tables, the table-driving device comprising table-rotating-and-changing-mode control means for rotating, as an operating table, the first sectorial table and thereby sequentially positioning, at the predetermined component-supplying position, the respective component-supply portions of the feeders held by the operating table, keeping the second sectorial table as a waiting table in a waiting area, and changing the operating table with the waiting table, each of the feeders holding a reel around which a tape carrying the circuit components is wound, and the table-rotating-and-changing-mode control means comprising means for changing the operating table with the waiting table, in response to a signal commanding that a new tape be supplied to at least one feeder held by the operating table. In the case where the sorts of the feeders held by the operating table are the same as those of the feeders held by the waiting table, an operator can supply one or more new tapes to the waiting table while the operating table supplies the circuit components. When at least one feeder held by the operating table has completely consumed its tape, the waiting table may replace the operating table and immediately start supplying the components. Thus, the circuit-component mounting efficiency is improved. Even in the case where the plurality of sectorial tables supply circuit components for a plurality of sorts of circuit substrates, respectively, and accordingly the sort or sorts of one or more of the feeders held by the operating table is or are different from the sort or sorts of one or more of the feeders held by the waiting table, the waiting table may replace the operating table in response to the signal commanding that a new tape be supplied to at least one feeder held by the operating table. In the latter case, for example, an operator can supply the new tape or tapes to the "proper" operating table now held in the waiting area, while the waiting table is moved out of the waiting area and operated as a "substitute" operating table for supplying the components to a corresponding sort of circuit substrate. After the operator has supplied the tape or tapes, the proper operating table is returned for resuming its component supplying operation on a new circuit substrate of a corresponding sort, and the substitute operating table is back to the waiting area.

(30) According to a thirtieth feature of the present invention, there is provided a method of supplying circuit components, comprising the steps of rotating at least one rotary table about an axis line which is substantially vertical, the rotary table holding a plurality of feeders such that respective component-supply portions of the feeders are arranged along a circle having a center on the axis line, each of the feeders storing a plurality of circuit components of a same sort and supplying the components one by one from the component-supply portion thereof, at least one of the feeders comprising a reel-holding portion which holds a reel around which a tape carrying the circuit components is wound, and a main portion which is held by the rotary table and which supports a tape-feeding mechanism which feeds the tape from the reel to the component-supply portion thereof, and intermittently stopping the rotary table and thereby sequentially positioning the component-supply portion of each of the feeders at a predetermined component-supplying position where the each feeder supplies at least one circuit component from the component-supply portion thereof, wherein when the rotary table is rotated, the one feeder is revolved about the axis line such that a locus described by a whole of the reel-holding portion of the one feeder is positioned below a locus described by a whole of the main portion of the one feeder. The explanations made in connection with the circuit-component supplying apparatus in accordance with the first feature (1) are also true with the present circuit-component supplying method. In short, according to the present method, a number of feeders can be held by a rotary table, without having to increase the radius of the table. Thus, a rotary table can be employed for supplying circuit components. In addition, the present method assures that circuit components are supplied with high efficiency.

(31) According to a thirty-first feature of the present invention, there is provided a method of supplying circuit components, comprising the steps of rotating at least one rotary table about an axis line which is substantially vertical, the rotary table holding a plurality of feeders such that respective component-supply portions of the feeders are arranged along a circle having a center on the axis line, each of the feeders storing a plurality of circuit components of a same sort and supplying the components one by one from the component-supply portion thereof, at least one of the feeders comprising a main portion which is held by the rotary table and which supports a tape-feeding mechanism which feeds the circuit components one by one to the component-supply portion thereof, and a component-holding portion which holds the circuit components and from which the components are fed to the main portion by the feeding mechanism, wherein a center of gravity of the component-holding portion and the circuit components held thereby is movable relative to the main portion in a direction substantially parallel to a direction in which the main portion is moved by the rotation of the rotary table and, when an acceleration of the rotary table continues to be zero, the center of gravity is returned to a reference phase thereof relative to the main portion, and intermittently stopping the rotary table and thereby sequentially positioning the component-supply portion of each of the feeders at a predetermined component-supplying position where the each feeder supplies at least one circuit component from the component-supply portion thereof, wherein when the rotary table is rotated, the component-holding portion and the circuit components are revolved about the axis line at an acceleration and a deceleration which are lower than an acceleration and a deceleration, respectively, at which the main portion is revolved. When the rotary table is rotated, the rotation of the component-holding portion and the circuit components is delayed, because of their inertia mass, from that of the main portion. Eventually the holding portion and the components start following the main portion, however, at an acceleration and a deceleration which are lower than an acceleration and a deceleration of the main portion, respectively. Accordingly, only a smaller vibration is generated than the vibration which would be generated if the holding portion and the components follow the main portion at the same acceleration and deceleration as those of the main portion. Thus, the present method assures that the circuit-component supplying efficiency is improved by increasing the acceleration and deceleration of the rotary table, while the generation of large vibration is prevented. In the case where it is not needed to improve the component supplying efficiency, the present method can assure that the accuracy of positioning of each feeder and accordingly the reliability of supplying of the components are improved by reducing the vibration generated by the rotary table or tables and the feeders. The present method employs at least one feeder wherein at least the center of gravity of the component-holding portion and the circuit components held thereby is movable relative to the main portion in the direction substantially parallel to the direction of movement of the main portion. However, it is not essentially required that the entirety of the component-holding portion be movable relative to the main portion. For example, the component-holding portion may include an elastically deformable attachment portion which is attached to the main portion and whose elastic deformation allows the center of gravity of the component-holding portion and the circuit components to be moved relative to the main portion. In addition, it is not essentially required that the component-holding portion be positioned below the main portion. For example, the component-holding portion may be positioned beside or above the main portion. Accordingly, the plurality of feeders may comprise one or ones each of which includes a main portion and a reel-holding portion and supplies circuit components in the form of a tape; one or ones each of which arranges, by utilizing vibration, tilt, or air flow, circuit components stored in its casing, into an array, and feeds the components one by one to its component-supply portion; or one or more feeders of another or other sorts. The at least one rotary table may consist of a single circular table, or comprise one or more sectorial tables. The circuit-component supplying method in accordance with the thirtieth or thirty-first feature (30) or (31) may employ one or more of the first to seventeenth features and nineteenth to twenty-fourth features (1) to (17) and (19) to (24) of the rotary-type circuit-component supplying apparatus.

BRIEF DESCRIPTION OF THE DRAWINGS

The above and optional objects, features, and advantages of the present invention will be better understood by reading the following detailed description of the preferred embodiments of the invention when considered in conjunction with the accompanying drawings, in which:

FIG. 13 is a graph showing an ideal relationship between time and the angle of rotation of the circular table and an ideal relationship between time and the angle of rotation of the bucket;

DETAILED DESCRIPTION OF THE PREFERRED EMBODIMENTS

Referring first to FIGS. 1 to 13, there will be described a circuit-component ("CC") mounting system 8 which embodies a CC mounting system of the present invention. The CC mounting system 8 includes a rotary-type CC supplying apparatus 12 which embodies a CC supplying apparatus of the present invention and carries out a CC supplying method of the present invention. The CC supplying apparatus 12 includes a plurality of CC feeders 200 each of which embodies a CC feeder of the present invention.

Figure 1:
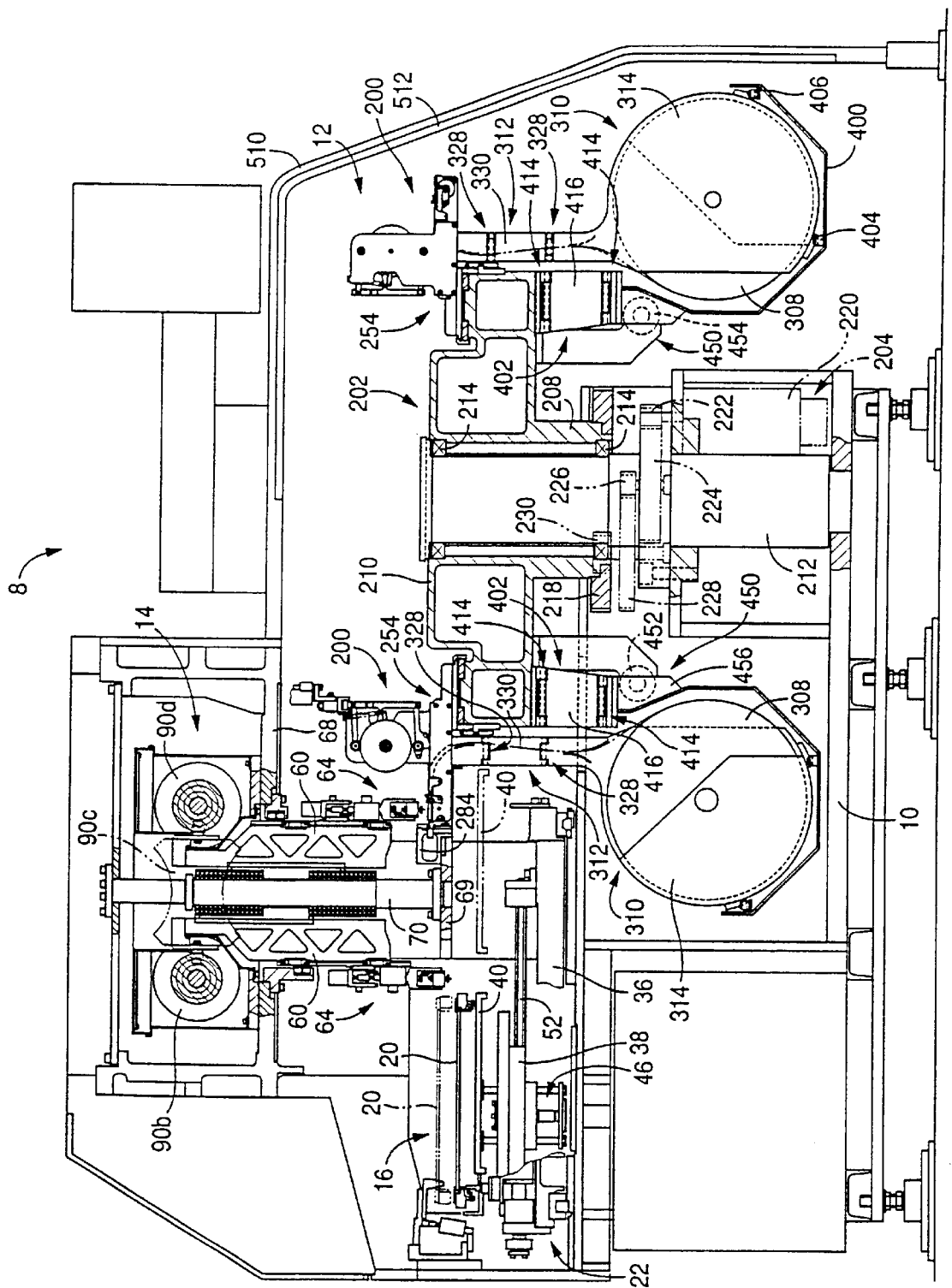
FIG. 1 is a partly cross-sectioned, side elevation view of a circuit-component ("CC") mounting system including a rotary-type CC supplying apparatus to which the present invention is applied.
Figure 2:
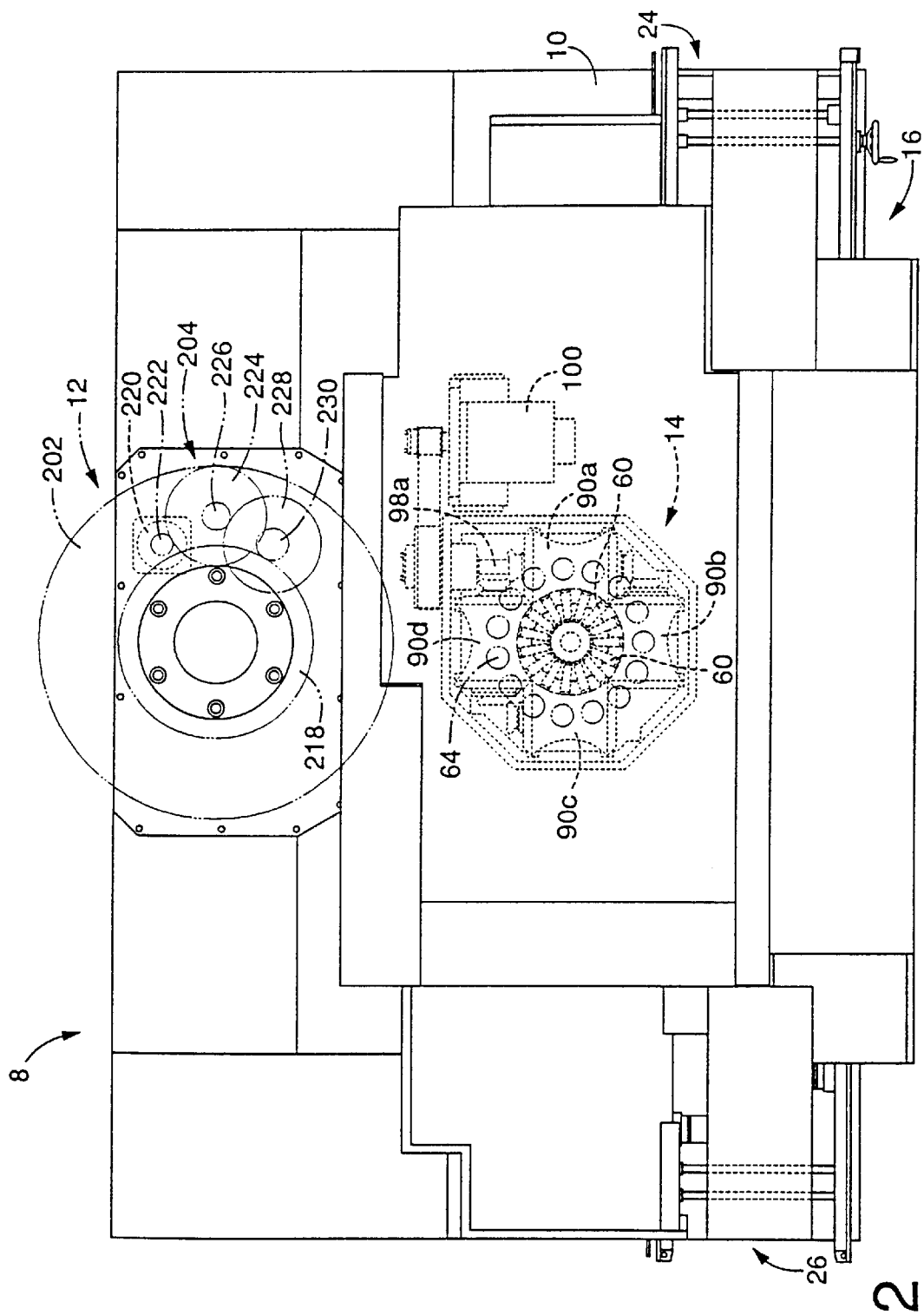
FIG. 2 is a plan view of the CC mounting system of FIG. 1.

As shown in FIGS. 1 and 2, the present CC supplying system 8 includes, in addition to the rotation-type CC supplying apparatus 12 provided on a base member 10, a CC mounting device 14 and a printed-circuit-board ("PCB") carrying device 16 both of which are also provided on the base member 10.

The PCB carrying device 16 includes a PCB positioning and supporting ("position-support") device 22 which positions and supports a PCB 20 as a sort of circuit substrate; a PCB carry-in device 24 which carries in the PCB 20 and transfers it to the PCB position-support device 22; and a PCB carry-out device 26 which carries out the PCB 20 from the device 22. The PCB carrying device 16 is substantially entirety provided below the CC mounting device 14.

Each of the PCB carry-in and carry-out devices 24, 26 includes a pair of endless conveyor belts (not shown) each as a PCB carrying member, and a drive device which includes a belt-driving motor 28 (FIG. 12) as its drive source and which drives the conveyor belts for carrying the PCB 20 placed thereon. The PCB 20 is carried in a direction from the right-hand carry-in device 24 to the left-hand carry-out device 26 in FIG. 2. Hereinafter, this direction may be referred to as the "PCB-carrying direction", or the "X-axis direction", if appropriate.

The PCB position-support device 22 includes an X table 36 which is provided on the base member 10 such that the X table 36 is movable to and fro in the X-axis direction; a Y table 38 which is provided on the X table 36 such that the Y table 38 is movable to and fro in a Y-axis direction perpendicular to the X-axis direction in a horizontal plane; and a PCB support table 40 which is provided on the Y table 38 such that the PCB support table 40 is movable up and down.

On the PCB support table 40, there are provided a PCB carry-in and carry-out device and a PCB holding device (all not shown) of the PCB position-support device 22. The PCB carry-in and carry-out device includes a pair of endless conveyor belts each as a PCB carrying member, and a drive device which includes a belt-driving motor 44 (FIG. 12) as its drive source and which drives the conveyor belts for carrying the PCB 20 in the X-axis direction.

The PCB position-support device 22 additionally includes an elevating and lowering device 46 which elevates and lowers the PCB support table 40 between its uppermost position indicated in two-dot chain line in FIG. 1 and its lowermost position indicated in solid line in the figure. In the state in which the table 40 is positioned at its uppermost position, a PCB-carrying plane defined by respective upper surfaces of the respective upper half portions of the two endless belts of the PCB carry-in and carry-out device provided on the table 40 is flush with a PCB-carrying plane defined by respective upper surfaces of the respective upper half portions of the two endless belts of each of the PCB carry-in and carry-out devices 24, 26. In the state in which the table 40 is positioned at its lowermost position, the PCB 20 placed on the PCB-carrying plane is positioned below the CC mounting device 14.

The PCB 20 is transferred from the PCB carry-in device 24 to the PCB position-support device 22, or from the device 22 to the PCB carry-out device 26, in the state in which the PCB support table 40 is positioned at its uppermost position. The PCB 20 carried in onto the table 40 is held by the PCB holding device. When circuit components (CCs) are mounted on the PCB 20 by the CC mounting device 14, the table 40 is lowered to its lowermost position.

Two nuts (not shown) are fixed to the X and Y tables 36, 38, respectively, and are engaged with two feeding screws 52, respectively. However, FIG. 1 shows only one feeding screw 52 for moving the Y table 38 in the Y-axis direction. The two feeding screws 52 are rotated by two table-driving servomotors 54, 56 (FIG. 12), respectively. Thus, the X and Y tables 36, 38 are moved in the X-axis and Y-axis directions, respectively, while being guided by respective linear guide members (not shown). Accordingly, the PCB support table 40 can be moved to any position in the horizontal plane. A portion of the X table 36 extends below the CC mounting device 14 and, as shown in FIG. 1, the table 40 can be moved to an area below the CC mounting device 14. That is, a portion of the range within which the table 40 is movable overlaps the CC mounting device 14 in a horizontal direction. Hereinafter, the position where the table 40 is present between the PCB carry-in and carry-out devices 24, 26 in the X-axis direction and is aligned with the two devices 24, 26 in the Y-axis direction will be referred to as the original position (i.e., origin) of the table 40 in the horizontal plane.

Next, the CC mounting device 14 will be described.

The CC mounting device 14 is similar to a CC mounting device disclosed in U.S. patent application Ser. No. 08/907, 882 assigned to the Assignee of the present U.S. application. Hence, the device 14 is described briefly.

The CC mounting device 14 includes fifteen rotary plates 60 which are rotatable about a vertical common axis line, independent of ore another; fifteen CC-holding heads 64 which are supported by the fifteen rotary plates 60, respectively, and each of which can hold a CC 150 (FIG. 5); and a rotary-motion applying device 66 which applies, to each of the rotary plates 60, a rotary motion which causes each rotary plate 60 to rotate fully about the common axis line while stopping three times during each full rotation and keeping a predetermined time difference from each of its adjacent two rotary plates 60, i.e., its preceding and following rotary plates 60.

Figure 3:
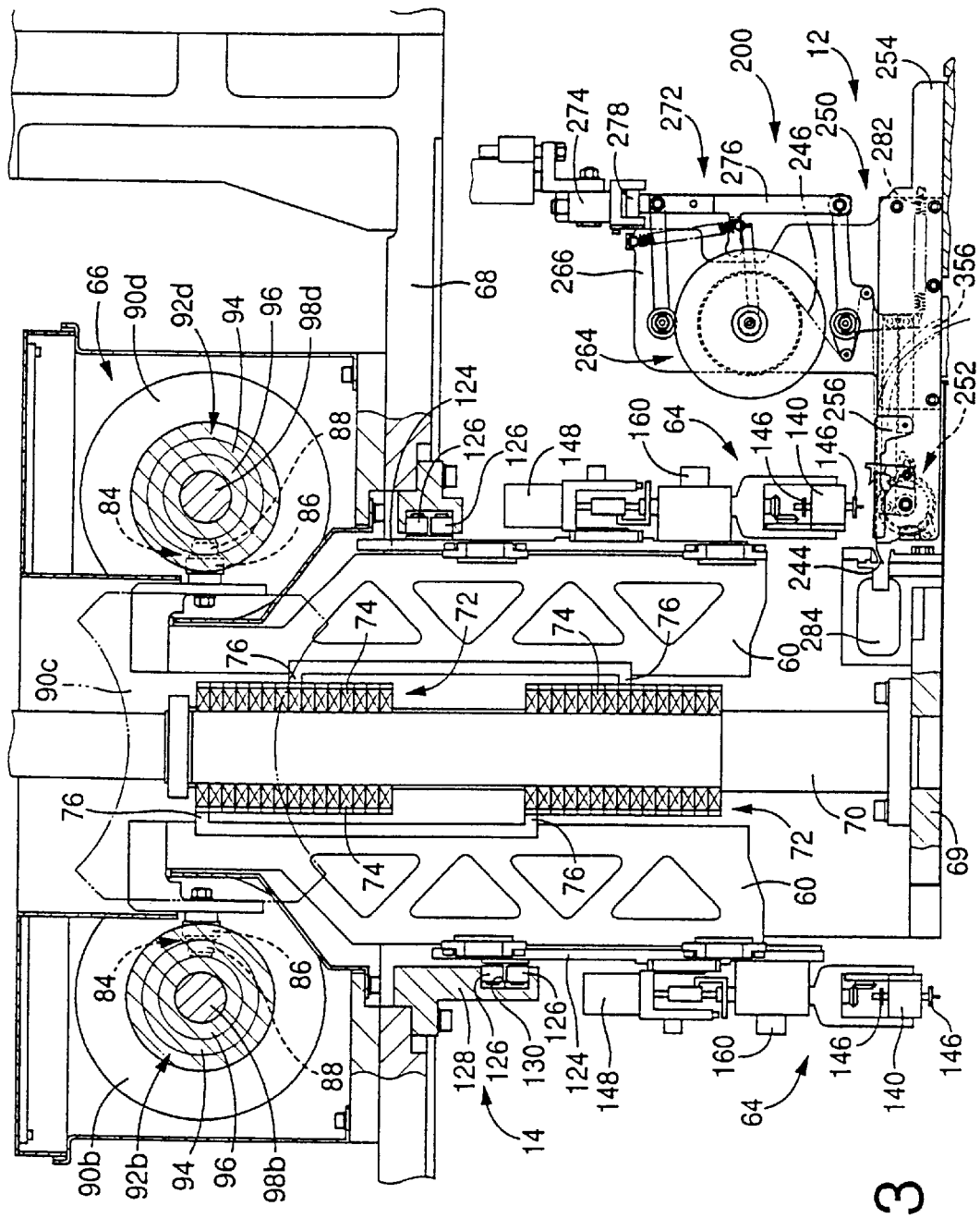
FIG. 3 is a partly cross-sectioned, side elevation view of a CC mounting device of the CC mounting system of FIG. 1, and a portion of the CC supplying apparatus of the same.

The CC mounting device 14 includes, as its main members, a frame member 68 which is provided above the base member 10, and a support plate 69 which is provided below the frame member 68 and is fixed to the base member 10. As shown in FIG. 3, a vertical support shaft 70 is fixed to the frame member 68 and the support plate 69. Two groups of bearings 72 are attached to two portions of the support shaft 70, respectively, which are distant from each other in an axial direction of the shaft 70. Each group of bearings 72 consists of fifteen bearings 74 which have different axial positions, respectively. As shown in FIG. 3, the fifteen rotary plates 60 are associated with respective pairs of support arms 76 fixed thereto. Each pair of support arms 76 are fixed to, and supported by, the corresponding pair of bearings 74 which belong to the two bearing groups 72, respectively, so that each rotary plate 60 is rotatable about the support shaft 70 whose center axis line coincides with the common axis line of the rotary plates 60. All the pairs of bearings 74 corresponding to the respective pairs of support arms 76 of the fifteen rotary plates 60 have the same distance therebetween in the axial direction of the support shaft 70. However, the fifteen pairs of support arms 76 have different axial positions at which the arms 76 are fixed to the respective rotary plates 60. Accordingly, the fifteen pairs of support arms 76 do not interfere with one another, even though the rotary plates 60 are supported by the support shaft 70 such that the rotary plates 60 are rotatable at the same position with respect to the axial direction of the support shaft 70.

The fifteen rotary plates 60 have respective cam followers 84 at the same position with respect to the axial direction of the support shaft 70. Accordingly, the fifteen cam followers 84 are moved on a circle whose center rides on the common axis line of the rotary plates 60. Each cam follower 84 includes a large-diameter roller 86 and a small-diameter roller 88 which are attached to the corresponding rotary plate 60 such that the two rollers 86, 88 are rotatable, independent of each other, about a common axis line perpendicular to the common axis line of the rotary plates 60. The two rollers 86, 88 of each cam follower 84 are held in rolling engagement with respective cam grooves formed in four concave globoidal cams 90a, 90b, 90c, 90d (FIG. 2) which are rotatably attached to the frame member 68. The drawings show the respective cam grooves 92b, 92d of the globoidal cams 90b, 90d but do not show the respective cam grooves of the globoidal cams 90a, 90c. FIG. 2 shows the fifteen rotary plates 60 as positioned relative to one another such that the rotary plates 60 are evenly or equi-angularly spaced apart from each other about the support shaft 70, for only the interest of simplification. In fact, the angular or phase difference of one pair of adjacent rotary plates 60 may differ from that of another pair of adjacent rotary plates 60 for the reasons which will be described later by reference to FIG. 4.

Each of the four concave globoidal cams 90a–90d has an outer circumferential surface defined by a locus which is described by a circular arc whose center rides on the center axis line of the support shaft 70 when the circular arc is rotated about an axis line which is located such that the circular arc is interposed between this axis line and the center axis line of the support shaft 70 and which is perpendicular to the axis line of the shaft 70. The axis line about which the circular arc is rotated to describe the above-indicated locus is an axis line of a rotary shaft 98a, 98b, 98d of each globoidal cam 90a–90d (the rotary shaft of the cam 90c is not shown). The four concave globoidal cams 90a–90d are disposed symmetrically with respect to the center axis line of the support shaft 70, such that respective inner lines of intersection of the outer circumferential surfaces of the cams 90a–90d with a plane including the axis lines of the cams 90a–90d and perpendicular to the center axis line of the support shaft 70 cooperate with one another to define a substantially continuous circle whose center rides on the axis line of the center support shaft 70. The four cam grooves 92 formed in the outer circumferential surfaces of the four cams 90a–90d are substantially connected to each other.

Each of the respective cam grooves 92 (92b, 92d) of the four globoidal cams 90a–90d is a stepped cam groove including a wide groove 94, and a narrow groove 96 which opens in the bottom of the wide groove 94. The large-diameter and small-diameter rollers 86, 88 of the cam follower 84 of each rotary plate 60 are held in rolling engagement with the wide and narrow grooves 94, 96 of the cam groove 92 of each of the cams 90a–90d, respectively.

FIG. 2 shows that each of the respective rotary shafts 98a, 98d of the globoidal cams 90a, 90d has two bevel gears fixed thereto and each of the respective rotary shafts 98b of the globoidal cams 90b, 90c (the rotary shaft of the cam 90c is not shown) has a single bevel gear fixed to one end thereof. Each pair of adjacent bevel gears (three pairs in total) are held in meshing engagement with each other. When the rotary shaft 98a of the globoidal cam 90a is rotated by a main servomotor 100 (FIG. 2), the four globoidal cams 90a–90d are contemporaneously rotated in synchronism with each other, so that the fifteen rotary plates 60 are rotated about the support shaft 70, and are sequentially stopped, as described below.

Each rotary plate 60 is stopped at a CC sucking position, a CC-image taking position, and a CC mounting position. The CC sucking position which is prescribed adjacent to the rotary-type CC supplying apparatus 12, and the globoidal cam 90d is provided, on the frame member 68, at a position corresponding to the CC sucking position. The CC mounting position is prescribed adjacent to the PCB carrying device 16, and the globoidal cam 90b is provided, on the frame member 68, at a position corresponding to the CC mounting position. The CC-image taking position is prescribed midway on a route from the CC sucking position to the CC mounting position, and the globoidal cam 90a is provided, on the frame member 68, at a position corresponding to the CC-image taking position. A CC-image taking device 102 (FIG. 12) including a lighting device and a CCD (charge-coupled device) camera is provided, on the base member 10, at a position corresponding to the CC-image taking position.

The cam groove 92 of each of the globoidal cams 90a, 90b, 90d includes an inclined portion having a lead angle with respect to a plane perpendicular to the axis line of the rotary shaft 98 of the each cam 90a, 90b, 90d, and additionally includes a non-lead portion perpendicular to that axis line so that each of the rotary plates 60 (or each of the cam followers 84) is held stopped at the CC-image taking position, the CC mounting position, and the CC sucking position. The inclined portion of the groove 92 of each cam 90a, 90b, 90d includes straight and curved sections which are so shaped as to first rotate each rotary plate 60 at a predetermined constant angular velocity, then accelerate the same 60 for moving it over more distance or angle, decelerate it, stop it at one of the three stop positions, resume the rotation of each plate 60, accelerate it for moving it over more angle, decelerate it, and then move it at the constant velocity. The cam groove of the globoidal cam 90c has only a straight inclined portion having a lead angle with respect to a plane perpendicular to the axis line of the rotary shaft of the cam 90c. This lead angle is predetermined to permit each rotary plate 60 to be rotated at the above-indicated constant angular velocity.

The respective cam grooves 92 of the globoidal cams 90a, 90b, 90d are formed so that three of the fifteen rotary plates 60 are stopped at the three stop positions, respectively, at different timings which differ from one another by about one third of a time pitch at which the fifteen rotary plates 60 (or the fifteen CC-holding heads 64) reach one after another at each of the three stop positions. The respective inclined portions (both the straight and curved sections) of the respective cam grooves 92 of the globoidal cams 90a, 90b, 90d have the same degree of inclination, so that each rotary plate 60 is rotated at the same constant angular velocity, and accelerated and decelerated at the same values by the three cams 90a, 90b, 90d. However, the respective lengths of the two straight sections (which respectively precede and follow the curved section) of the inclined portion of each one of the cam grooves 92 of the three cams 90a, 90b, 90d differ from those of each of the other two cam grooves 92. Therefore, the time needed for each rotary plate 60 to move from the CC sucking position to the CC-image taking position differs from that for the same 60 to move from the CC-image taking position to the CC mounting position. The degree of inclination of the straight inclined portion of the cam groove 92 of the globoidal cam 92c is equal to that of the straight sections of the inclined portion of the cam groove 92 of each of the other three cams 90a, 90b, 90d, so that each rotary plate 60 is rotated by the cam 90c at the same constant angular velocity as that at which the same 60 is rotated by the cams 90a, 90b, 90d.

Figure 4:
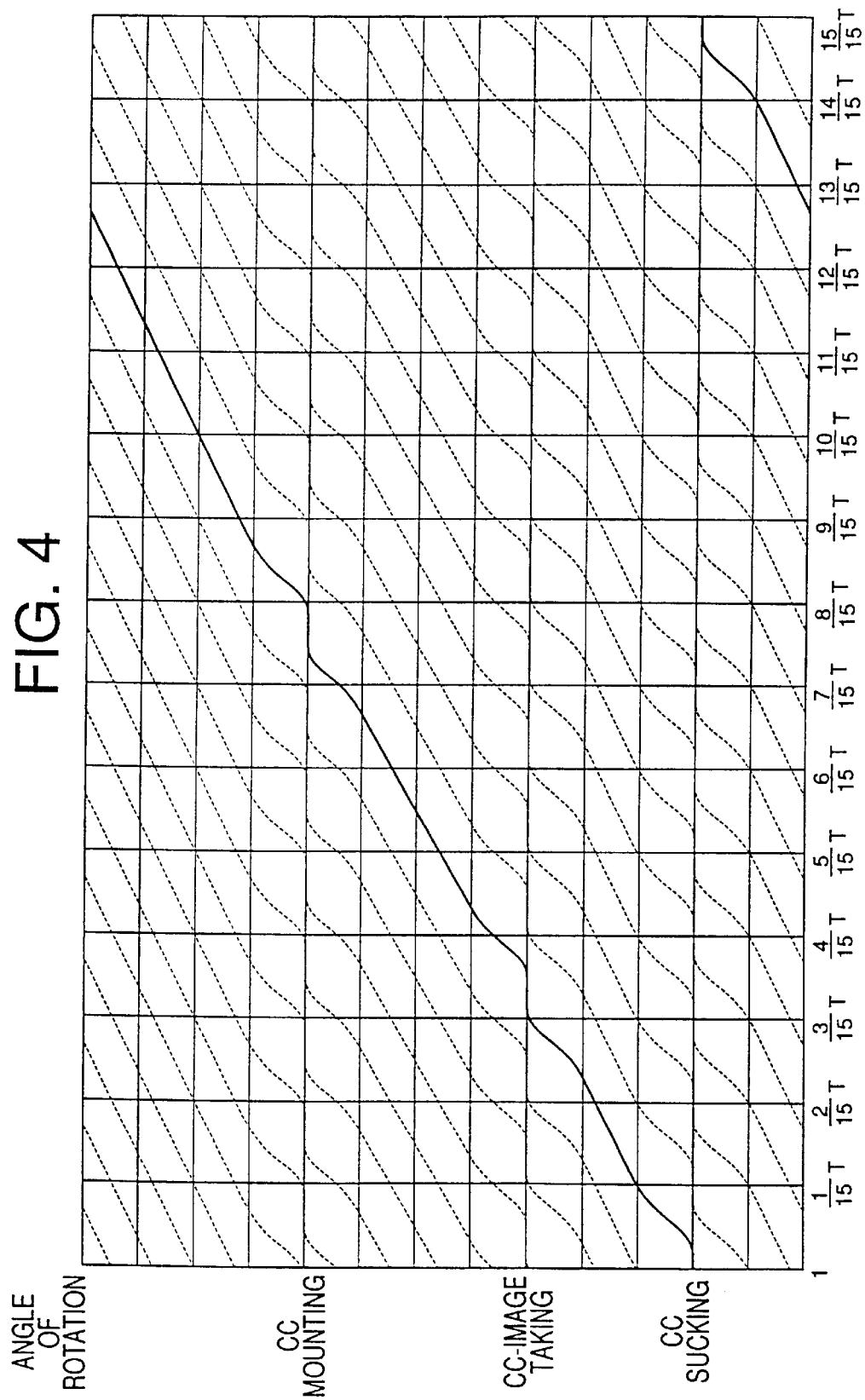
FIG. 4 is a time chart representing a relationship between time, T, and the angle of rotation of each of fifteen rotary plates of the CC mounting device of FIG. 3.

FIG. 4 shows a timing chart which represents a relationship between time and the angle of rotation of each of the fifteen rotary plates 60. In FIG. 4, the symbol "T" indicates the time needed for each rotary plate 60 to be rotated through 360 degrees, and this time is taken along the axis of abscissa, with a graduation unit being equal to T/15 in view of the fifteen rotary plates 60 in total. On the other hand, the angle of rotation of each rotary plate 60 is taken along the axis of ordinate, with a graduation unit being equal to 360/13 in view of designed thirteen stations including three stations corresponding to the three stop positions. In the present embodiment, each rotary plate 60 stops at the three stations but passes through the other ten stations. The time-angle relationship of each rotary plate 60 is expressed by a line including a straight portion, an upwardly curved or convex portion, and a downwardly curved or concave portion. The straight portion indicates the constant-velocity movement of the rotary plate 60; the convex portion indicates the deceleration of the rotary plate 60; and the concave portion indicates the acceleration of the rotary plate 60.

The timing chart of FIG. 4 shows that arbitrary three of the fifteen rotary plates 60 are stopped at the CC sucking position, the CC-image taking position, and the CC mounting position, respectively, at respective different timings which differ from one another by about one third of the time pitch at which the fifteen rotary plates 60 arrive one after another at each of the three stop positions. Therefore, arbitrary three of the fifteen rotary plates 60 are accelerated or decelerated at respective different timings before, and after, being stopped at the three stop positions, respectively. Accordingly, the total load or torque applied to the main servomotor 100 is reduced, and the four globoidal cams 90a–90d can be driven by the motor 100 which has a small capacity or low performance.

The respective cam grooves 92 of each pair of adjacent globoidal cams 90 (90a, 90b, 90c, 90d) are connected to each other at respective predetermined angular phases of the two cams 90, so that the cam follower 84 of each rotary plate 60 call be moved from one of the two cams 90 to the other cam 90. Thus, each plate 60 can be rotated through 360 degrees. Each cam follower 84 includes the large-diameter and small-diameter rollers 86, 88, and the large roller 86 slightly earlier reaches the interface of the two cam grooves 92 than the small roller 88. In the state in which the large roller 86 has just reached the interface, the large roller 86 is not sandwiched between the opposed side walls of either of the respective wide grooves 94 of the two cam grooves 92. However, the small roller 88 remains sandwiched between the opposed side walls of the narrow groove 96 of the cam groove 92 of the one cam 90. Accordingly, the large roller 86 can smoothly transfer from the one cam 90 to the other cam 90. When the small roller 88 reaches the interface of the two cam grooves 92, the large roller 86 has already been sandwiched between the opposed side walls of the wide groove 94 of the cam groove 92 of the other cam 90. Thus, the smaller roller 88 can smoothly transfer from the one cam 90 to the other cam 90.

As shown in FIG. 3, each CC-holding head 64 is supported by an elevator member 124 as a movable member which is attached to the corresponding rotary plate 60 such that the elevator member 124 is movable up and down. Two cam-follower rollers 126 are attached to each elevator member 124 such that each of the two rollers 126 is rotatable about an axis line perpendicular to the common axis line of the rotary plates 60. The two cam-follower rollers 126 of each elevator member 124 are held in rolling engagement with a cam groove 130 formed in an inner circumferential surface of a stationary cam 128 fixed to the frame member 68. The inner circumferential surface of the stationary cam 128 has its center line coinciding with the center axis line of the support shaft 70. The cam groove 130 includes a height-position varying portion whose height position (in the axial direction of the shaft 70) continuously varies in the circumferential direction of the cam 128, and a level portion whose height position does not vary. The cam groove 130 is formed so that each CC-holding head 64 takes its uppermost position when the corresponding rotary plate 60 is positioned at the CC sucking position and takes its lowermost position when the rotary plate 60 is positioned at the CC mounting position and so that each head 64 is moved in a horizontal plane while the rotary plate 60 is rotated around each of the CC sucking, CC-image taking, and CC mounting positions. Accordingly, when the cam-follower rollers 126 of each rotary plate 60 is moved in rolling engagement with each height-position varying portion of the cam groove 130, the elevator member 124 is moved up and down and accordingly the CC-holding head 64 is moved up and down. The maximum distance between the outer circumferential surface of one of the two rollers 126 and that of the other roller 126 as measured in the axial direction of the support shaft 70 is slightly greater than the width of the cam groove 130 (i.e., dimension as measured in the axial direction of the shaft 70). Thus, the two rollers 126 are held in pressed contact with the upper and lower walls of the cam groove 130, respectively, so that the rollers 126 can smoothly move in the groove 130 without producing vibration.

Each CC-holding head 64 includes a nozzle holder 140 which is supported by the elevator member 124 such that the nozzle holder 140 is rotatable about a vertical axis line and a horizontal axis line; and six CC-suction nozzles 146 (only two nozzles 146 are shown in FIG. 3) which are held by the nozzle holder 140 such that the six nozzles 146 are equiangularly spaced from one another about the horizontal axis line of the holder 140. When the nozzle holder 140 is rotated about its horizontal axis line by a nozzle selecting device including, as its drive source, a nozzle selecting/rotating servomotor 148 mounted on the elevator member 124, an appropriate one of the six nozzles 146 is selected and positioned at an operative position where the selected nozzle 146 is oriented vertically downward. In addition, when the nozzle holder 140 is rotated about its vertical axis by a nozzle rotating device including, as its drive source, the nozzle selecting/rotating servomotor 148, the nozzle 146 positioned at the operative position is rotated about its own axis line by an appropriate angle to correct an angular-position error of the CC 150 (FIG. 5) held by the nozzle 146.

The angular-position error of the CC 150 means the difference of a current angular position of the CC 150 held by the selected nozzle 146 as measured from a reference angular position of the same 150 as measured in a circumferential direction of the nozzle 146.

The correction of the angular-position error of the CC 150 is performed during a time duration when each rotary plate 60 is moved from the CC-image taking position to the CC mounting position. The changed angular position of the selected nozzle 146 is returned to its original position before the correction of the angular-position error of the CC 150, during a time duration when the rotary plate 60 is moved from the CC mounting position to the CC sucking position after the CC 150 is mounted on the PCB 20. Simultaneously, the current nozzle 146 is changed to another nozzle 146, as needed.

At two locations on the frame member 68 which correspond to the CC sucking and mounting positions, respectively, there are disposed two head elevating and lowering devices (not shown) including respective vertically movable members. The stationary cam 128 has two receiving grooves formed at two positions corresponding to the CC sucking and mounting positions, respectively. The two vertically movable members are fit or received in the two receiving grooves, respectively, such that each of the movable members is movable vertically up and down. Each vertically movable member has a horizontal groove which defines part of the cam groove 130 of the stationary cam 128 in a state in which the movable member is positioned at its uppermost position and is received in the corresponding receiving groove of the cam 128.

Each head elevating and lowering device additionally includes a driving device which elevates and lowers the corresponding vertically movable member. Each driving device has a motion converting mechanism including a cam and a cam follower, and utilizes the main servomotor 100 as its drive source in such a manner that the motion converting device converts the rotation of the servomotor 100 into the upward and downward movement of the corresponding movable member. Each head elevating and lowering device additionally includes a stroke-changing device which can change the stroke of upward and downward movement of the corresponding movable member, i.e., the corresponding CC-holding head 64, based on, e.g., the height of the CC 150 to be mounted.

When each rotary plate 60 is rotated to arrive at the CC sucking position, the cam-follower rollers 126 of the CC-holding head 64 of the rotary plate 60 are moved into the horizontal groove of the vertical movable member of the head elevating and lowering device disposed at the position corresponding to the CC sucking position. Subsequently, the movable member is moved vertically downward and then upward, so that the elevator member 124 of the head 64 is moved down and up. Thus, the head 64 picks up the CC 150 from the rotary-type CC supplying apparatus 12. Similarly, when each rotary plate 60 is rotated to arrive at the CC mounting position, the cam-follower rollers 126 of the CC-holding head 64 are moved into the horizontal groove of the vertical movable member of the other head elevating and lowering device disposed at the position corresponding to the CC mounting position. Subsequently, the movable member is moved vertically downward and then upward, so that the elevator member 124 of the head 64 is moved down and up. Thus, the head 64 mounts the CC 150 on the PCB 20 supported by the CC carrying device 16. A switching device 160 which is provided on each CC-holding head 64 is mechanically switchable to supply a negative pressure to, and cut the same from, the selected nozzle 146. Two switching-device operating devices (not shown) are provided at two locations of the main member of the CC mounting device 14 which correspond to the CC sucking and mounting positions, respectively. Each switching-device operating device mechanically operates or switches the corresponding switching device 160 when the corresponding CC-holding head 64 is moved down and up. Each switching device 160 is supplied with the negative pressure from a vacuum source (not shown) via a hose, a rotary valve, etc. (all not shown). The nozzle selecting/rotating servomotor 148 is supplied with electric power from a power source (not shown) via a non-contact-type electric-power supplying device (not shown).

Next, the rotary-type CC supplying apparatus 12 will be described. As shown in FIG. 1, the CC supplying apparatus 12 includes a plurality of CC feeders 200, a full-circular table 202 as a rotary table which holds the CC feeders 200, and a table driving device 204 which rotates the circular table 202. The circular table 202 includes a cylindrical portion 208, and an annular portion 210 which extend radially outward from an upper half portion of the cylindrical portion 208. The cylindrical portion 208 is attached via bearings 214 to an upper portion of a vertical support shaft 212 fixed to the base member 10, so that the circular table 202 is rotatable about a vertical axis. Thus, the annular portion 210 extends radially outward from an upper end portion of the support shaft 212.

A driven gear 218 is fixed to a lower end portion of the cylindrical portion 208, such that the driven gear 218 is opposite to the annular portion 210. The circular table 202 receives the rotation which is produced by a table-rotating servomotor 220 and whose speed is reduced by gears 222, 224, 226, 228, 230 and the driven gear 218. A control device 520 (FIG. 12) controls the servomotor 220 to rotate the circular table 202 to a desirable angular position at a desirable angular velocity, so that a CC-supply portion of a desirable one of the CC feeders 200 held by the table 202 is positioned at a predetermined CC supplying position right below the CC sucking position at which each CC-holding head 64 is stopped. The driven gear 218, the servomotor 220, the gears 222–230, and the control device 520 cooperate with one another to provide the table-driving device 204.

Next, the CC feeders 200 will be described.

Figure 5:
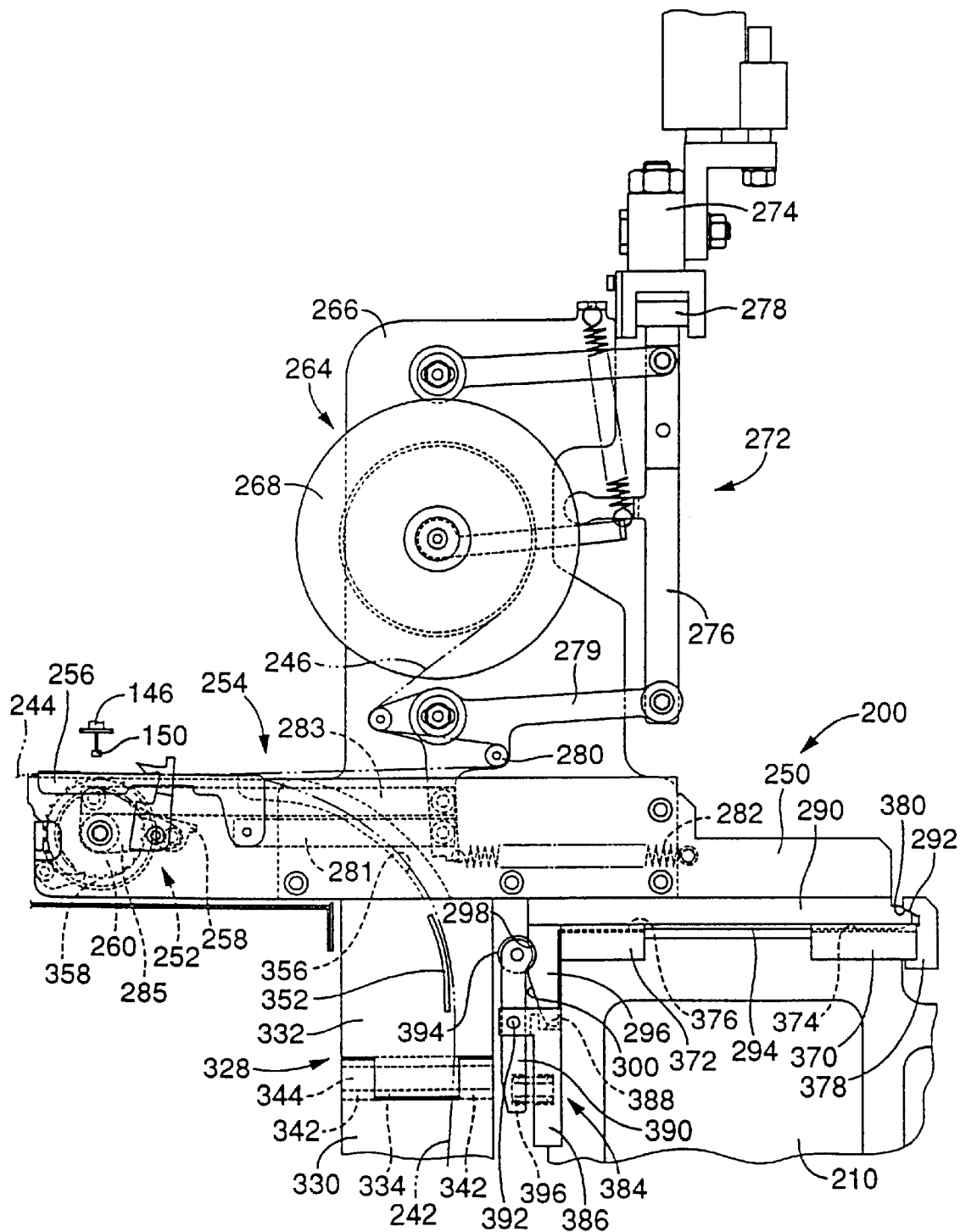
FIG. 5 is a front elevation view of a main portion of a CC feeder of the CC supplying apparatus of FIG. 1.

Each of the CC feeders 200 stores a plurality of CCs 150 of a same sort and supplies the CCs 150 one by one from the CC-supply portion thereof. As shown in FIG. 5, each CC feeder 200 feeds a CC carrier tape 242 which consists of an embossed-type CC-accommodating tape 244 having a number of CC-accommodating pockets embossed at a regular interval of distance in a lengthwise direction thereof; a number of CCs 150 which are accommodated in the CC-accommodating pockets, respectively; and a cover tape 246 which covers respective upper openings of the CC-accommodating pockets.

Each CC feeder 200 includes a main portion 254 which consists of a main member 250 having a generally elongate, plate-like configuration, and a tape feeding mechanism 252 which is supported by the main member 250 and which feeds the CC carrier tape 242 such that the CCs 150 carried on the tape 242 are fed one by one to the CC-supply portion of the main member 250. The tape feeding mechanism 252 simultaneously feeds the carrier tape 242 and moves a cover member 256 frontward. However, when the feeding mechanism 252 moves the cover member 256 rearward, the feeding mechanism 252 does not move the tape 242 and prepares for the next feeding of the tape 242. More specifically described, the feeding mechanism 252 causes a ratchet pawl 258 (FIG. 5) to move over the teeth of a ratchet wheel 260. A cover-tape take-up device 264 which takes up the cover tape 246 is attached to the main member 250 via a bracket 266. The take-up device 264 includes a take-up reel 268 which does not rotate and accordingly does not take up the cover tape 244, when the CC carrier tape 242 is fed, and which rotates and accordingly takes up the cover tape 244, when the tape feeding mechanism 252 prepares for the next tape-feeding action.

The tape feeding mechanism 252 and the cover-tape take-up device 264 of each CC feeder 200 are driven by a driving device 272 which utilizes the main servomotor 100 as its drive source. The driving device 272 includes a driving member 274 which is provided at the CC supplying position of the CC supplying apparatus 12 such that the driving member 274 is movable up and down; and a motion converting device (not shown) which includes a cam, a cam follower, etc. and which converts the rotation of the main servomotor 100 into the upward and downward movement of the driving member 274, which causes a driving lever 276 to move up and down. Thus, the feeding mechanism and the take-up device 252, 264 are operated.

When the driving member 274 is moved down and is engaged with an engaging roller 278 (FIG. 5), the driving lever 276 is moved down, which causes a driving lever 279 to be pivoted. Consequently a cover-driving bar 281 is moved frontward to move the cover member 256 frontward, and a tape-feeding bar 283 is moved frontward to pivot a pivotable plate 285. Thus, the ratchet pawl 258 which is pivotally attached to the plate 285 is moved keeping its engagement with the teeth of the ratchet wheel 260, so that the ratchet wheel 260, and a sprocket 358 which is attached to the wheel 260 such that the sprocket 358 is not rotatable relative to the wheel 260, are rotated. Since the CC carrier tape 242 includes the CC-accommodating tape 244 which has a number of perforations which are engaged with the teeth of the sprocket 358, the carrier tape 242 is moved frontward by one pitch equal to the regular interval of the CC-accommodating pockets of the CC-accommodating tape 244. Consequently the leading one of the CCs 150 from which the cover tape 246 has been removed is fed to a CC-pick-up position which is prescribed in the CC-supply portion corresponding to one end portion of the main member 250 in a lengthwise direction thereof. When the leading CC 150 is fed to the CC-pick-up position, the take-up reel 268 of the take-up device 264 is not rotated but a movable guiding roller 280 is moved downward and frontward by the pivotal movement of the driving lever 279, so that the distance between the guiding roller 280 and the take-up reel 268 is increased and accordingly a certain length of the cover tape 246 which has been taken up is delivered or fed out. Thus, the carrier tape 242 is allowed to move frontward by one pitch, together with the cover member 256.

On the other hand, when the driving member 274 is moved up, the driving lever 279 is pivoted by a biasing force of a tension coil spring 282, so that the cover-driving bar 281 and the tape-feeding bar 283 are moved rearward and the driving lever 276 is moved up to follow the driving member 274. Consequently the cover member 256 is moved rearward, the tape feeding mechanism 252 prepares for the next tape-feeding action, and the take-up reel 268 of the take-up device 264 is rotated to peel and take-up a one-pitch length of the cover tape 246 from the CC-accommodating tape 244. In addition, the movable guiding roller 280 attached to the driving lever 279 is moved upward and rearward, so that the distance between the guiding roller 280 and the take-up reel 268 is decreased and accordingly a certain length of the cover tape 246 is taken up by the reel 268.

A tape-feeding direction in which the CC carrier tape 242 is fed is parallel to the lengthwise direction of the main member 250 of each CC feeder 200, i.e., a front-rear direction of each feeder 200. A direction of thickness of each feeder 200 will be referred to as the left-right or widthwise direction thereof. Since the feeding of the CC carrier tape 242 and the taking up of the cover tape 246 are not relevant to the present invention, more detailed description thereof is omitted.

As shown in FIG. 3, a CC-accommodating-tape treating device 284 is provided, on the support plate 69, at a position corresponding to the CC-sucking position. The treating device 284 includes a cutter which cuts, into small pieces, the CC-accommodated tape 244 from which the CCs 150 have been picked up, and a vacuum device which applies a negative pressure to the cut small pieces and collects them. Each time one CC 150 is supplied and the carrier tape 242 is fed one pitch, the treating device 244 cuts off a one-pitch length of the tape 244.

Figure 6:
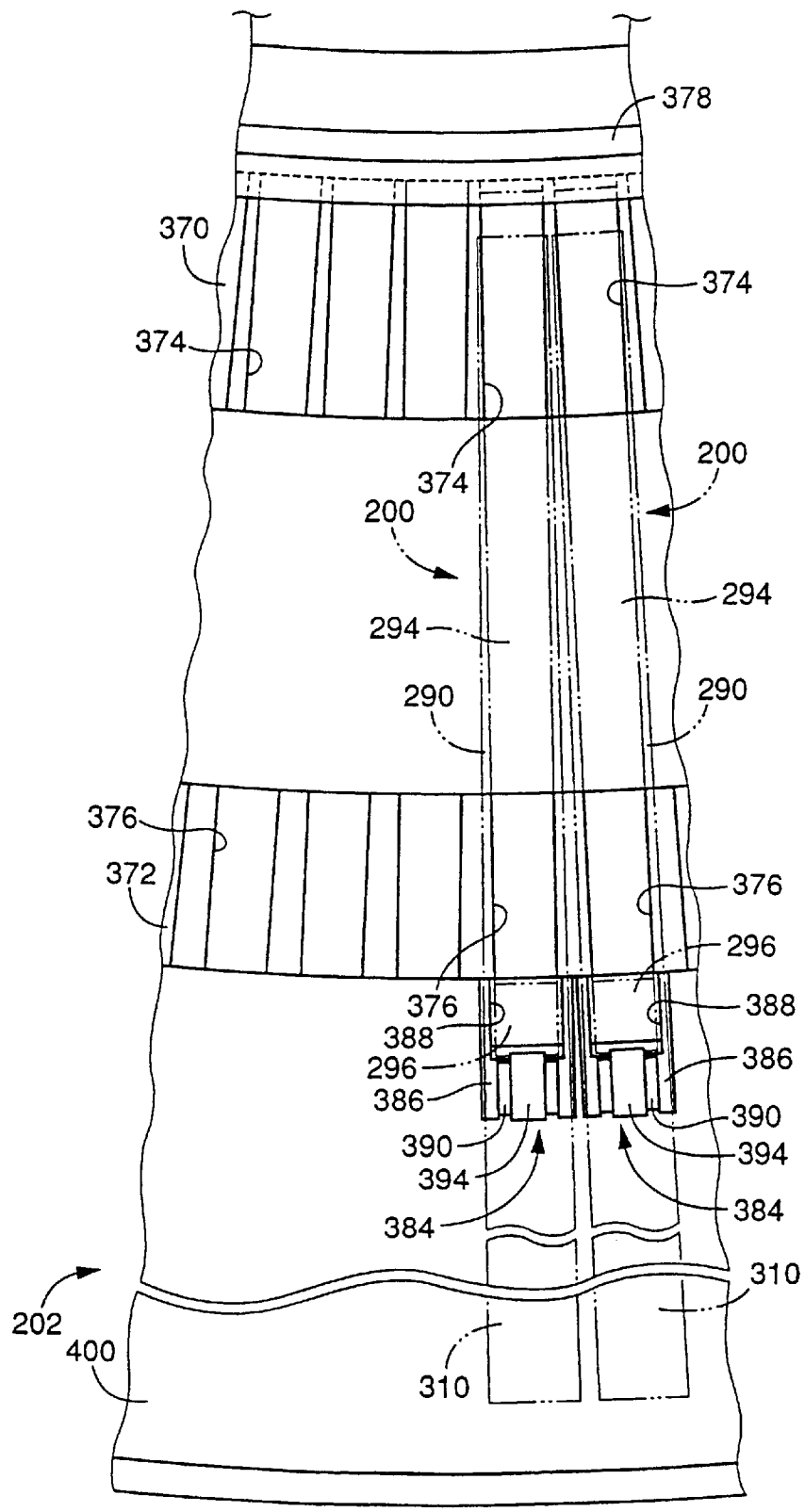
FIG. 6 is a plan view of a portion of a circular table of the CC supplying apparatus of FIG. 1, with the CC feeders being held by the table.

As shown in FIG. 5, the main member 250 of each CC feeder 200 has a positioning projection 290 which projects downward from a lower surface of an upstream-side portion of the main member 250 in the tape-feeding direction and which extends parallel to the tape-feeding direction. As shown in FIG. 6, the positioning projection 290 has a tapered shape whose width decreases in an upstream direction opposite to the tape-feeding direction. Thus, in the state in which the CC feeders 200 are held by the circular table 202, the projection 290 of each one of the feeders 200 is prevented from being interfered with by that of its adjacent feeders 200. The projection 290 has an engaging surface 292 which is formed in an upper surface of an upstream-end portion thereof in the tape-feeding direction and which is inclined in an upstream and downward direction. A positioning rib 294 projects downward from a lower surface of the projection 290. The rib 294 has a constant width smaller than the smallest width of the projection 290. The main member 250 has a constant width smaller than the smallest width of the projection 290. Thus, the main member 250 of each CC feeder 200 is prevented from being interfered with by that of its adjacent feeders 200.

As shown in FIG. 5, a second positioning projection 296 projects downward from a downstream-end portion of the first positioning projection 290 in the tape-feeding direction. Thus, the second projection 296 extends in a direction opposite to the main member 250 and perpendicular to the first projection 290. The second projection 296 has, in an intermediate portion thereof, a part-cylindrical engaging surface 298 which opens in a downstream-side surface thereof and whose center line is parallel to the widthwise direction of the CC feeder 200. The second projection 296 has, in a free end portion thereof, a guiding surface 300 which is inclined in a downward and rearward direction.

Figure 7:
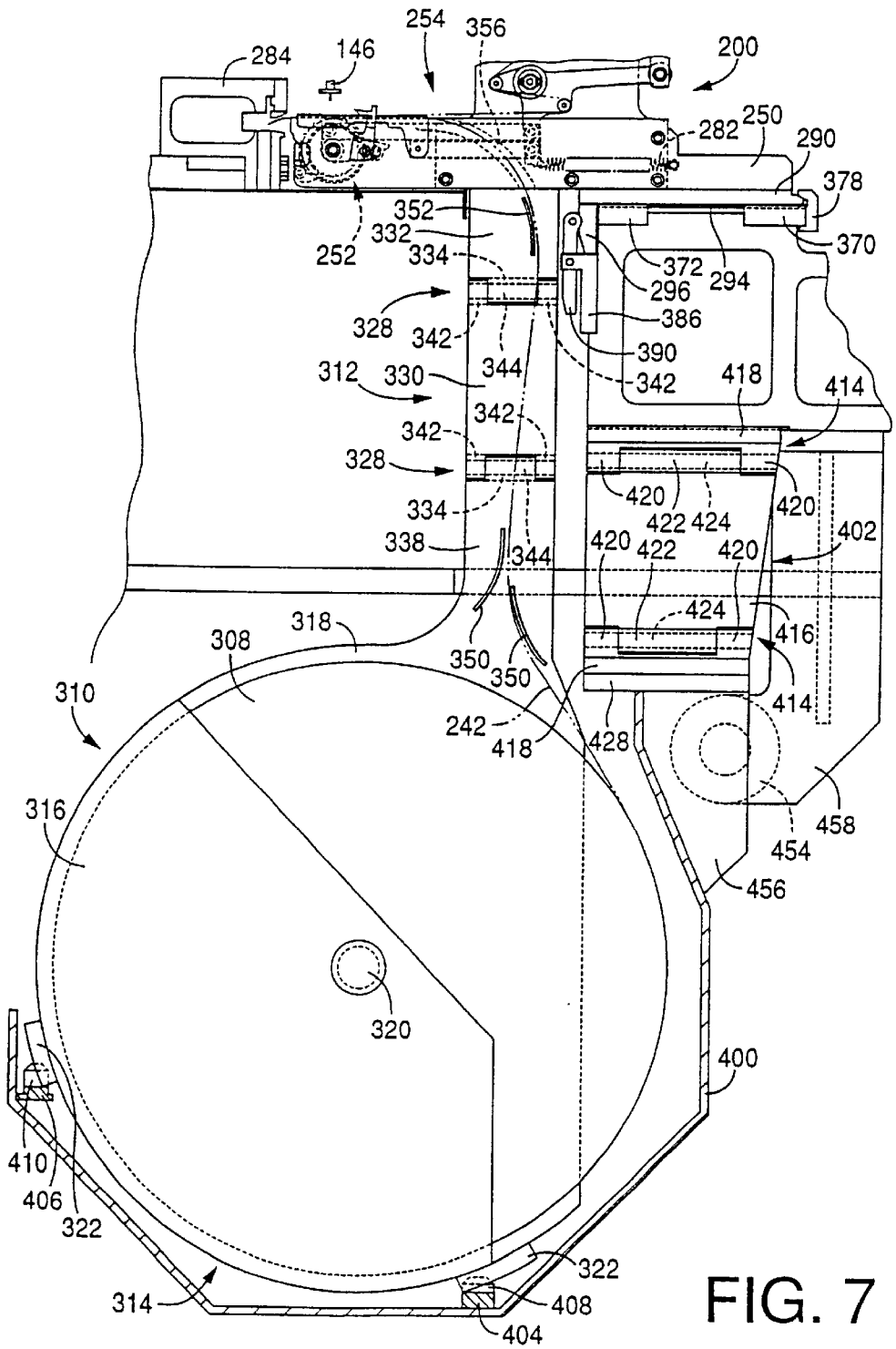
FIG. 7 is a partly cross-sectioned, side elevation view of the CC feeder and a portion of the circular table.

As shown in FIG. 7, the CC carrier tape 242 is wound around a tape reel 308. A reel holder 310 which holds the tape reel 308 is connected by a connecting device 312 to a lower surface of an intermediate portion of the main member 250 in the lengthwise direction thereof. The intermediate portion of the main member 250 is between the first positioning projection 290 and the CC-supply portion thereof. The reel holder 310 and the connecting device 312 cooperate with each other to provide a reel-holding device of the CC feeder 200. The reel holder 310 includes a reel container 314 having a width slightly greater than that of the tape reel 308. The reel container 314 has a pair of side walls 316, 318 each of which has a generally circular shape whose diameter is greater than that of the reel 308 but a portion of which is cut off. The cut-off portion of one 316 of the two side walls 316, 318 is greater than that of the other side wall 318, but does not include a central portion of the same 316.

The reel container 314 has a bottom wall connecting the one side wall 316 to a portion of the other side wall 318, and opens on the upstream side of the CC feeder 200 in the tape-feeding direction. The tape reel 308 fits on an axis member 320 which is detachably attached to the two side walls 316, 318 such that opposite end portions of the axis member 320 are supported by the same 316, 318, respectively. Thus, the reel 308 can be supported by the two side walls 316, 318 via the axis member 320 such that the reel 308 is rotatable about an axis line parallel to the widthwise direction of the feeder 200. The reel container 314 and the axis member 320 detachably attached thereto cooperate with each other to provide the reel holder 310. Two plate-like fins 322 each as an engaging member are fixed at two locations on an outer surface of the bottom wall of the reel container 314 which are distant from each other in a circumferential direction of the container 314.

Figure 8:
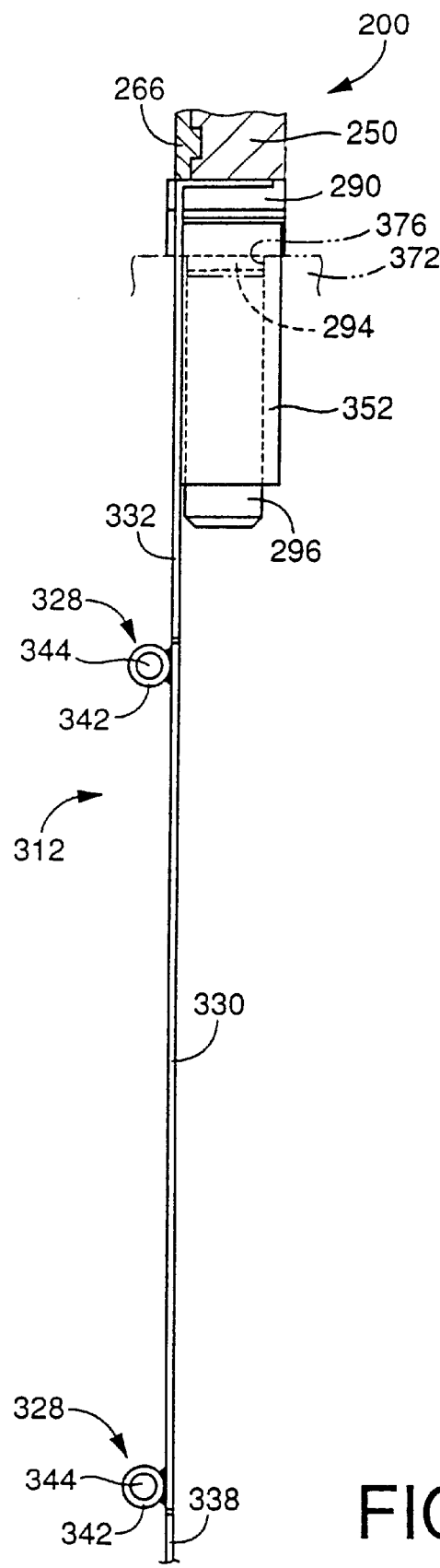
FIG. 8 is a front elevation view of a connecting device which connects between the main portion and a reel-holding portion of the CC feeder.

The connecting device 312 includes two hinge devices 328 and a connecting member 330. As shown in FIG. 8, a support member 332 is fixed to the lower surface of the intermediate portion of the elongate main member 250. The support member 332 has a plate-like shape including a base portion fixed to the main member 250 and a pendent portion which is pendent from the base portion at one of widthwise opposite ends of the main member 250 such that the plane of the pendent portion is parallel to the lengthwise direction of the main member 250 and is perpendicular to the widthwise direction of the same 250. A first hinge member 334 (FIG. 7) is fixed, by welding as a sort of fixing means, to an intermediate portion of the pendent portion of the support member 332 as viewed in the lengthwise direction of the main member 250, such that the hinge member 334 extends parallel to the lengthwise direction of the main member 250.

As shown in FIG. 7, the side wall 318 of the reel container 314 includes an upper projection 338 which projects upward. A second hinge member 334 similar to the first hinge member 334 is fixed, by welding, to an intermediate portion of the upper projection 338 of the side wall 318 as viewed in the lengthwise direction of the main member 250, such that the second hinge member 334 extends parallel to the lengthwise direction of the main member 250.

The connecting member 330 is formed of an elongate sheet or leaf spring. A first pair of third hinge members 342 are fixed by welding to one of lengthwise opposite ends of the connecting member 330 in such a manner that the two hinge members 342 are distant from each other in the lengthwise direction of the main member 250 and coaxially extend in that direction, and a second pair of third hinge members 342 are fixed by welding to the other end of the same 330 in a similar manner. A first hinge pin 344 fits in the first hinge member 334 fixed to the support member 332 and the first pair of third hinge members 342 fixed to the one end of the connecting member 330, and a second hinge pin 344 fits in the second hinge member 334 fixed to the upper projection 338 of the reel container 314 and the second pair of third hinge members 342 fixed to the other end of the connecting member 330.

Thus, the connecting member 330 is connected, at its opposite end portions, to the reel holder 310 and the main member 250, respectively, such that the connecting member 330 is pivotable about each of two axis lines which are parallel to the lengthwise direction of the main member 250 and which are distant from each other in a direction perpendicular to both the lengthwise and widthwise directions of the main member 250. With each CC feeder 200 being held by the circular table 202, the connecting member 330 extends in a direction parallel to the axis line of the circular table 202, i.e., the center axis line of the support shaft 212, and is connected, at its opposite end portions, to the reel holder 310 and the main member 250, respectively, such that the connecting member 330 is pivotable about each of two two axis lines which are perpendicular to the direction of rotation of the CC feeder 200 and which are distant from each other in a direction parallel to the axis line of the circular table 202. The reel holder 310 is pendent from the main portion 254 of the feeder 200, holds the tape reel 308 such that the whole of the reel 308 is positioned below the main portion 254, and is connected to the main portion 254 such that no portion of the reel 308 projects outward from the main portion 254 in the widthwise direction of the main member 150 and only less than a half portion of the reel 308 projects outward from the main portion 254 in the lengthwise direction of the main member 150.

A pair of guide members 350 are fixed to an intermediate portion of one of opposite surfaces of the upper projection 338 which is on the side of the main member 250. A single guide member 352 is fixed to a central portion of one of opposite surfaces of the support member 332 which is on the side of the main member 250. Each of the guide members 350, 352 is provided by a curved plate-like member. The CC carrier tape 242 drawn from the tape reel 308 is fed to the main portion 254 by being passed between the two guide members 350 and being guided by the guide member 352.

Figure 9:
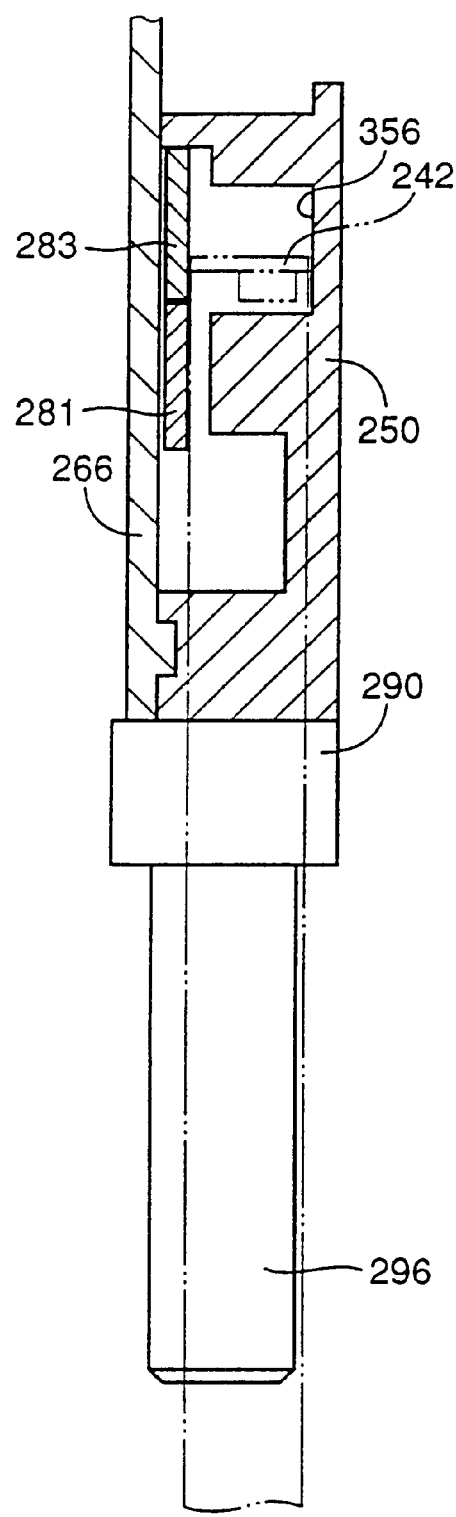
FIG. 9 is a cross-sectioned, side elevation view of a portion of the main portion of the CC feeder in which a guide groove for guiding a CC carrier tape is provided.

As shown in FIGS. 5 and 9, the main member 250 has a curved guide groove 356 as a guide portion which opens in the bottom surface thereof and one of the opposite side surfaces thereof. The guide groove 356 is curved in a direction from the bottom of the intermediate portion of the main member 250 toward the front end portion of the same 250, such that the groove 356 is upwardly convex in a vertical direction. After the CC carrier tape 242 is fed through the guide groove 356, it is fed onto the upper surface of the main member 250, so that the perforations of the CC-accommodating tape 244 are engaged with the teeth of the sprocket 358. Simultaneously, the carrier tape 242 is covered with the cover tape 256, so that the tape 242 is prevented from jumping out of the main member 250. Since the cover-driving bar 281 and the tape-feeding bar 283 partly close the opening of the guide groove 256 in the side surface of the main member 250, the carrier tape 242 is prevented from moving in its widthwise direction by one side wall of the groove 356 and the bars 281, 283. In addition, since the carrier tape 242 (more exactly, the CC-accommodating tape 244) is engaged with the sprocket 358, the tape 242 is accurately positioned in its widthwise direction relative to the main member 250. Thus, the lengthwise direction of the tape 242 is maintained parallel to the lengthwise direction of the main member 250, so that the leading one of the CCs 150 from which the cover tape 246 has been peeled is accurately positioned at the CC-pick-up position of the CC feeder 200. As shown in FIGS. 7 and 8, the hinge members 334, 342 are provided on one of both sides of the connecting member 330 which is opposite to the other side on which the main member 250 or the tape reel 308 is present. However, the hinge members 334, 342 have a small diameter. Accordingly, with the CC feeders 200 being held by the circular table 202, the hinge members 334, 342 of one of two adjacent feeders 200 do not interfere with the feeding of the CC carrier tape 242 in the other feeder 200.

As shown in FIGS. 1 and 6, a small-diameter annular positioning plate 370 and a large-diameter annular positioning plate 372 are fixed to a radially outer portion of the annular portion 210 of the circular table 202, such that the two annular plates 370, 372 are concentric with the annular portion 210, i.e., the circular table 202. The two positioning plates 370, 372 have a plurality of positioning grooves 374 and a plurality of positioning grooves 376, respectively, which are formed through the thickness of the corresponding plate 370, 372 in radial directions of the circular table 202 and which are equi-angularly spaced from each other about the center axis line of the circular table 202. The positioning grooves 374, 376 have a predetermined width which assures that the positioning rib 294 of the main member 250 of each CC feeder 200 fits in each groove 374, 376 such that each CC feeder 200 is prevented from moving in its widthwise direction. An annular stopper plate 378 is fixed to an inner circumferential surface of the small-diameter positioning plate 370. The stopper plate 378 has an inclined engaging surface 380 (FIG. 5) which is engageable with the inclined engaging surface 292 of the main member 250 of each CC feeder 200. The stopper plate 378 is commonly used for all the CC feeders 200, and the inclined engaging surface 380 has an annular shape.

As shown in FIGS. 5 and 6, a plurality of engaging devices 384 are provided on an outer circumferential surface of the angular portion 210 of the circular table 202. FIG. 6 shows the two CC feeders 200 and the two engaging devices 384 as representatives of all the feeders 200 and the engaging devices 384. Each of the engaging devices 384 includes an attachment member 386 which is fixed to the outer circumferential surface of the annular portion 210 at a position which is lower by a small distance than the upper surface of the annular portion 210 and which corresponds to one of the positioning grooves 376 of the positioning plate 372. Each attachment member 386 has a recess 388 which opens upward, and an engaging lever 390 is attached to the attachment member 386 such that the engaging lever 390 is pivotable about an axis line parallel to a tangential line to the outer circumferential surface of the annular portion 210. An engaging roller 394 is attached to an upper end of each engaging lever 390 such that the engaging roller 394 is rotatable about an axis line parallel to the axis line about which the engaging lever 390 is pivotable. Each engaging lever 390 is biased by a compression coil spring 396 as an elastic member as a sort of biasing device which is provided between a lower end portion thereof and the attachment member 386, in a direction in which the engaging roller 394 is moved toward the outer circumferential surface of the annular portion 210.

As shown in FIGS. 1 and 7, an annular bucket 400 is connected by four connecting devices 402 to a lower surface of the radially outer portion of the annular portion 210. The bucket 400 opens upward. Two annular engaging members 404, 406 are fixed to an inner surface of the bucket 400 at two positions, respectively, which are spaced apart from each other in a radial direction of the circular table 202, such that the two engaging members 404, 406 are concentric with the bucket 400. The engaging member 404 has a comb-like configuration having a plurality of engaging grooves 408 which are equi-angularly spaced from each other about the center axis line of the circular table 202 and which are formed at a plurality of positions where the respective reel holders 310 of the CC feeders 200 are attached to the bucket 400, respectively. Each engaging groove 408 extends in a radial direction of the circular table 202. The engaging member 406 also has a comb-like configuration having a plurality of engaging grooves 410 similar to the grooves 408. The engaging grooves 408, 410 have a constant width which assures that the engaging fins 322 of the reel container 314 of each CC feeder 200 are fit therein such that the fins 322 are not movable in the widthwise direction of the feeder 200. Each engaging groove 408, 410 is defined by a pair of opposed walls or teeth formed on the engaging member 404, 406, and respective upper end portions of the opposed walls have respective inclined surfaces which are inclined such that the distance therebetween increases in an upward direction, that is, that the two inclined surfaces define an upper opening which functions as a guide for guiding each engaging fin 322 when the fin 322 is fit or engaged with the groove 408, 410.

The four connecting devices 402 are equi-angularly spaced from each other about the center axis line of the circular table 202. Each connecting device 402 includes two hinge devices 414 and two connecting members 416. Since the four connecting devices 402 have an identical construction, one of them 402 will be described below as a representative thereof.

Figure 10:
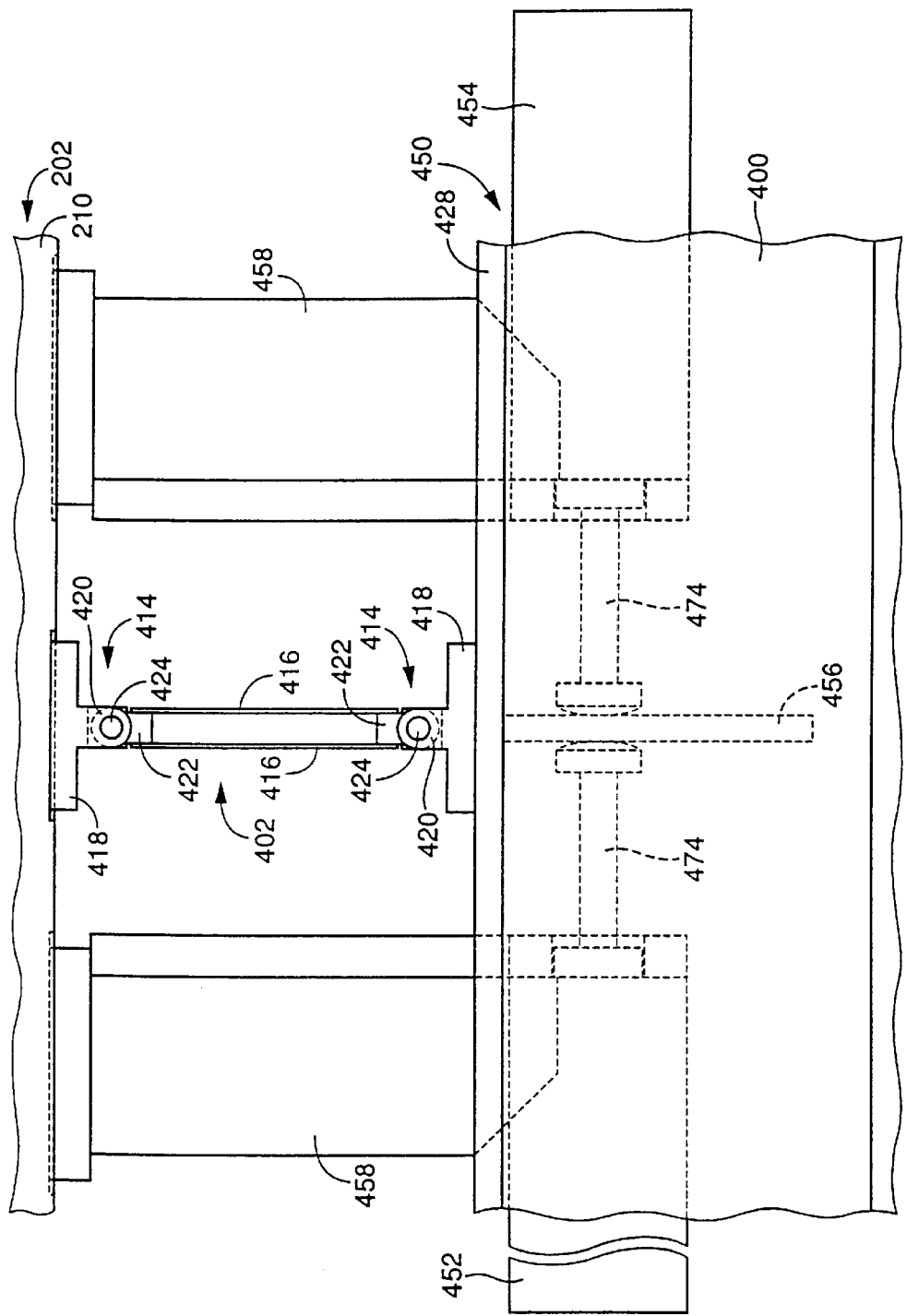
FIG. 10 is a front elevation view of an attaching device which attaches a bucket supporting the reel-holding portion of the CC feeder to the circular table, and a binder delay-and-return device.

As shown in FIGS. 7 and 10, a hinge member 418 having a pair of cylindrical portions 420 is fixed to the lower surface of the radially outer portion of the annular portion 210 of the circular table 202. The hinge member 418 is elongate in a radial direction of the table 202. A hinge member 422 having a generally cylindrical shape is fit in a space between the two cylindrical portions 420 of the hinge member 418, and a hinge pin 424 is inserted through the hinge members 418, 422. Thus, in the hinge device 414, the hinge member 422 is connected to the hinge member 418 such that the hinge member 422 is pivotable about an axis line perpendicular to the axis line of the table 202.

As shown in FIGS. 7 and 10, an annular, plate-like attachment portion 428 is formed integrally with an upper end portion of an inner wall of the bucket 400, such that the attachment portion 428 extends horizontally. A second hinge member 418 identical with the first hinge member 418 fixed to the lower surface of the annular portion 210 is fixed to an upper surface of the attachment portion 428. The second hinge member 418 is elongate in a radial direction of the annular bucket 400. A second hinge member 422 having a generally cylindrical shape is fit in a space between a pair of cylindrical portions 420 of the second hinge member 418, and a second hinge pin 424 is inserted through the second hinge members 418, 422. Thus, the second hinge member 422 is connected to the second hinge member 418 such that the second hinge member 422 is pivotable about an axis line perpendicular to the center axis line of the bucket 400. The second hinge members 418, 422 and the second hinge pin 424 cooperate with each other to provide a second hinge device 414.

The two connecting members 416 each of which is formed of a leaf spring are fixed, at lengthwise opposite end portions thereof, to opposite side surfaces of the first hinge member 422 of the first hinge device 414 and opposite side surfaces of the second hinge member 422 of the second hinge device 414. The connecting members 416 are elongate in a direction parallel to the axis line of the circular table 202, and are connected at the lengthwise opposite end portions thereof to the table 202 and the bucket 400, respectively, such that the connecting members 416 are pivotable about each of two axis lines which are perpendicular to the direction of rotation of the CC feeders 200 and which are spaced apart from each other in a direction parallel to the axis line of the table 202.

The circular table 202 is equipped with four binder delay-and-return devices 450 which are equi-angular spaced from one another about the axis line thereof. As shown in FIG. 10, each device 450 includes two shock absorbers 452, 454 which are commercially available. As shown in FIG. 7, the annular attachment portion 428 of the bucket 400 has four plate-like engaging portions 456 at respective positions where the attachment portion 428 is connected to the circular table 202 by the four connecting devices 402. Each engaging portion 456 extends in a plane perpendicular to the direction of rotation of the table 202. The two shock absorbers 452, 454 are supported by two brackets 458, respectively, which are fixed to the table 202, such that the two absorbers 452, 454 are opposed to, and coaxial with, each other on both sides of the engaging portion 456.

Figure 11:
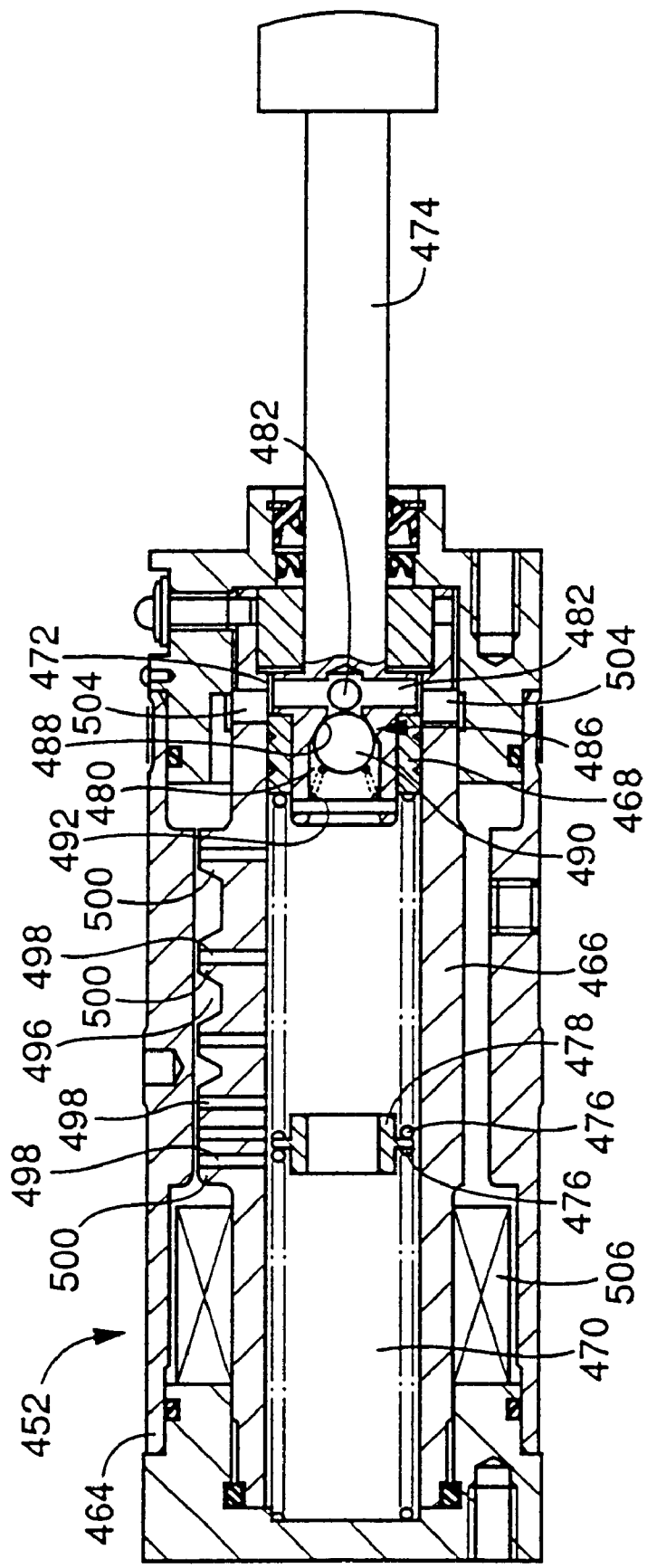
FIG. 11 is a cross-sectioned, front elevation view of a shock absorber of the binder delay-and-return device.

Since the two shock absorbers 452, 454 have an identical construction, one 452 of them will be described as a representative thereof by reference to FIG. 11.

The shock absorber 452 includes a cylindrical casing 464, and a cylindrical tube 466 which is fixed inside the casing 464 such that a space is left between the casing 464 and the tube 466 in a radial direction of the casing 464. A piston 468 is fit in the tube 466 such that the piston 468 is fluid-tightly slideable relative to the tube 466. A first and a second fluid chamber 470, 472 in which a working fluid such as an oil is present are formed on both sides of the piston 468. A piston rod 474 which is formed integrally with the piston 468 extends through the second fluid chamber 472 and projects outward from the casing 464. The piston 468 is biased by two compression coil springs 476 each as an elastic member as a sort of biasing device which are provided in the first fluid chamber 470, in a direction in which the piston rod 474 projects out of the casing 464. Respective one ends of the two springs 476 which are adjacent to each other are supported by a seat member 478.

The first and second fluid chambers 470, 472 are communicated with each other via an axial-direction passage 480 and a plurality of radial-direction passages 482, and a check valve 486 is provided in the axial passage 480. The check valve 486 includes a seat member 488, a ball 490 as a valve member, and a spring 490 which biases the ball 490 in a direction in which the ball 490 is seated on the seat member 488. The check valve 486 permits the fluid to flow in a direction from the second chamber 472 to the first chamber 470 but does not permit the fluid to flow in the opposite direction.

A third, annular fluid chamber 496 is provided between the casing 464 and the cylindrical tube 466. The first and third fluid chambers 470, 496 are communicated with each other via a plurality of passages 498 which are formed through the thickness of the cylindrical wall of the tube 466. The tube 466 has, on an outer circumferential surface thereof, a plurality of annular portions 500 which project radially outward and which are spaced apart from each other in a direction parallel to an axis line of the tube 466. One or more passages 498 are formed through each of the annular portions 500. Since the clearance between a radially outer opening of each of the passages 498 and an inner surface of the casing 464 is very small, the clearance restricts the flowing of the fluid out of the passage 498. The distance between each pair of adjacent passages 498 as seen in the axial direction of the tube 466 decreases in a direction in which the piston rod 474 is retracted into the casing 464, that is, increases in a direction in which the rod 474 is advanced out of the casing 464.

The second and third fluid chambers 472, 496 are communicated with each other via a plurality of passages 504 which are formed through the thickness of the cylindrical tube 466 and which have a sufficiently great cross section. A volume-changeable member 506 which is filled with a gas such as air is provided in the third fluid chamber 496. The volume of the volume-changeable member 506 is decreased when the gas contained therein is compressed.

When the piston rod 474 receives a force to push it into the cylindrical tube 466, the piston 468 is retracted while compressing the springs 476. Because of this retraction, the volume of the volume-changeable member 506 is decreased, and the fluid is flown from the first fluid chamber 470 into the third fluid chamber 496 via the passages 498. Since, however, the flows of the fluid from the passages 498 are restricted, the shock absorber 452 applies an attenuating force to decrease the speed of retraction of the piston 468. As the distance of retraction of the piston 468 increases, the number of the passages 498 which communicate the first chamber 470 with the third chamber 496 decreases, and the difficulty to further retract the piston 468 increases. On the other hand, if the force is released from the piston rod 474, the piston 468 is advanced because of the biasing force of the springs 476. At the beginning, the number of the passages 498 which communicate the first chamber 470 with the third chamber 496 is the minimum and accordingly only the least amount of fluid is flown from the third chamber 496 into the first chamber 496 via the passages 498. However, a large amount of fluid is flown from the second chamber 472 into the first chamber 470 via the passages 482, 504 and the check valve 486 (or the passage 480). Thus, the piston 468 is quickly advanced.

The pair of shock absorbers 452, 454 are designed such that in an initial state thereof in which the absorbers 452, 454 are initially attached to the circular table 202 (or the brackets 458), the respective piston rods 474 of the two absorbers 452, 454 are symmetrically engaged with the engaging portion 456 in such a manner that the piston 468 of each absorber 452, 454 compresses the corresponding springs 476 a little and closes one of the passages 498 which is the nearest to the engaging portion 456.

Each CC feeder 200 is held by the circular table 202 in such a manner that first an operator tilts the feeder 200 such that the rear half portion thereof (i.e., the upstream half portion thereof in the CC feeding direction) is lower than the front half portion thereof (i.e., the downstream half portion thereof which includes the CC-supply portion thereof), second engages the rear end portion of the positioning rib 294 with an appropriate one of the positioning grooves 474 of the inner positioning member 370, subsequently moves the feeder 200 toward the axis line of the table 202 till the inclined surfaces 292, 380 engage each other, and then place the front half portion thereof down onto the positioning members 370, 372. Thus, the positioning rib 294 is naturally fit in the corresponding positioning groove 376 of the outer positioning member 372.

Simultaneously, the positioning projection 296 naturally enters the space between the engaging roller 394 and the circular table 202, so that the engaging lever 390 is pivoted in a direction in which the roller 394 is moved away from the table 202 against the biasing force of the compression coil spring 396. Thus, the lower end portion of the projection 394 is fit in the recess 388 of the attachment member 386. The guide surface 300 facilitates the entering of the projection 296. In the state in which the positioning rib 294 is fit in the positioning grooves 374, 376, the roller 394 is engaged with the engaging surface 298. The biasing force of the spring 396 is applied to the lever 390 which accordingly presses the main member 250 of the CC feeder 200, so that the inclined surface 292 is pressed on the inclined surface 380. Thus, the CC feeder 200 is positioned in the lengthwise direction thereof. In addition, because of the inclination of the surfaces 292, 380, the rear end portion of the feeder 200 around the inclined surface 292 is pressed on an upper surface of the positioning plate 370. Simultaneously, because the engaging surface 298 is positioned below the respective upper surfaces of the positioning plates 370, 372, the moment of the biasing force is applied to the feeder 200, about the position where the two inclined surfaces 292, 380 are engaged with each other. This moment is the product of the biasing force and the vertical distance between that position and the position where the roller 394 is engaged with the surface 298. Owing to this moment, the front end portion of the feeder 200 is pressed on the upper surface of the positioning plate 372.

Since the positioning rib 294 is fit in the positioning grooves 374, 376 and the positioning projection 296 is fit in the recess 388, the CC feeder 299 is inhibited from being moved in the widthwise direction thereof. The feeder 200 is attached to the table 202 such that the feeder 200 is prevented from moving in the widthwise and lengthwise directions thereof and jumping off the table 202 and such that the feeder 200 takes a substantially horizontal attitude. In addition, the respective CC-supply portions of the CC feeders 200 are arranged along a circle whose center rides on the center axis line of the table 202.

When each CC feeder 200 is attached to the circular table 202, the reel holder 310 of the feeder 200 is accommodated in the bucket 400, and the two engaging fins 322 of the holder 310 are fit in appropriate ones of the engaging grooves 408, 410 of the engaging members 404, 406. Thus, each of the respective reel holders 310 of the CC feeders 200 is prevented from being moved relative to the bucket 400 in the widthwise direction of the same 310. The projection 290, the rib 294, the projection 296, the grooves 374, 376, the recess 388, and the stopper plate 378 cooperate with one another to provide a positioning device which positions each CC feeder 200 relative to the table 202; and the engaging device 384, the stopper member 378, and the projection 290 cooperate with one another to provide a fixing device which fixes each CC feeder 200 to the table 202.

As shown in FIG. 1, in the state in which each CC feeder 200 is held by the circular table 202, the downstream half portion of the feeder 200 in the CC feeding direction projects radially outward from the table 202, and the reel holder 310 of the feeder 200 is pendent from the main member 250 of the feeder 200 such that a major portion of the holder 310 is positioned below the PCB position-and-support device 22 which is provided at a height position higher than that of the base member 10, in view of the height position of the CC mounting position of the CC mounting device 14, and accordingly has a space thereunder. The bucket 400 and the reel holders 310 of the CC feeders 200 are provided and positioned in the space under the device 22. In addition, as described above, the CC sucking position is higher than the CC mounting position, and the respective main members 250 of the feeders 200 attached to the table 202 are positioned above the space in which the PCB 20 is moved. Therefore, when the CCs are mounted on the PCB 20, the PCB 20 or the PCB support table 40 can be moved into the space between the main members 250 and the reel holders 310 of the feeders 200. Thus, the present CC mounting system 8 enjoys a compact construction.

As shown in FIG. 1, the CC supplying apparatus 12 includes a safety cover 510 which prevents the operator from safety hazards and which also functions to reduce noise. The safety cover 510 has a window 512 which can be opened and closed. The operator cannot manually open and close the window 512, when the CC supplying apparatus 12 is supplying the CCs 150 to the CC mounting device 14.

Figure 12:
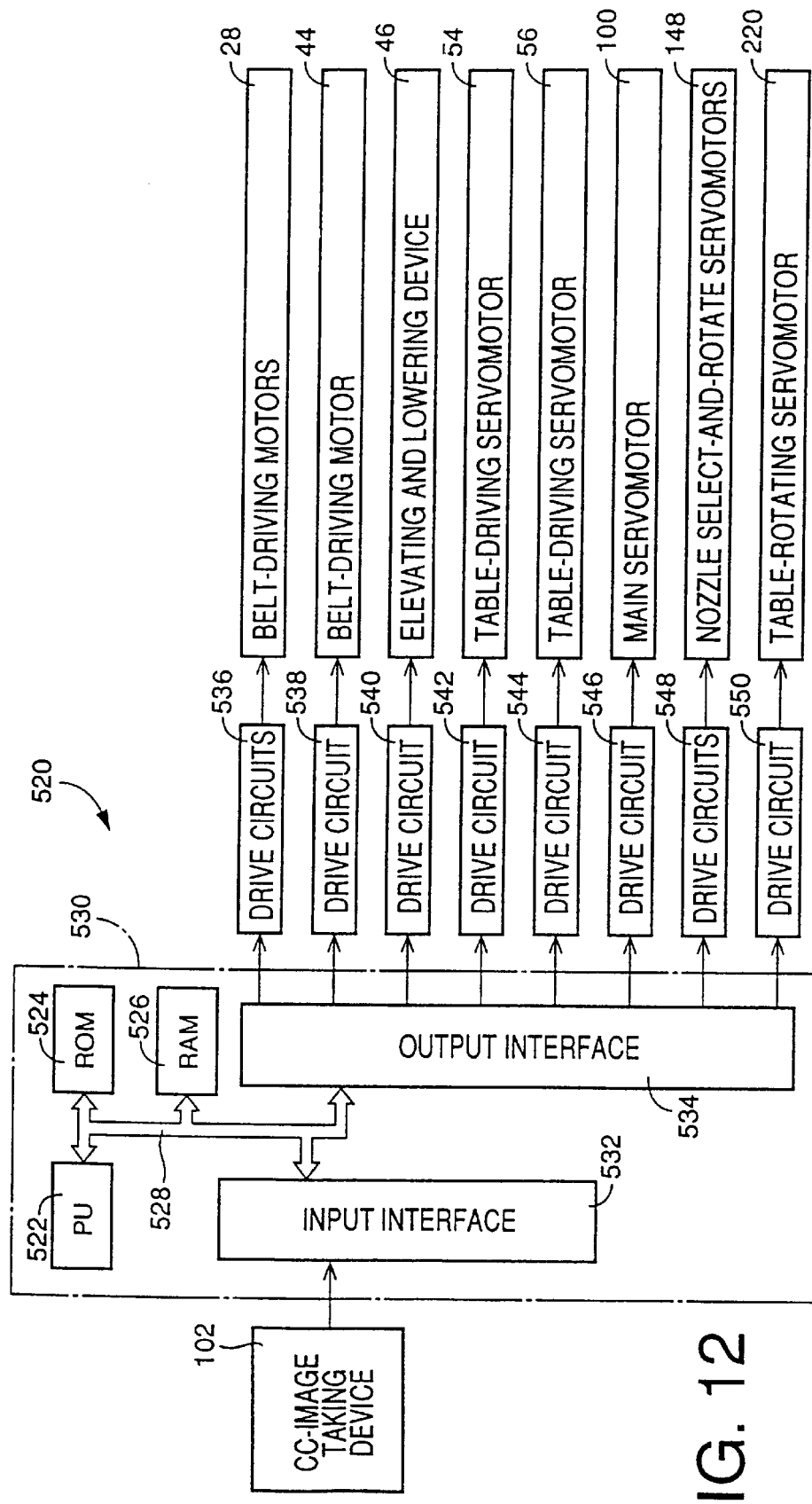
FIG. 12 is a diagrammatic view of a relevant portion of a control device of the CC mounting system of FIG. 1.

The present CC mounting system 8 includes the control device 520 shown in FIG. 12. The control device 520 is essentially provided by a computer 530 including the PU (processing unit) 522, a read only memory (ROM) 524, a random access memory (RAM) 526, and a bus 528 which connects those elements 522, 524, 526 to one another. An input interface 532 is connected to the bus 528, and the image taking device 102 is connected to the input interface 532. An output interface 534 is also connected to the bus 528, and is connected via respective drive circuits 536, 538, 540, 542, 544, 546, 548, 550 to the belt-driving motors 28, the belt-driving motor 44, the elevating and lowering device 46, the table-driving servomotors 54, 56, the main servomotor 100, the nozzle select-and-rotate servomotors 148, and the table-rotating servomotor 220. The ROM 24 stores various software programs which are necessary for moving and positioning the CC feeders 200 and supplying and mounting the CCs 150 on the PCBs 20.

Each of the servomotors 54, 56, 100, 148, 220 each of which is employed as a sort of electric motor as a drive source can be rotated by any desired angle and then be stopped. Stepper motors may be employed as the drive sources in place of the servomotors 54, 56, 100, 148, 220.

In the CC mounting system 8 constructed as described above, when the CCs 150 are mounted on the PCB 20, the PCB 20 is carried in onto the PCB position-and-support device 22 by the PCB carry-in device 24. After the PCB support table 40 receives the PCB 20 at its uppermost position, the table 40 holding the PCB 20 is lowered and then is moved by the respective movements of the X and Y tables 36, 38 to a predetermined set of X and Y coordinates on a horizontal X-Y plane where a CC 150 is mounted at one of a plurality of CC-mount positions on the PCB 20. Before the CCs 150 are mounted on the PCB 20, respective images of a plurality of reference marks fixed to the PCB 20 are taken and, based on the taken images, respective errors of each of the CC-mount positions in the X-axis and Y-axis directions are calculated. Based on the thus calculated errors of each CC-mount position in the X-axis and Y-axis directions and the respective errors of each CC 150 held by the CC-holding head 64 in the X-axis and Y-axis directions, the predetermined set of X and Y coordinates are corrected by the control device 520.

When the CCs 150 are mounted on the PCB 20, the main servomotor 100 is actuated to contemporaneously rotate the four concave globoidal cams 90a–90d in synchronism with one another, so that the fifteen rotary plates 60 are rotated and stopped and the fifteen CC-holding heads 64 are are sequentially moved to, and stopped at, the CC sucking position where each head 64 picks up a CC 150 from the CC feeder 200 which is positioned at the CC supplying position. After each head 64 picks up the CC 150, the corresponding rotary plate 60 is moved to, and stopped at, the CC-image taking position where the image of the CC 150 held by the head 64 is taken and, based on the taken image, the respective errors of the CC 150 held by the head 64 in the X-axis and Y-axis directions and the rotation error of the same 150 about the axis line of the suction nozzle 146 are calculated. After the CC-image taking position, the rotary plate 60 is moved to, and stopped at, the CC mounting position where the head 64 mounts the CC 150 on the PCB 20.

An appropriate one of the CC feeders 200 is positioned at the CC supplying position where the feeder 200 supplies a CC 150. After one feeder 200 supplies a CC 150, the circular table 202 is rotated and stopped so that another feed 200 which is to supply a CC 150 next is positioned at the CC supplying position. Usually, the feeders 200 are attached to the table 202 in the same order as that in which the respective sorts of CCs 150 stored in the feeders 200 are mounted on the PCB 20. Therefore, usually, after one feeder 200 supplies one CC 150, the table 202 is rotated by one angular pitch which is equal to a value obtained by dividing 360 (degrees) with the maximum number of the feeders 200 that can be attached to the table 200, so that the following feeder 200 is positioned at the CC supplying position.

Next, there will be described the operation of the CC supplying apparatus 12 when the circular table 202 is rotated by one angular pitch and then is stopped. In an initial state in which the table 202 has been stopped for a long time, the bucket 400 and the reel holders 310 which are movable as a unit with the table 200 are also stopped such that the elastic force of the springs 476 of one of the two shock absorbers 452 of each binder delay-and-return device 450 is well balanced by that of the other absorber 454. Thus, the bucket 400 takes its reference phase relative to the table 202. Here, it is assumed that the table 202 is rotated by one pitch from its initial state in such a manner that first the rotation speed of the table 202 is slowly accelerated and then is slowly decelerated. When the table 202 is accelerated, the main members 250 (or main portions 254) of the CC feeders 200 attached to the table 202 are also accelerated as a unit with the table 202. On the other hand, the bucket 400 is connected to the table 202 by the connecting devices 402 such that the bucket 400 is rotatable relative to the table 202 in a direction opposite to the direction of rotation of the table 202, and the respective reel holders 310 of the feeders 200 are connected to the respective main members 250 of the feeders 200 such that the holders 310 are rotatable relative to the main members 250 in the direction opposite to the direction of rotation of the table 202. Because of their inertial mass, the bucket 400 and the reel holders 310 are retarded from the table 202 and the main members 250, respectively.

In each of the connecting devices 402 which connect the circular table 202 and the bucket 400 to each other, the connecting members 416 are pivoted relative to the table 202 and relative to the bucket 400, so that the bucket 400 is rotated relative to the table 202 (i.e., is moved relative to the table 202 in the circumferential direction of the table 202) while keeping its horizontal attitude. As the bucket 400 and the table 202 are rotated relative to each other, the upper hinge device 414 where the upper end portions of the connecting members 416 are connected to the table 202 and the lower hinge device 414 where the lower end portions of the connecting members 416 are connected to the bucket 400 are not only moved relative to each other in the circumferential direction of the table 202 but also are rotated relative to each other about an axis line parallel to the center axis line of the table 202. The relative rotation of the two hinge devices 414 is permitted by the elastic deformation of the connecting members 416.

In each of the connecting devices 312 each of which connects between the main member 250 (or main portion 254) and the reel holder 310 of each CC feeder 200, the connecting member 330 is pivoted relative to the main member 250 and relative to the reel holder 310, so that the reel holder 310 is not only moved relative to the main member 250 in a direction opposite to the direction of movement of the main member 250 (i.e., in the circumferential direction of the table 202) while keeping its horizontal attitude, but also is rotated relative to the main member 250 about an axis line parallel to the center axis line of the table 202. The relative rotation of the reel holder 310 and the main member 250 is permitted by the distortion of the connecting member 330. In addition, a portion of the CC carrier tape 242 between the main member 250 and the reel 310 is elastically bent along the connecting member 330 being pivoted, but is not interfered with by the connecting device 312 of the following feeder 200. Since the respective reel holders 310 of the feeders 200 are engaged with the bucket 400, the holders 310 are rotated with the bucket 400 relative to the table 202 and the main members 250 in the direction opposite to the direction of rotation of the table 202. This rotation is permitted by the pivotal movement of the connecting members 416, 330. Accordingly, like a pendulum, the bucket 400, the reel holders 310, the reels 308, and the CC carrier tapes 242 swing up a little and store their potential energy. This potential energy will produce a biasing force to restore or return the bucket 400 and the holders 310 to their reference phase relative to the table 202. Hereinafter, this biasing force will be referred to as the reference-phase restoring force.

When the circular table 202 is accelerated, the casing 464 of an upstream one 452 of the two shock absorbers 452, 454 of each binder delay-and-return device 450 in the direction of rotation of the table 202 is moved with the table 202, so that the piston rod 474 of the upstream absorber 452 is forcedly retracted into the cylindrical tube 466 while compressing the springs 476. Simultaneously, the casing 464 of the downstream absorber 454 is also moved with the table 202, so that the piston rod 474 of the downstream absorber 452 is advanced out of the cylindrical tube 466 while the springs 476 are expanded. However, as the elastic force of the springs 476 of the upstream absorber 452 99 increases, that of the downstream absorber 454 decreases, which leads to increasing the reference-phase restoring force to restore or return the bucket 400 and the reel holders 310 to their reference phase relative to the table 202. That is, the respective springs 476 of the two absorbers 452, 454 cooperate with a potential-energy storing mechanism including the connecting members 416, 330, the bucket 400, and the reel holders 310, to provide a biasing device which returns the bucket 400 and the holders 310 to their reference phase relative to the table 202. In addition, the attenuating force of the upstream absorber 452 decreases the speed at which the bucket 406 and the holders 310 are rotated in the direction opposite to the direction in which the table 202 is rotated. Thus, when the table 202 is accelerated, the passages 498, the annular portions 500, and the inner surface of the casing 464 of the upstream absorber 452 function as a damping device. In addition, as described above, the distance between each pair of adjacent passages 498 as seen in the axial direction of the tube 466 decreases in the direction in which the piston rod 474 is retracted into the casing 464. Accordingly, as the amount of delaying of the bucket 400 from the table 202 increases, the overall cross-section area of the fluid passages between the first and third fluid chambers 470, 496 largely decreases, and the speed-decreasing effect of the damping device largely increases while preventing the generation of great impact. In the present embodiment, the bucket 400 having the engaging members 404, 406 provides a reel-holder binder as a CC-holder binder, and the damping device also functions as a stopping device which stops the delaying of the binder and thereby defines the maximum amount of delaying of the binder from the circular table 202 as a rotary or movable table.

As the acceleration of the circular table 202 decreases, the inertial moment to rotate the bucket 400 and the reel holders 310 relative to the table 202 in the direction opposite to the direction of rotation of the table 202 decreases, and eventually becomes equal to the reference-position restoring force caused by the above-described potential energy and the elastic forces of the springs 476. At this point of time, the delaying of the bucket 400 and the holders 310 from the table 202 stops. Subsequently, as the acceleration of the table 202 decreases, the bucket 400 and the holders 310 rotate relative to the table 202 in the same direction as the direction of rotation of the table 202. Thus, the amount of delaying of those elements 400, 310 decreases. At a time around the time when the rotation of the table 202 is slowly decelerated and eventually is stopped, the bucket 400 and the holders 310 are returned to their reference phase relative to the table 202. To this end, the attenuating force of the downstream absorber 454 decreases the speed of rotation of those elements 400, 310 in the same direction as the direction of rotation of the table 202. Thus, when the table 202 is decelerated, the passages 498, the annular portions 500, and the inner surface of the casing 464 of the downstream absorber 454 cooperate with one another to provide a damping device. The timing at which the elements 400, 310 are returned to their reference phase depends on the inertial moments of the tape reels 308 held by the reel holders 310 and the CC carrier tapes 242 wound around the reels 308, and changes depending upon the remaining amounts of the carrier tapes 242. In the present embodiment, it is taken as a general rule that the bucket 400 and the holders 310 are returned to their reference phase while the table 202 is held in its long-stop state in which the table 202 is held stopped, after its rotation is completely stopped, for a time longer than a predetermined time needed for one CC 150 to be supplied from the table 202 to the CC mounting device 14.

The above description relates to the operation of the CC supplying apparatus 12 in the assumed case where the circular table 202 is rotated by one angular pitch from its initial state and then is stopped and held in its long-stop state in which the table 202 is held stopped for the long time longer than the predetermined time needed for the supplying of one CC 150. However, in an actual operation of the apparatus 12, the table 202 is rotated again by one angular pitch after it is rotated by one pitch and then is stopped for the predetermined time. Thus, the table 202 is rotated again before the bucket 400 and the reel holders 310 are returned to their reference phase. In the present embodiment, the bucket 400 and the holders 310 follow the table 202 after an angle more than one angular pitch. More specifically described, the table 202 and the main members 250 (or main portions 254) 250 of the CC feeders 200 are intermittently rotated and stopped by each angular pitch while being largely accelerated and decelerated, whereas the bucket 400 and the holders 310 are rotated at lower acceleration and deceleration to follow the table 202 and the main members 250. Thus, the CC supplying apparatus 12 produces only smaller vibration because of the lower acceleration and deceleration of the bucket 400 and the holders 310. FIG. 3 shows an ideal case where, when the table 202 and the main portions 254 are intermittently rotated by each pitch, the bucket 400 and the holders 310 are rotated at a constant speed to follow the table 202 and the main portions 254 after a constant angle. In this case, the apparatus 12 is free from the vibration which would otherwise be produced by the acceleration and deceleration of the elements 400, 310. In fact, however, the bucket 400 and the holders 310 are rotated while being delayed a little from the table 202 and the devices 254, and the relationship between the time and the angle of rotation of the former elements 400, 310 is represented by a smoother curve than that for the relationship between the time and the angle of rotation of the latter elements 202, 254. This leads to reducing the vibration generated by the apparatus 12.

In the case where the circular table 202 is held stopped for a time longer than the predetermined time, for one CC feeder 200 to successively supply two or more CCs 150, the delaying of the bucket 400 and the reel holders 310 from the table 202 and the main portions 254 may be decreased or zeroed. In this case, before the delaying is eliminated or zeroed, the bucket 400 and the holders 300 may temporarily overshoot the table 202 and the devices 254. Meanwhile, in the present embodiment, it is taken as a general rule that the table 202 is always rotated in a positive direction so that the respective CC-supply portions of the feeders 200 are sequentially positioned at the CC supplying position to supply the CCs 150. However, in the case where the table 202 is rotated in a negative or reverse direction so that a first feeder 200 which had already supplied one CC 150 may supply another CC 150 after a second feeder 200 has supplied one CC 150 following the first feeder 200, the bucket 400 and the holders 310 are rotated in the positive direction and the table 202 and the devices 254 are rotated in the reverse direction. In such cases where the bucket 400 and the holders 310 overshoot their reference phase relative to the table 202, the table 202 may temporarily receive a very large load or torque. Hence, the characteristics of the shock absorbers 452, 454, the acceleration and deceleration of the circular table 202, and the respective masses of the reel container 314, the tape reel 308, and the CC carrier tape 242 are so selected that even in those cases the amplitude of the vibration of the CC supplying apparatus 12 does not exceed a design limit. In particular, in the case where the table 202 is rotated in the reverse direction, it is possible to start the reverse-direction rotation of the table 202 after keeping the table 202 stopped for a predetermined time and thereby completely stopping the vibration of the bucket 400 and the holders 310 relative to the table 202 or attenuating the vibration to a considerable degree.

Thus, in the present embodiment, the bucket 400 and the reel holders 310 engaged therewith are delayed from the circular table 202 and the main portions 254, while being moved at the lower acceleration and deceleration. Thus, the present CC supplying apparatus 12 produces only much smaller vibration than in the case where the bucket 400 having a large mass, the plurality of reel holders 310, the plurality of tape reels 308, and the plurality of carrier tapes 242 are iteratively rotated and stopped with the table 202 and the main portions 254 at the higher acceleration and deceleration. Accordingly, each feeder 200 can be positioned with accuracy, and the failure of supplying of CC 150 can be prevented. In addition, the acceleration and deceleration of the table 202 can be increased, which leads to improving the efficiency of supplying of CCs 150 of the CC supplying apparatus 12 and thereby improving the efficiency of mounting of CCs 150 of the CC mounting system 8.

In the main portion 254 of each CC feeder 200, the CC carrier tape 242 is fed forward through the guide groove 356 while being sandwiched by the side wall of the groove 356 on one side and the cover-driving bar 281 and the tape-feeding bar 283 on the other side. In addition, the perforations of the CC-accommodating tape 244 are engaged with the teeth of the sprocket 358. Thus, the carrier tape 242 is positioned in its widthwise direction, at two portions thereof which are distant from each other in its lengthwise direction. Accordingly, though the portion of the carrier tape 242 between the tape reel 308 and the main member 250 is bent along the connecting member 330 by the movement of the reel holder 310 relative to the main member 250, the carrier tape 242 is effectively prevented from being rotated, out of position, about a vertical axis line on the main member 250. Thus, the lengthwise direction of the carrier tape 242 is kept parallel to the lengthwise direction of the main member 250, so that the leading one of the CCs 150 from which the cover tape 246 has been peeled is accurately positioned at the CC-pick-up position in the CC-supply portion of the feeder 200.

Moreover, the vibration of the floor on which the present CC mounting system 8 is disposed is decreased. Therefore, the CC 150 held by each suction nozzle 146 of the CC mounting device 14 is effectively prevented from moving out of position relative to the nozzle 146, or falling off the same 146. In addition, the CC 150 is prevented from being mounted at an inaccurate position on the PCB 20, or the CC 150 already mounted on the PCB 20 is prevented from moving out of position on the same 20. Furthermore, the operator does not feel the uncomfortable vibration which would otherwise be caused.

After all the CCs 150 that are to be mounted on the PCB 20 are supplied from the circular table 202 to the CC mounting device 14, the table 202 is rotated or returned to its initial position where the CC-supply portion of the first CC feeder 200 which first supplies the CC 150 is positioned at the CC supplying position. The direction in which the table 202 is rotated for being returned depends on the central angle occupied by all the feeders 200 attached to the table 202, i.e., defined or contained by the first feeder 200 and the last feeder 200 which last supplies the CC 200. If the central angle is greater than 180 degrees, the table 202 is rotated in the positive direction in which the table 202 is rotated for supplying the CCs 150; if smaller than 180 degrees, the table 202 is rotated in the reverse direction; and if equal to 180 degrees, the table 202 may be rotated in either direction. That is, the direction of the returning rotation of the table 202 is so selected that the angle of rotation of the table 202 in the selected direction is the smaller than that in the opposite direction. Thus, the table 202 is quickly returned to its initial position.

During the returning rotation of the circular table 202, the table 202 is slowly increased and, after its rotation speed reaches a predetermined value, the table 202 is rotated at the predetermined value. Finally, the table 202 is slowly decelerated so that the table 202 is stopped at its initial position. The predetermined value is greater than the maximum speed at which the table 202 is intermittently rotated for supplying the CCs 150. Thus, the table 202 is returned to its initial position as quickly as possible. However, the respective absolute values of the acceleration and deceleration of the table 202 during its returning rotation are smaller than those of the table during its intermittent rotations for supplying the CCs 150. During the returning rotation of the table 202, too, the bucket 400 and the reel holders 310 are delayed from the table 202 and the main portions 254 and, after the table 202 is stopped, the elements 400, 310 are returned to their reference phase relative to the table 202. Thus, the vibration of the CC supplying apparatus 12 is reduced.

In the PCB position-and-support device 22, the PCB support table 40 is returned to its original position and then is moved up to its uppermost position. After the PCB holding device (not shown) releases the PCB 20, the PCB carry-in and carry-out device (not shown) carries out the PCB 20 to the PCB carry-out device 26. After the carrying-out of the PCB 20, or concurrently with the carrying-out of the PCB 20, the carry-in device 24 and the carry-in and carry-out device cooperate with each other to carry in the next PCB 20, which is subsequently held by the PCB holding device so that CCs 150 may be mounted thereon.

As is apparent from the foregoing description, the connecting devices 312 allow the reel holders 310 as CC-holding portions of the CC feeders 200 to be delayed from the main portions 254 of the feeders 200, and the connecting members 330 of the connecting devices 312 have the function of causing the reel holders 310 to restore their reference phase relative to the main portions 254. In addition, the connecting devices 402 which connect the bucket 400 to the circular table 202 allow the bucket 400 to be delayed from the table 202, and the connecting members 416 of the connecting devices 402 have the function of causing the bucket 400 to restore its reference phase relative to the table 202. Thus, each of the connecting devices 402 provides not only a binder-attaching device which attaches the bucket 400 to the table 202, and but also an additional binder delay-and-return device. Thus, it can be said that the present CC supplying apparatus 12 is equipped with a second group of binder delay-and-return devices 402 in addition to the first group of binder delay-and-return devices 450.

In view of easier feeding of the CC carrier tape 242, it is preferable to employ a small angle as the maximum angle by which the bucket 400 and the reel holders 310 can be rotated relative to the circular table 202 and the main portions 254; and in view of easier reduction of the vibration of the CC supplying apparatus 12, it is preferable to employ a large angle as the maximum angle. Even though the maximum angle may not be greater than the angular pitch at which the table 202 is intermittently rotated, the vibration can be reduced to a considerable degree. However, it is preferable to employ, as the maximum angle, an angle greater than the angular pitch, and it is most preferable to employ an angle greater than twice the angular pitch.

Referring next to FIGS. 14 to 18, there will be described a second embodiment of the present invention, which also relates to a CC mounting system. However, the present CC mounting system 598 includes a CC supplying apparatus 600 in place of the CC supplying apparatus 12 employed in the CC mounting system 8, shown in FIG. 1, as the first embodiment.. The same reference numerals as used in the first embodiment are used to designate the corresponding elements and parts of the second embodiment, and the description thereof is omitted.

The present CC supplying apparatus 600 includes, as one or more rotary tables, two sectorial tables 602, 604 in place of the full-circular table 202 employed in the CC supplying apparatus 12. A plurality of CC feeders 200 are detachably attached to each of the two sectorial tables 602, 604. The two sectorial tables 602, 604 have the same central angle which is, in the present embodiment, smaller than 120 degrees.

Figure 14:
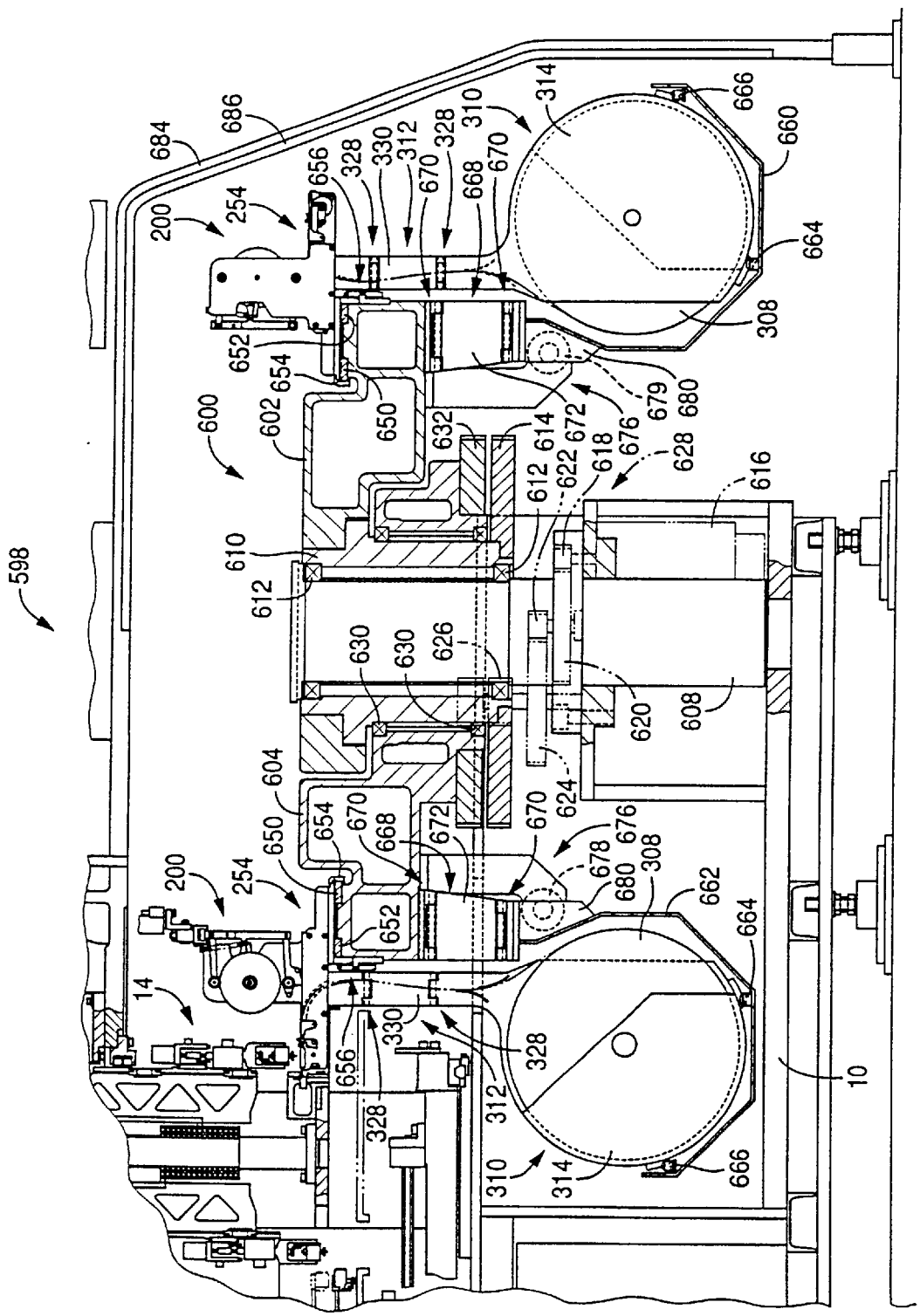
FIG. 14 is a partly cross-sectioned, side elevation view of another CC mounting system including a different rotary-type CC supplying apparatus to which the present invention is also applied.

As shown in FIG. 14, a support shaft 608 is fixed to a base member 10 such that the support shaft 608 vertically extends, and a sleeve 610 is attached via bearings 612 to the support shaft 608 such that the sleeve 610 is rotatable about a vertical axis line and is not movable in an axial direction of the shaft 608. One 602 of the two sectorial tables 602, 604 is fixed to an upper portion of the sleeve 610 such that the table 602 is concentric with the sleeve 610. A driven gear 614 is fixed to a lower end portion of the sleeve 610, and the rotation of a first table-rotating servomotor 616 is transmitted to the driven gear 614 via a series of gears 618, 620, 622, 624, 626 while the speed of the rotation is reduced by the gears 618–626. Thus, the sectorial table 602 can be rotated to any desired angular position at any desired angular speed. The servomotor 616, the driven gear 614, and the gears 618–626 cooperate with a control device 690 shown in FIG. 16 to provide a first independent table-driving device 628.

Figure 15:
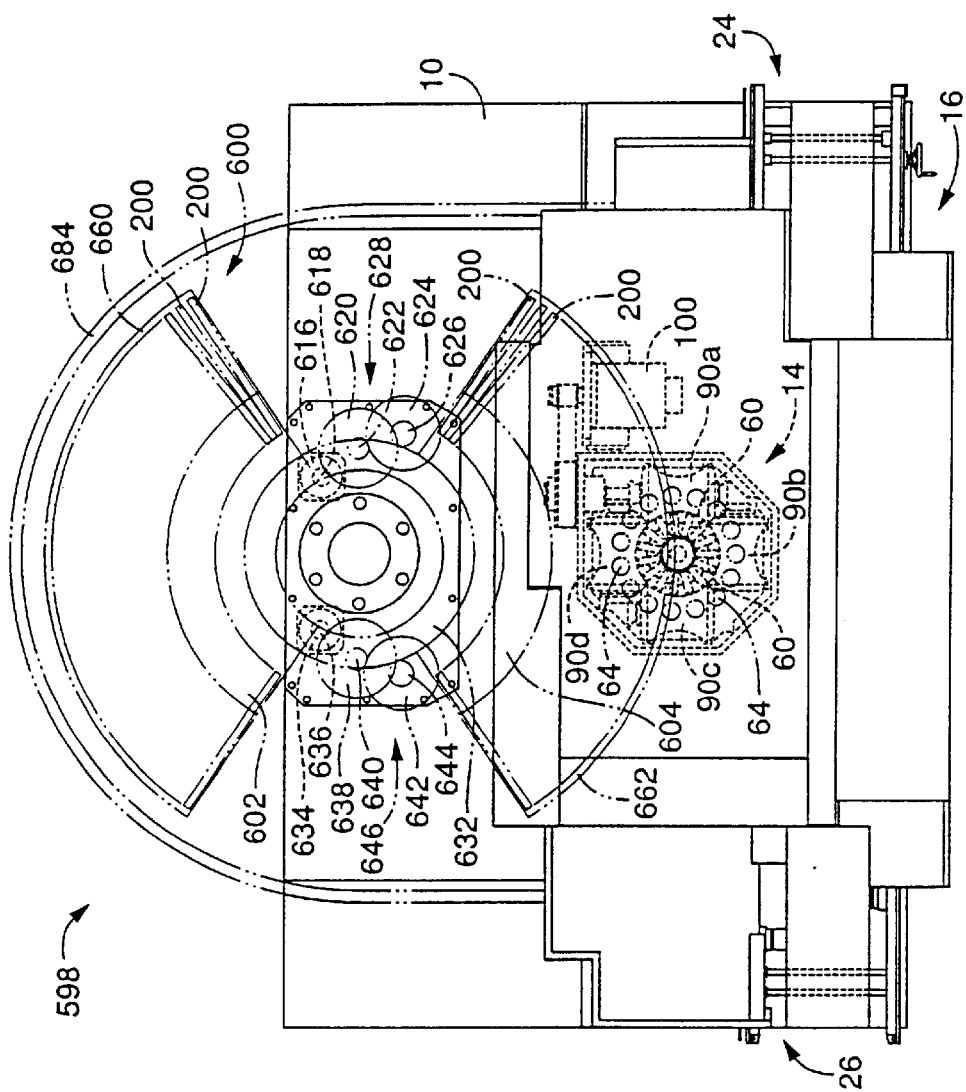
FIG. 15 is a plan view of the CC mounting system of FIG. 14.

The other sectorial table 604 is attached via bearings 630 to a portion of the sleeve 610 which is below another portion thereof to which the first sectorial table 602 is fixed, such that the second table 604 is rotatable about a vertical axis line and is not movable in the axial direction of the support shaft 608. A driven gear 632 is fixed to a lower end portion of the sectorial table 604 and, as shown in FIG. 15, the rotation of a second table-rotating servomotor 634 is transmitted to the driven gear 632 via a series of gears 636, 638, 640, 642, 644 while the speed of the rotation is reduced by the gears 636–644. Thus, the sectorial table 604 can be rotated to any desired angular position at any desired angular speed. The servomotor 634, the driven gear 632, and the gears 636–644 cooperate with the control device 690 to provide a second independent table-driving device 649. Thus, the two sectorial tables 602, 604 are independently driven or rotated by the two exclusive driving devices 628, 646, respectively.

Each of the two sectorial tables 602, 604 has an inner and an outer part-annular positioning plate 650, 652 fixed thereto, and a part-annular stopper plate 654 fixed thereto. Each of the two positioning plates 650, 652 has a plurality of positioning radial grooves, and the stopper plate 654 has an inclined engaging surface. In addition, each sectorial table 602, 604 is equipped with a plurality of engaging devices 656 which are disposed at a plurality of positions corresponding to a plurality of locations where the plurality of CC feeders 200 are attached. The engaging devices 656 have the same construction as that of the engaging devices 384 employed in the first embodiment, and the CC feeders 200 are held by the sectorial tables 602, 604 in the same manner as that employed in the first embodiment. Thus, a main portion 254 (or a main member 250) of each of the feeders 200 is positioned relative to the table 602, 604 in a widthwise and a lengthwise direction of the feeder 200, and is prevented from jumping off the table 602, 604. A reel holder 310 of each feeder 200 is pendent downward from a middle portion of the main member 250 of the feeder 200.

The respective reel holders 310 of the CC feeders 200 attached to the first sectorial table 602 are accommodated in, and engaged with, a first part-annular bucket 660 which is attached to the first table 602, and the respective reel holders 310 of the CC feeders 200 attached to the second sectorial table 604 are accommodated in, and engaged with, a second part-annular bucket 662 which is attached to the second table 604. Each of the two buckets 660, 662 has a shape like a container which opens upward, and has an inner and an outer part-annular engaging member 664, 666 fixed thereto. Each of the two engaging members 664, 666 has a plurality of radial engaging grooves. Each of the two buckets 660, 662 is connected to a corresponding one of the two tables 602, 604 by three connecting devices 668, such that each bucket 660, 662 is rotatable relative to the corresponding table 602, 604. The connecting devices 668 have the same construction as that of the connecting devices 402 employed in the first embodiment, and each connecting device 668 includes two hinge devices 670 and two connecting members 672.

Each of the sectorial tables 602, 604 is equipped with two binder delay-and-return devices 676 which have the same construction as that of the binder delay-and-return devices 450 employed in the first embodiment. Each device 676 includes two commercially available shock absorbers 678, 679 which are provided on both sides of an engaging portion 680 of the corresponding bucket 660, 662, respectively, such that the two absorbers 678, 679 are opposed to each other. Each engaging portion 690 extends in a plane perpendicular to the direction of rotation of the corresponding table 602, 604.

Each of the sectorial tables 602, 604 can be intermittently rotated at a regular angular pitch which is equal to an angle obtained by dividing the central angle of the table 602, 604 by the maximum number of the CC feeders 200 that can be attached to the table 602, 604. In this case, respective CC-supply portions of the CC feeders 200 attached to the table 602, 604 are sequentially positioned at a CC supplying position where each feeder 200 supplies one or more CCs 150 to a CC mounting device 14. Each table 602, 604 can also be rotated over to return to its initial position where the table 602, 604 starts its CC supplying operation. Moreover, each table 602, 604 can be rotated to move to a waiting area which will be described later. When each table 602, 604 is rotated in each of the above-indicated cases, the table 602, 604 is first smoothly accelerated and then smoothly decelerated. Accordingly, the bucket 660, 662 and the reel holders 310 accommodated therein are delayed from the corresponding table 602, 604 and the corresponding main portions 254, respectively, and are rotated at lower acceleration and deceleration than those of the table 602, 604 and the devices 254, so as to follow the table 602, 604 and the devices 254. Thus, the present CC supplying apparatus 600 produces only small vibration for the same reason as that described above with respect to the first embodiment.

The CC supplying apparatus 600 has a cover member 684 which is equipped with a window 686 which can be opened and closed. Since the window 686 is not locked even in an automatic operation, an operator can manually open and close the window 686. The CC supplying apparatus 600 is equipped with two shutter devices (not shown) which cooperate with each other to divide an operating area from the waiting area. Thus, the operator is prevented from contacting one sectorial table 602, 604 which is operating in the operating area. As described later, the CC supplying apparatus 600 may be operated in such a manner that the two sectorial tables 602, 604 alternately supply the CCs 150 to the CC mounting device 14. In this manner, one sectorial table 602, 604 which does not supply the CCs 150 waits in the waiting area. The waiting area is opposite to the operating area including the CC supplying position, with respect to the support shaft 608. The waiting area occupies a space corresponding to just one sectorial table 602, 604. The waiting area functions as a non-operating area in which the table 602, 604 does not operate. The operating area occupies a sufficiently large space which allows each table 602, 604 to rotate or move therein for sequentially positioning all the feeders 200 attached to the table 602, 604 at the CC supplying position for supplying the CCs 150 to the CC mounting device 14. Thus, the operating area functions as a CC supplying area. Since the central angle of each table 602, 604 is smaller than 120 degrees, one table 602, 604 which operates in the operating area does not interfere with the other table 604, 602 which waits in the waiting area, even if the one table 602, 604 is rotated or moved from its CC-supply starting position to its CC-supply ending position.

Each of the two shutter devices (not shown) includes a shutter member which is movable up and down. The two shutter members are provided at two radial boundaries between the waiting area and the operating area, and an elevating and lowering device (not shown) moves the shutter members up to their retracted position where the shutter members are positioned above the sectorial tables 602, 604 and down to their closing position where the shutter members are positioned adjacent to the CC feeders 200 attached to one table 602, 604 waiting in the waiting area.

Figure 16:
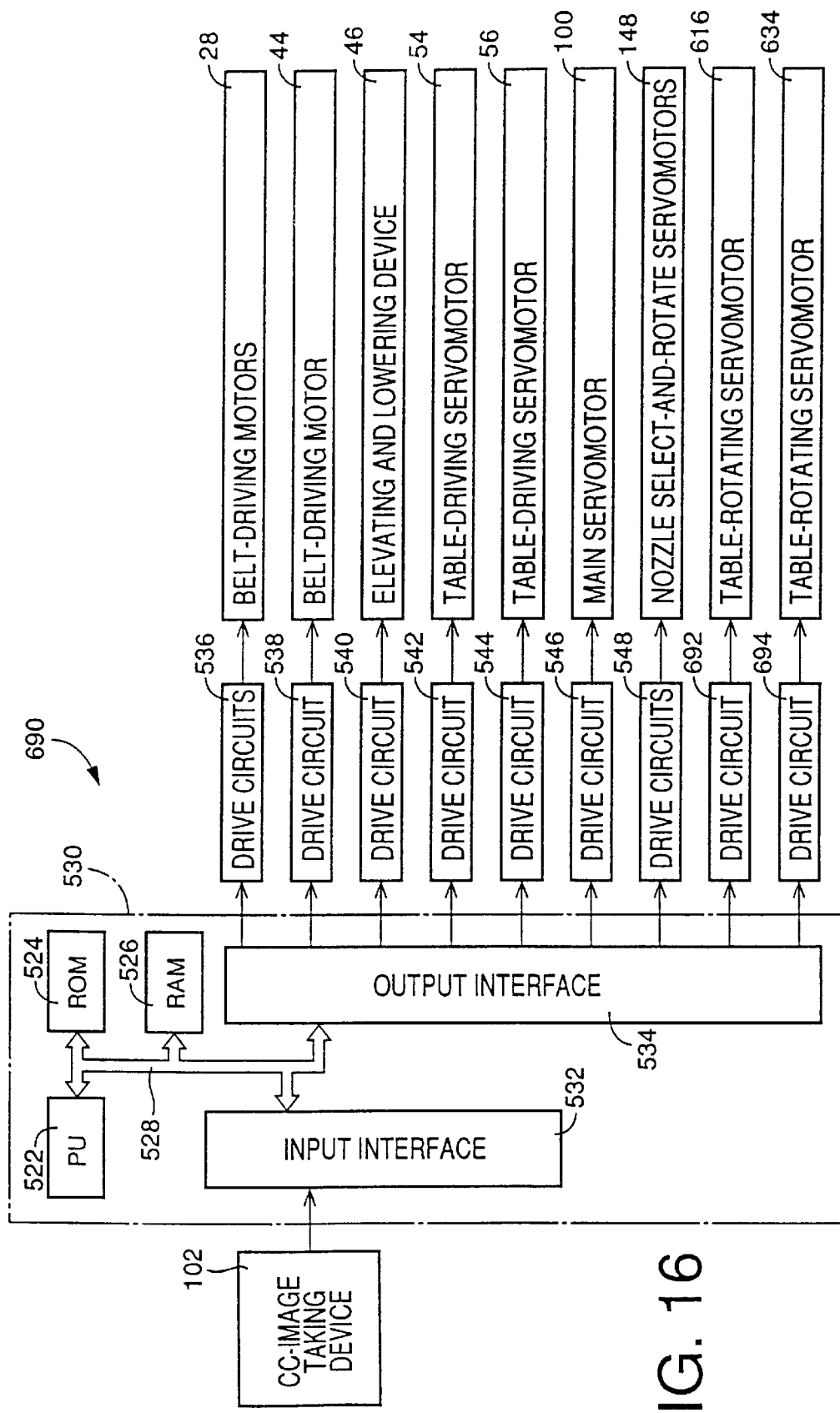
FIG. 16 is a diagrammatic view of a relevant portion of a control device of the CC mounting system of FIG. 14.

The present CC mounting system 598 including the CC supplying apparatus 600 is controlled by the control device 690 shown in FIG. 16. The control device 690 is essentially provided by a computer, like the control device 520 employed in the first embodiment. The control device 690 includes an output interface 534 to which the two table-rotating servomotors 616, 634 are connected via respective drive circuits 692, 694. A ROM 524 of the control device 690 stores various control programs which are needed for carrying out a CC mounting operation, in particular, three CC-supply modes which will be described later.

The table-rotating servomotors 616, 634 which are employed as drive sources are electric motors which can be controlled with respect to rotation angle, that is, can be rotated by any desired angle. The servomotors 616, 634 may be replaced by stepper motors.

The CC supplying apparatus 600 supplies the CCs 150 in a selected one of three operation modes, that is, a concurrent-table mode, a same-sort-PCB alternate-table mode, and a different-sort-PCB alternate-table mode.

Figure 17:
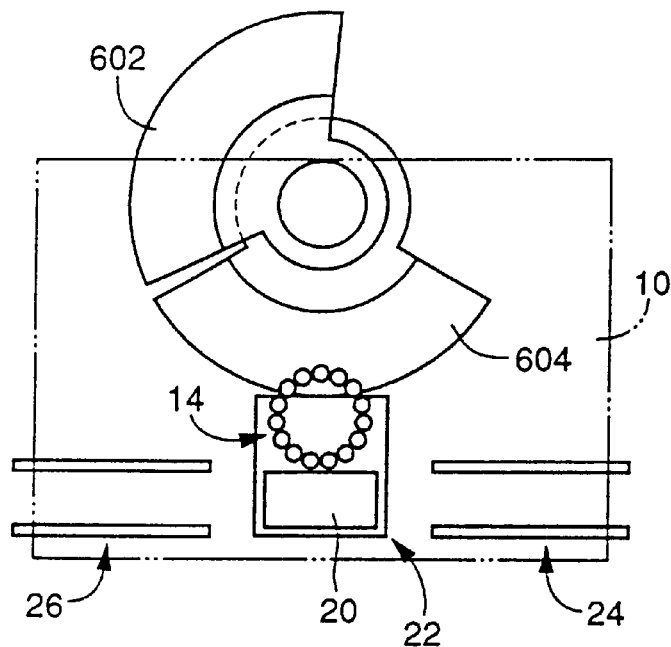
FIG. 17 is a view illustrating one of three CC-supply modes of the CC supplying apparatus of FIG. 14.

In the concurrent-table mode illustrated in FIG. 17, the two sectorial tables 602, 604 are rotated concurrently with each other. This operation mode is suitable for the case where it is needed to supply many sorts of CCs 150 the number of which is greater than the maximum number of the CC feeders 200 that can be attached to one table 602, 604.

Figure 18:
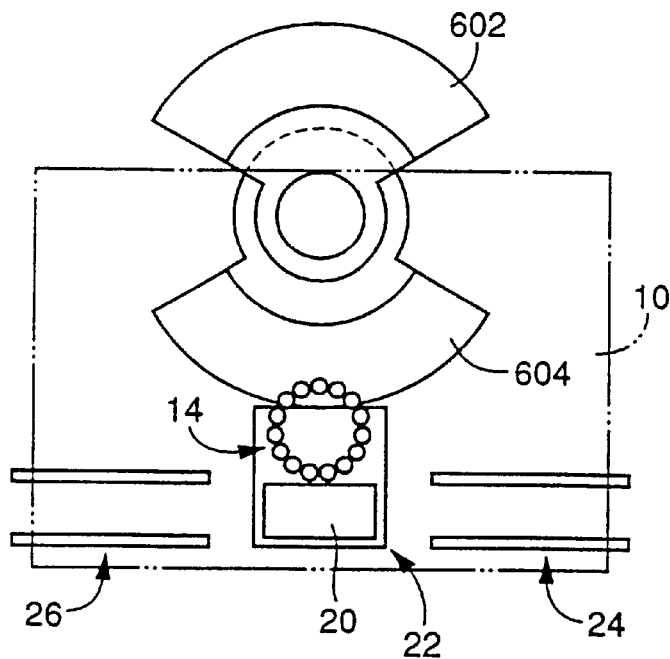
FIG. 18 is a view illustrating the other two CC-supply modes of the CC supplying apparatus of FIG. 14.

In the same-sort-PCB alternate-table mode illustrated in FIG. 18, the two sectorial tables 602, 604 carries the same sorts of CC feeders 200, and one table 602, 604 operates as the operating table in the operating area for supplying the CCs 150 while the other table 604, 602 waits as the waiting table in the waiting area. When it is needed to change the operating and waiting tables with each other, for example, when the CC carrier tapes 242 have been consumed by the operating table and accordingly it is needed to supply the operating table with new CC carrier tapes 242, the waiting table is moved to the operating area so as to operate as the operating table for supplying the CCs 150, and the operating table is moved to the waiting area so as to wait as the waiting table to which the operator supplies the new carrier tapes.

In the different-sort-PCB alternate-table mode also illustrated in FIG. 18, one sectorial table 602, 604 operates as the operating table in the operating area for supplying the CCs 150 while the other sectorial table 604, 602 waits as the waiting table in the waiting area, and the two tables 602, 604 alternately supply the CCs 150 to the CC mounting device 14. However, the sorts of the CC feeders 200 carried on one table 602, 604 are different from those of the feeders 200 carried on the other table 604, 602. When the CC mounting system 598 first mounts CCs 150 on PCBs 20 of a certain sort and then mounts CCs 150 on PCBs 20 of a different sort, the operating and waiting tables are changed with each other, so that the waiting table is moved to the operating area so as to operate as the operating table for supplying the CCs 150 and the operating table is moved to the waiting area so as to wait as the waiting table on which the operator may change one or more of the feeders 200 attached thereto with a new feeder or feeders 200 suitable for the different sort of PCBs 20.

Next, there will be described each of the three operation modes in more detail.

When the CC supplying apparatus 600 supplies the CCs 150 in the concurrent-table mode, the two sectorial tables 602, 604 are rotated concurrently with each other. One of the two tables 602, 604 which is currently supplying the CCs 150 is rotated at so controlled acceleration and deceleration as to position each CC feeder 200 at the CC supplying position at an appropriate timing relative to the arrival of each CC-holding head 64 at a CC sucking position of the CC mounting device 14. When the preceding one of the two tables 602, 604 supplies the CCs 150, the following table 604, 602 is rotated at lower acceleration and deceleration than those of the preceding table 602, 604. In the present operation manner, the two tables 602, 604 are rotated concurrently with each other, and accordingly a great inertia is applied to the CC supplying apparatus 600. However, since the two tables are rotated at different accelerations and decelerations, the generation of vibration can be small. The two tables 602, 604 are not completely separated from each other, because the following table can catch up with the preceding table while the preceding table is kept stopped for each feeder 200 to supply a CC 150. When the preceding table is rotated in the reverse direction for some reason, the following table is also rotated in the reverse direction at the same acceleration and deceleration as those of the preceding one. Thus, the two tables 602, 604 are prevented from colliding with each other.

After the CC feeders 200 carried on the preceding sectorial table 602, 604 have finished supplying the CCs 150, the feeders 200 on the following table starts supplying the CCs 150. When the two tables 602, 604 are changed with each other, the following one is rotated at the same acceleration and deceleration as those of the preceding one, so that one feeder 200 which first supplies one or more CCs 150 is quickly positioned at the CC supplying position. The preceding table which has finished supplying the CCs 150 is moved to a waiting area which is the same as used in each of the two alternate-table modes, and waits for the following table to finish supplying the CCs 150. In the concurrent-table mode, the respective shutter members of the two shutter devices are kept opened or retracted.

After the following table has finished supplying the CCs 150, the two tables 602, 604 are moved to their initial position where one of the CC feeders 200 on the preceding table which first supplies one or more CCs 150 is positioned at the CC supplying position, so that the two tables 602, 604 supplies CCs 150 which are to be mounted on another PCB 20. When the two tables 602, 604 are returned to their initial position, the tables 602, 604 are rotated in the same direction as that in which the tables are rotated for supplying the CCs 150.

The control device 590 counts the number of the CCs 150 supplied by each of the CC feeders 200 on each of the two sectorial tables 602, 604 and, if the counted number has reached a reference number indicating that the CC carrier tape 242 being fed by that feeder 200 will soon be completely consumed, the control device 590 generates a CC-supply command signal to command the CC supplying apparatus 600 to move the table 602, 604 carrying that feeder 200 to the waiting area, so that the operator may supply that feeder 200 with a new carrier tape 242. A portion of the control device 590 which counts the number of the CCs 150 supplied by each feeder 200 and judges whether the counted number has reached the reference number provides judging means for judging whether all the CCs 150 have been consumed; and a portion of the control device 590 which generates the CC-supply command signal provides generating means for generating the CC-supply command signal. Alternatively, the complete consumption of the CCs 150 on each feeder 200 may be detected by means for detecting the number of marks which are fixed to each CC carrier tape 242. The operator must not supply each feeder 200 with a new CC carrier tape 242, before the CC supplying apparatus 600 has supplied all the CCs 150 to be mounted on one PCB 20.

When the control device 590 rotates the table 602, 604 to the waiting area where the table 602, 604 is supplied with a new CC carrier tape 242 from the operator, the control device 590 selects one of opposite directions such that the angle of rotation of the table to the waiting area in the selected direction is smaller than that in the other direction. After the table 602, 604 is moved to the waiting area, the operator opens the window 686 and changes one or more feeders 200 whose carrier tape or tapes 242 has or have been completely consumed, with a feeder or feeders 200 which feeds or feed a new CC carrier tape or tapes 242. After the changing of the feeders 200, the window 486 is closed. When a start button is operated, the CC supplying apparatus 600 resumes the CC supplying operation. The operator can manually rotate the table 602, 604 to an appropriate angular position where he or she can easily change the used feeders 200 with new feeders 200.

In the case where one or more CC feeders 200 on one sectorial table 602 and one or more CC feeders 200 on the other sectorial table 604 simultaneously need the supply of new CC carrier tapes 242, the operator can simultaneously change all the used feeders 200 with new feeders 200. When one or more feeders 200 on the preceding table 602, 604 need the supply of new carrier tapes 242, the operator can change, on the preceding table 602, 604 only, the used feeders 200 with new feeders 200. If one or more feeders 200 on the following table 604, 602 generate the CC-supply command signals in addition to one or more feeders 200 on the preceding feeder 602, 604, the operator can change, on the following table 604, 602 as well, the used feeders 200 with new feeders 200.

When the CC supplying apparatus 600 is operated in the same-sort-PCB alternate-table mode, the two sectorial tables 602, 604 alternately supply the CCs 150. While one table 602, 604 supplies the CCs 150, the other table 604, 602 waits in the waiting area. Accordingly, while the operating table 602, 604 supplies the CCs 150, the operator can change, on the waiting table 604, 602, one or more used feeders 200 with new feeders 200. Since the window 686 is not locked while one table 602, 604 supplies the CCs 150, the operator can open the window 686. Since the two shutter members are held closed, the operator who can see the boundaries between the waiting and operating areas can prevent himself or herself from contacting the operating table 602, 604.

When one or more CC feeders 200 on the operating table 602, 604 need the supply of new CC carrier tapes 242, the feeders 200 generate the CC-supply command signals to the control device 590, which changes the operating and waiting tables 602, 604 with each other. This table change occurs after all the CCs 150 to be supplied to one PCB 20 are actually supplied. If the change of one or more feeders 200 is going on in the waiting area when one or more CC-supply command signals are generated, the control device 590 stops the CC mounting operation of the CC mounting system 598. When the operator operates the start button after finishing the feeder change and closing the window 686, the control device 590 changes the waiting and operating tables 604, 602 with each other, and resumes the CC supplying and mounting operations. In addition, the operator changes, on the waiting table, the used feeders 200 with new feeders 200.

Since the two shutter members are held opened, the table change is allowed. After the table change, the shutter members are closed.

If the change of one or more CC feeders 200 has already been finished in the waiting area when one or more CC-supply signals are generated, the control device 590 immediately opens the shutter members and changes the operating and waiting tables 602, 604 with each other.

When the CC supplying apparatus 600 is operated in the different-sort-PCB alternate-table mode, one of the two sectorial tables 602, 604 supplies the CCs 150 in the operating area, while the other table 604, 602 waits in the waiting area where the operator may change one or more CC feeders 200 with one or more different feeders 200 which are suitable for the sort of the PCBs 20 to be used next. When one or more feeders 200 on the operating table 602, 604 needs the supply of new CC carrier tapes, the operating table is moved to the waiting area where the used feeders 200 are changed with new feeders 200. If the change of one or more feeders 200 is going on on the waiting table 604, 602, the feeder change is interrupted.

After the window 686 is closed, the shutter members are opened. The waiting table 602, 604 is moved to the operating area, and the operating table 604, 602 is moved to the waiting area. After the window 686 is opened, the used feeders 200 on the operating table 604, 602 are changed with new feeders 200. When the window 686 is closed after the feeder change, the operating table 604, 602 is moved to the operating area to resume the CC supplying operation. Concurrently, the waiting table 602, 604 is moved to the waiting area, and the shutter members are closed. In the case where the feeder change has been interrupted on the waiting table 602, 604, the feeder change is resumed.

When the current sort of PCBs 20 are changed to a different sort of PCBs 20, the shutter members are opened, and the operating and waiting tables 602, 604 are changed with each other, so that the waiting table 604, 602 is changed to the operating table 604, 602 to supply CCs 150 and the operating table 602, 604 is changed to the waiting table 602, 604 on which one or more feeders 200 are changed, as needed.

As is apparent from the foregoing description, in the present embodiment, a portion of the control device 590 which concurrently rotates and stops the two sectorial tables 602, 604 and sequentially positions the CC feeders 200 held by the tables 602, 604, at the CC supplying position, provides concurrent-table-mode control means; and a portion of the control device 590 which controls the following table 602, 604 to follow the preceding table 604, 602 at acceleration and deceleration lower than those of the preceding table, provides slow-following control means. In addition, a portion of the control device 590 which controls one of the two sectorial tables 602, 604 to operate as the operating table and controls the other table 604, 602 to wait in the waiting area and which changes the operating and waiting tables 602, 604 with each other, as needed, provides alternate-table-mode control means. The alternate-table-mode control means functions as not only means for changing the operating and waiting tables 602, 604 with each other, depending on the sort of the PCB 20 to be used next, but also means for changing the operating and waiting tables 602, 604 with each other, in response to a signal indicating that one or more feeders 200 on the operating table need the supply of new CC carrier tapes 242.

When the CC supplying apparatus 600 is operated in the concurrent-table mode in the case where the sum of respective central angles of the two sectorial tables 602, 604 is smaller than 180 degrees, it is possible that after the preceding table finishes supplying the CCs 150, the preceding table be moved to an area between the CC supplying position and its opposite position remote by 180 degrees therefrom in the direction of rotation of the two tables 602, 604 for supplying the CCs 150. In this case, after the following table finished supplying the CCs 150, the two tables 602, 604 may be returned to their initial position by being rotated in the reverse direction opposite to the direction of rotation thereof for supplying the CCs 150.

In each of the first and second embodiments, the guide members 350, 352 which guide the CC carrier tape 242 are provided by the curved plate-like members. Accordingly, the carrier tape 242 is fed forward while being guided by the guide members 350, 352 in such a manner that the widthwise direction of the tape 242 is substantially parallel to the direction in which the main portion 254 and the reel holder 310 are moved relative to each other. However, it is possible that the portion of the carrier tape 242 which corresponds to the connecting device 312 be fed forward in such a manner that the widthwise direction of that portion is substantially perpendicular to the above-indicated direction.

Figure 19:
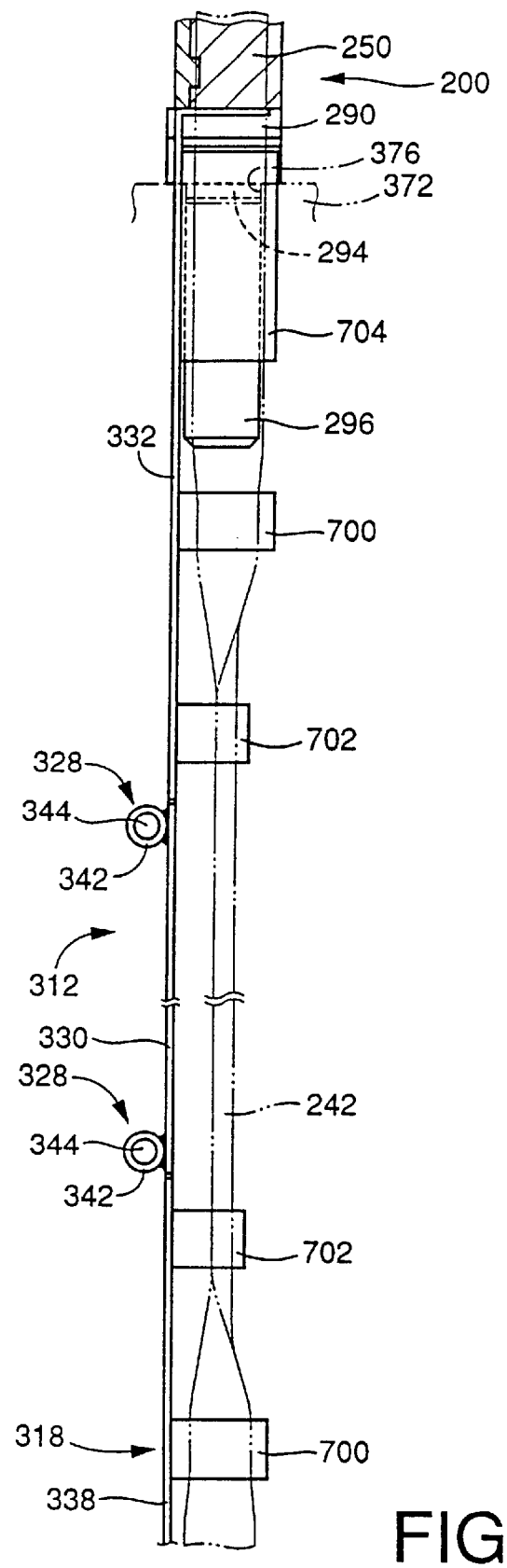
FIG. 19 is a front elevation view of tape guide members employed in a CC feeder employed in another rotary-type CC supplying apparatus as a third embodiment of the present invention.
Figure 20:
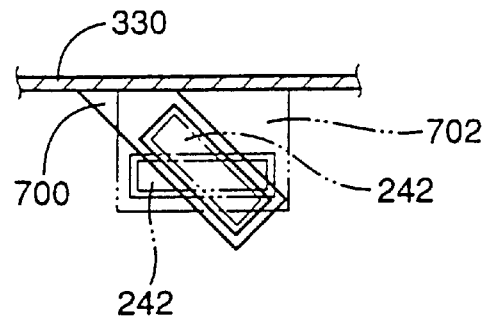
FIG. 20 is a plan view of one of the guide members of FIG. 19.

In this connection, FIGS. 19 and 20 shows a third embodiment of the present invention, which relates to a CC supplying apparatus including a CC feeder 200 which is equipped with two guide members 700 in place of the guide members 350, 352 employed in the preceding embodiments. One of the two guide members 700 is fixed to an upper projection 338 of a side wall 318 of a reel holder 310, and the other guide member 700 is fixed to a support member 332 fixed to a lower surface of a main member 250 of the feeder 200. Each of the two guide members 700 has a flat through-hole formed through the thickness thereof, and is fixed to the member 338 or 332 such that the flat through-hole is inclined by 45 degrees with respect to the plane of a connecting member or plate 330, as shown in FIG. 20. The dimensions of the flat through-hole permit the CC carrier tape 242 to pass therethrough but do not permit the tape 242 to be turned upside down therein. The CC feeder 200 is additionally equipped with two second guide members 702 one of which is fixed to a portion of the upper projection 338 above the lower guide member 700 and the other of which is fixed to a portion of the support member 332 below the upper guide member 700. Each of the two guide members 702 has a flat through-hole formed through the thickness thereof, and is fixed to the member 338 or 332 such that the flat through-hole extends parallel to the plane of the connecting plate 330, as shown in FIG. 20. The dimensions of the flat through-hole permit the CC carrier tape 242 to pass therethrough but do not permit the tape 242 to be turned upside down therein. A third guide member 704 which is provided by a curved plate-like member is fixed to the support member 332.

The through-holes of the guide members 700, 702 have a length (i.e., dimension in a direction parallel to the axis line of a rotary table 202, 602, 604) which assures that at least one CC-accommodating pocket of the embossed-type CC carrier tape 242 is always present in each through hole.

The operator draws the CC carrier tape 242 from the tape reel 308 and introduces the tape 242 into the main member 250 via the guide members 700, 702. When the carrier tape 242 is passed through the lower first guide member 700, the tape 242 is twisted by 45 degrees; and when the tape 242 is passed through the lower second guide member 702, the tape 242 is further twisted by 45 degrees in the same direction. Thus, the tape 242 is twisted by 90 degrees in total. Between the two second guide members 702, the tape 242 is fed forward with being twisted by the 90 degrees. When tape 242 is passed through the upper first guide member 700, the tape 242 is twisted back by 45 degrees; and when the tape 242 is passed through the third guide member 704, the tape 242 is further twisted back by 45 degrees in the same direction. Thus, the tape 242 is twisted back by 90 degrees in total.

In this way, the portion of the CC carrier tape 242 which is located between the main portion 254 and the tape reel 308 of the CC feeder 200 and which is bent substantially along the connecting member 330 when the reel holder 310 is moved relative to the main portion 254, takes an attitude that the widthwise direction of that portion is perpendicular to the direction in which the holder 310 is moved relative to the main portion 254. Accordingly, when the holder 310 is moved relative to the main portion 254, the tape 242 is easily bent substantially along the connecting member 330. Thus, the tape 242 can be smoothly fed forward while the holder 310 is moved relative to the main portion 254. In addition, the tape 242 is effectively prevented from being interfered with by the connecting device 312 of each of two adjacent CC feeders 200.

In each of the illustrated embodiments, each binder delaying and returning device 450, 676 is provided by the two shock absorbers 452 and 454, or 678 and 679, which are opposed to each other. The two shock absorbers may be replaced by a single shock absorber 720 as a binder delaying and returning device shown in FIG. 21.

The shock absorber 720 includes a piston 726 which is liquid-tightly and slideably fit in a cylindrical bore 724 of a housing 722 fixed to a rotary table 202, 602, 604. Two piston rods 728, 730 project from the piston 726 in opposite directions, respectively, so that the two piston rods 728, 730 project outward from the housing 722. The second piston rod 730 is fixed to an engagement portion 456 of a bucket 400, 660, 662. A first and a second liquid chamber 732, 734 are provided on both sides of the piston 726, respectively, and a first and a second compression coil spring 736, 738 each as an elastic member as a biasing device are provided in the first and second liquid chambers 732, 734, respectively. The two springs 732, 734 are identical with each other. The piston 726 has a passage 740 which communicates or connects between the first and second fluid chambers 732, 734, and a restrictor 742 provided in the passage 740.

Figure 21:
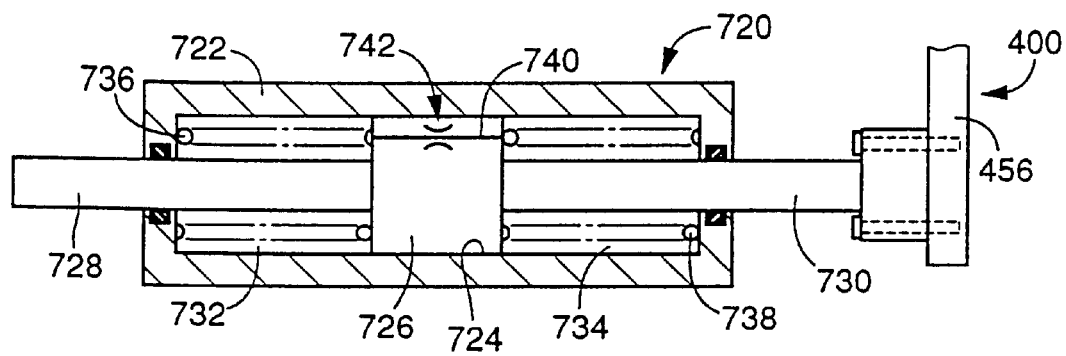
FIG. 21 is a partly cross-sectioned, schematic front elevation view of a binder delay-and-return device employed in another rotary-type CC supplying apparatus as a fourth embodiment of the present invention.

When the rotary table 202, 602, 604 is rotated, for example, when the table is rotated rightward in FIG. 21, the housing 722 is moved with the table, so that the piston 726 is moved leftward relative to the housing 722 while compressing the first spring 736. Simultaneously, the second spring 738 is expanded, so that the bucket and the reel holders 310 of the CC feeders 200 bounded thereby are delayed from the table and the main portions 254 of the feeders 200.

When the inertial force to delay the bucket 400, 660, 662 and the reel holders 310 from the rotary table 202, 602, 604 and the main portions 254 is balanced by the biasing force of the first spring 736, the bucket is rotated, because of the biasing force of the first spring 736, in a direction to follow the rotary table. The movement of the piston 726 relative to the housing 722 is permitted since the liquid (e.g., oil) flows from the first chamber 732 into the second chamber 734. However, since the flowing of the liquid is restricted or resisted by the restrictor 742, the bucket is rotated at a speed lower than that of the table. That is, the bucket is moved at an acceleration and a deceleration lower than an acceleration and a deceleration at which the table is moved. This arrangement contributes to reducing the vibration which is generated when the bucket follows the table.

When the rotary table 202, 602, 604 is rotated in the opposite direction, i.e., leftward in FIG. 21, the second spring 738 is compressed, and the bucket 400, 660, 662 is moved by the biasing force of the spring 738 to follow the table while the acceleration and deceleration of the bucket are decreased by the effect of the restrictor 742.

Figure 22:
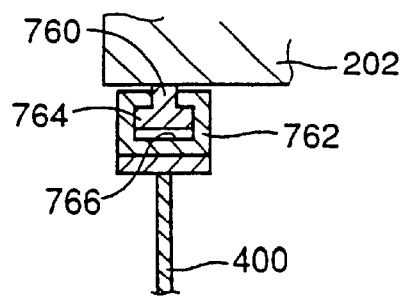
FIG. 22 is a cross-sectioned, schematic front elevation view of a binder-attaching device which attaches a bucket as a binder to a circular table in another rotation-type CC supplying apparatus as a fifth embodiment of the present invention.

In the first embodiment, the bucket 400 is connected to the circular table 202 by the binder-connecting devices 402, each of which includes the two hinge devices 414, such that the bucket 400 is rotatable relative to the table 202. However, the binder-connecting devices 402 may be replaced by two guide members 760, 762, shown in FIG. 22, which are fixed to a circular table 202 and a bucket 400, respectively, and which are engaged with each other such that the two guide members 760, 762 are rotatable relative to each other.

The first guide member 760 is provided by an annular member having a T-shaped cross section, and includes an engagement projection 764. The first guide member 760 is concentrically fixed to a lower surface of the circular table 202. The second guide member 762 is also provided by an annular member having an engagement groove 766 with a T-shaped cross section. The engagement projection 764 is engaged with the engagement groove 766 such that the projection 764 is movable relative to the groove 768 in the circumferential direction of the circular table 202 and such that the projection 764 is not disengageable from the groove 768. The second guide member 762 is fixed to the bucket 400. When the circular table 202 is rotated, the two guide members 760, 762 are rotated relative to each other, so that the bucket 400 is rotated relative to the table 202.

Each of the two annular guide members 760, 762 may be replaced by a plurality of part-annular guide members which are fixed to a plurality of locations of a corresponding one of the table 202 and the bucket 400. Alternatively, only one of the two annular guide members 760, 762 may be provided by a plurality of part-annular guide members which are fixed to a plurality of locations of the table 202 or the bucket 400.

In the case where the binder-connecting device is provided by the two guide members 760, 762 as described above, a biasing device or member is employed for returning the reel-holding-portion binder or bucket 400 to its reference phase relative to the table 202. In addition, a damping device or member may be employed.

In the first or second embodiment, when the rotary table 202, 602, 604 is rotated, the entirety of the reel-holding portion 310 of each CC feeder 200 is parallel-translated relative to the main portion 254 of that feeder 200, in a direction substantially parallel to the direction of movement of the feeder 200 caused by the rotation of the table. However, in another embodiment shown in FIG. 23, each CC feeder 784 includes a reel holder 780 as a reel-holding portion which is connected to a main portion 782 of that feeder 784 such that the reel holder 780 is pivotable relative to the main portion 782 about an axis line perpendicular to the direction of movement of the feeder 784 caused by the rotation of a rotary table 202, 602, 604.

The reel holder 780 and the main portion 782 of each CC feeder 784 are identical with the reel holder 310 and the main portion 254 of each CC feeder 200. The main portion 782 is held by the rotary table (e.g., the sectorial table 602, 604). The reel holder 780 includes a reel container 786, and an axis member (not shown) which supports a reel 308 such that the reel 308 is rotatable about the axis member. The reel container 786 is connected to the main portion 782 via an axis member 788 such that the reel container 786 is pivotable relative to the main portion 782, about an axis line perpendicular to the direction of movement of the CC feeder 784.

The reel container 786 of each reel holder 780 has a pair of side surfaces 792 as respective outer surfaces of two side walls which cooperate with each other to support the axis member which supports the reel 308. A cushion member 794 is fixed to a lower end portion of each of the side surfaces 792. The cushion members 794 are formed of a foam material such as urethane foam. A rubber layer 796 as a material having a high friction coefficient is provided on the surface of each cushion member 794. The distance between each pair of adjacent reel containers 780 is prescribed such that in the state in which the reel holders 780 are not rotated relative to the main portions 782, a small clearance is left between the respective rubber layers 796 of the cushion members 794 of the adjacent reel holders 780.

Figure 23:
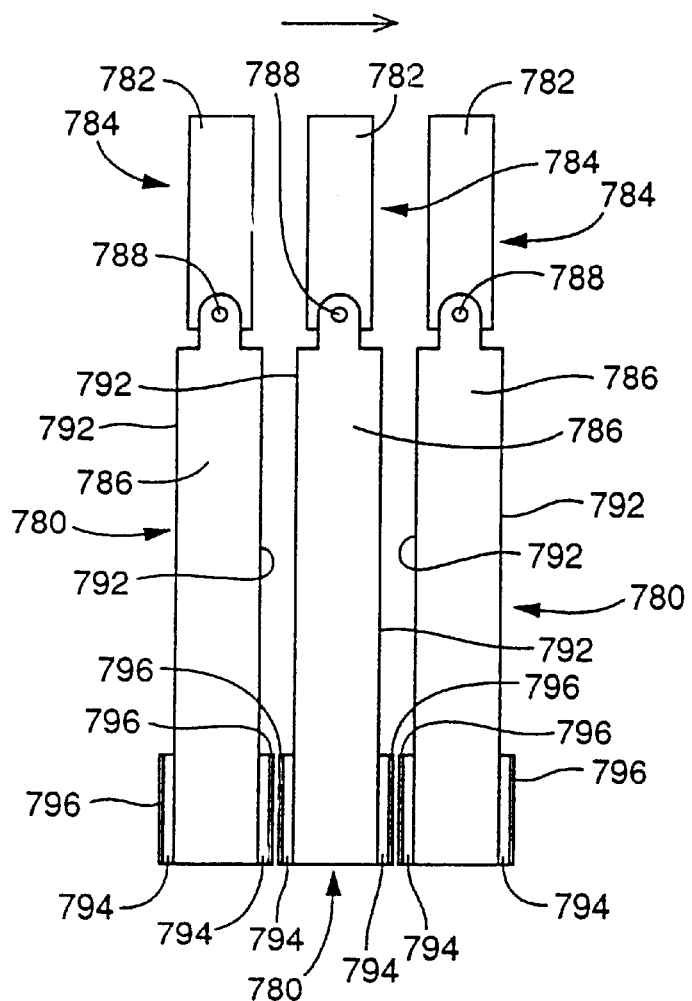
FIG. 23 is a side elevation view of CC feeders employed in another rotary-type CC supplying apparatus as a sixth embodiment of the present invention.
Figure 24:
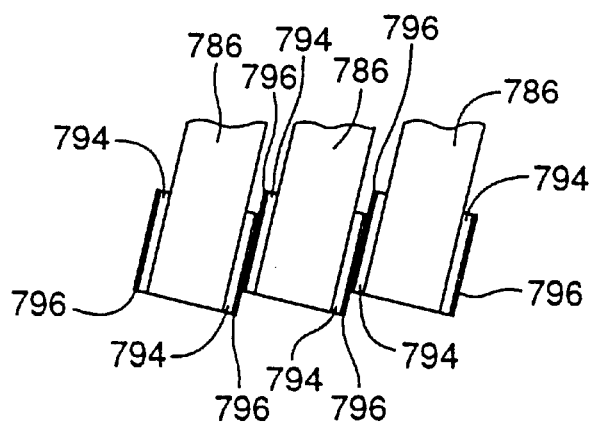
FIG. 24 is a side elevation view illustrating the state in which respective reel-holding portions of the CC feeders of FIG. 23 are pivoted relative to corresponding main portions of the feeders.

When the rotary table 202, 602, 604 is rotated and the main portions 782 are moved with the table in a direction indicated at arrow in FIG. 23, the reel holders 780 are delayed from the main portions 782, as shown in FIG. 24, because the holders 780 are pivoted about the axis members 788, respectively. The distance between each pair of adjacent reel holders 780 is decreased, and eventually the two reel holders 780 collide with each other. However, since the cushion members 794 are provided on the reel holders 780, only small sound is produced. When the reel holders 780 are further rotated, the cushion members 794 are compressed, the two reel holders 780 are moved relative to each other in a direction parallel to the side surfaces 792 thereof. Since, however, the two reel holders 780 are moved relative to each other while being held in contact with each other via the rubber layers 796, the swinging or vibration of the holders 780 is attenuated. When the reel holders 780 are pivoted relative to the main portions 782 while being delayed from the same 782, the reel holders 780 store a potential energy, which will cause themselves to return to their reference phase relative to the table. The sum of the respective dimensions of the reel holders 780 in the direction in which the respective component-supply portions of the CC feeders are arranged, increases when the rotary table is rotated. In the case where the rotary table is the sectorial table 602, 604, this increase is easily allowed; and in the case where the rotary table is the circular table, the increase is allowed if a sufficient clearance is provided between each pair of adjacent reel holders 780.

Also in the embodiment, shown in FIGS. 23 and 24, wherein the reel holder 780 is connected to the main portion 782 such that the reel holder 780 is pivotable relative to the main portion 782, it is possible that the respective reel holders 780 of the CC feeders 784 be bound by a reel-holder binder. For example, in an embodiment shown in FIGS. 25 to 27, each of CC feeders includes a reel holder 800, and the reel holder 800 includes a reel container 802. The reel container 802 has an end surface 804 which is remote from an axis line about which a rotary table 202, 602, 604 to which the CC feeders are attached is rotatable. An engagement pin 806 projects radially outward from the end surface 804 of the reel container 802 of each CC feeder. A circular or arcuate reel-holder binder 808 is engaged with the respective pins 806 of the CC feeders. Each pin 806 includes a large-diameter head portion 814 and a small-diameter shaft portion 812. The binder 808 has a predetermined thickness, does not have flexibility, and is formed of a rigid material. The binder 808 has, as engagement portions thereof, a plurality of U-shaped recesses 810 which are formed at a plurality of positions corresponding to the plurality of reel holders 800, respectively, and each of which opens in a lower surface of the binder 808. The recesses 810 of the binder 808 are engaged with the respective shaft portions 12 of the pins 806, such that the reel holders 800 are pivotable relative to the binder 808. The respective head portions 814 of the pins 806 prevent the binder 808 from coming off the corresponding shaft portions 812 of the pins 806 in respective radial directions parallel to respective axis lines of the pins 806.

Figure 27:
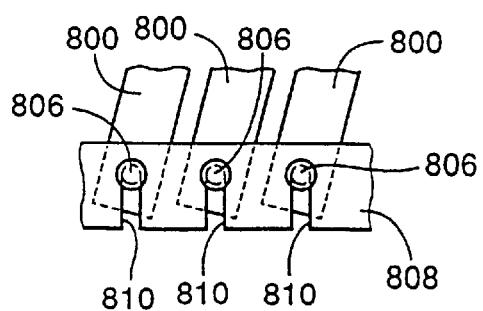
FIG. 27 is a side elevation view illustrating the state in which the reel-holding portions of the CC feeders of FIG. 25 are pivoted relative to corresponding main portions of the feeders.

Thus, a clearance is provided between each pair of adjacent reel holders 800. Those clearances are maintained even when the reel holders 800 are pivoted relative to corresponding main portions 816, respectively. When the rotary table 202, 602, 604 is rotated and the reel holders 800 are pivoted relative to the maim portions 816 about respective axis members 818, as shown in FIG. 27, each pair of adjacent reel holders 800 do not collide with each other. That is, the reel holders 800 are connected to each other by the binder 808, such that the holders 808 are prevented from swinging independent of each other and accordingly colliding with each other. Meanwhile, since the binder 808 and the reel holders 808 are slightly moved up when the holders 800 are pivoted relative to the main portions 816, the binder 808 and the holders 800 store a potential energy, which causes those elements 808, 800 to move back to their reference phase relative to the rotary table.

Figure 25:
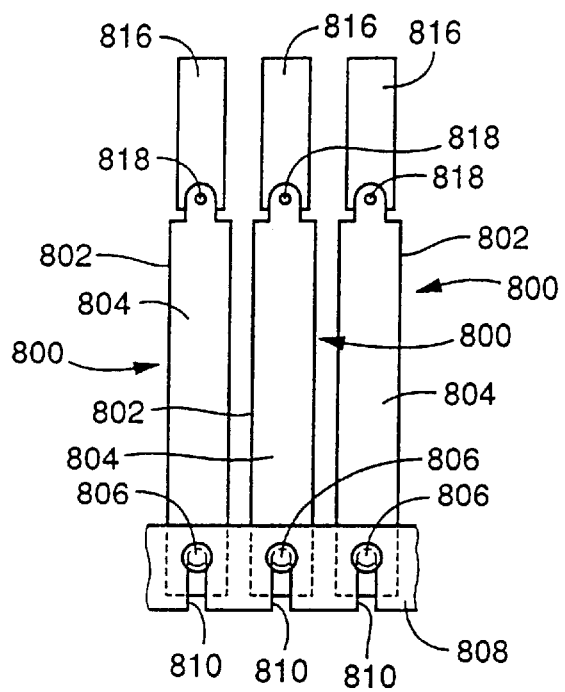
FIG. 25 is a side elevation view illustrating the state in which respective reel-holding portions of CC feeders employed in another rotary-type CC supplying apparatus as a seventh embodiment of the present invention are bound by a reel-holding-portion binder.
Figure 26:
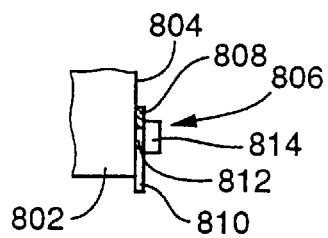
FIG. 26 is a partly-cross-sectioned, front elevation view of the reel-holding-portion binder of FIG. 25 which is engaged with each of the reel-holding portions.

In the embodiment shown in FIGS. 25 to 27 wherein the reel holders 800 are connected to each other by the reel-holder binder 808, it is possible that a cushion member be provided on each of opposite side surfaces of each of the reel containers 802. In this case, even if the cushion members may collide with each other, the generation of noise is minimized. In addition, since the cushion members can be compressed after the collision, the reel holders 800 are allowed to be further pivoted. In the case where the cushion members are formed of a material having a high friction coefficient, or in the case where the cushion members have respective layers each having a high friction coefficient, the vibration of the reel holders 800 is attenuated. Alternatively, like each of the first, second, and fourth embodiments shown in FIGS. 1–18 and 21, it is possible to employ at least one binder delay-and-return device which includes at least one biasing device or at least one damping device and which returns the binder 808 to its reference phase while reducing the speed of returning movement of the binder 808.

In each of the illustrated embodiments, the reel holders 310, 780, 800 may be connected to each other by a flexible reel-holder binder which is formed of, e.g., rubber. In this case, too, the reel holders are prevented from swinging independent of each other. Since the flexible binder can be elastically expanded after each pair of adjacent reel holders contact each other, the reel holders are allowed to be further pivoted relative to the main portions 254, 782, 816. In the case where the reel holders are provided with cushion members, the generation of noise is minimized even if the reel holders may collide with each other. If the cushion members are formed of a material having a high friction coefficient, or if the cushion members have respective layers each having a high friction coefficient, the amplitude of vibration (i.e., pivotal movement) of the reel holders is attenuated because of the friction between the cushion members.

In the embodiment shown in FIGS. 23 and 24, the cushion members 794 may be entirely formed of a material having a high friction coefficient. In this case, too, the vibration of the reel holders 780 is attunuated by the friction of the cushion members 794. In the case where the rotary table is the sectorial table 602, 604, the increase of the sum of the respective dimensions of the reel holders 780 in the direction of rotation of the table is easily allowed. In the case where the rotary table is the circular table 202, the above increase is allowed, e.g., if each pair of adjacent reel holders 780 has a sufficient space therebetween which assures that the holders 780 do not collide with each other when the table 202 is rotated. In the case where only a smaller number of CC feeders than the maximum number of feeders that can be mounted on the circular table 202, are mounted on the table 202, such that the group of feeders exhibits a sectorial shape, the above increase is easily allowed. In the last case, too, the circular table 202 can be used.

In the second embodiment wherein the CC supplying apparatus 598 employs the two sectorial tables 602, 604, it is not essentially required that in the concurrent-table mode, the two sectorial tables be rotated together with each other throughout each CC supplying operation. For example, the two tables may be operated such that while one table is operating in the operating area, the other table is waiting in the waiting area and, immediately before the CC supplying operation using the one table finishes, the other table is moved to follow the one table so that the two tables are rotated together with each other.

In the first embodiment shown in FIGS. 1 to 13, the four connecting devices 402 and the four binder delay-and-return devices 450 are employed between the bucket 400 and the circular table 202. However, each number is not limited to four. For example, it is possible to employ two, three, five or more connecting devices 402 and one, two, three, five or more binder delay-and-return devices 450. As the total number of the binder delay-and-return devices 450 employed increases, the strength of the bucket 400 which may be employed decreases. Since the devices 450 share at least a portion of the inertial forces of the reel holders 310 which should be received by the bucket 400, the more the devices 450 are, the more portion of the inertial forces the devices 450 can share.

In the second embodiment shown in FIGS. 14 to 18, the three connecting devices 668 and the two binder delay-and-return devices 676 are employed between each bucket 660, 662 and the corresponding sectorial table 602, 604. However, those numbers are not limited to three and two, respectively. For example, it is possible to employ two, four or more connecting devices 668 and one, three or more binder delay-and-return devices 676.

In each of the illustrated embodiments, it is made a general rule to rotate the rotary table 202, 602, 604 in one direction only for supplying the circuit components 150 to the PCB 20. However, it is possible to make it a general rule to rotate the rotary table 202, 602, 604 in both directions for supplying the components 150. For example, in the case where the total number of circuit components 150 to be supplied to each PCB 20 of a certain sort is small and the total number of CC feeders needed to supply the components 150 to the each PCB 20 is smaller than the maximum number of feeders that can be attached to the circular table 202, all the feeders can be attached to only a portion of the table 202. In this case, after the table 202 is rotated in one direction to sequentially position the respective component-supply portions of the feeders at the component supplying position and thereby supply the circuit components 150 to one PCB 20, the table 202 may be rotated in the reverse direction to sequentially position the component-supply portions of the feeders in the reverse order at the component supplying position and thereby supply the components 150 to another PCB 20 of the same sort. Thus, it is not needed to return the circular table 202 to its component-supply starting position after the table 202 has been rotated in the one direction for supplying all the necessary components 150 to the one PCB 20. In contrast, this returning operation would needed if the table 202 is rotated in one direction only. Thus, the component-supplying efficiency is improved. In the case where the circular table 202 is rotated in one direction only, if the central angle defined by all the feeders attached to the table 202 is smaller than 180 degrees, the angle by which the table 202 is rotated in the one direction for returning to its component-supply starting position is greater than that by which the table 202 is rotated in the reverse direction. Therefore, if the table 202 is rotated in the reverse direction, the table 202 can return to its starting position in a shorter time. However, this shorter time cannot be zeroed. Thus, in the case where the components 150 are supplied to the PCBs 20 not only when the table 202 is rotated in one direction but also when the table 202 is rotated in the reverse direction, no time is needed for just returning the table 202 to its starting position, which leads to improving the component-supplying efficiency. Even though the central angle defined by all the feeders on the table 202 may be greater than 180 degrees (and smaller than 360 degrees), no time is needed for returning the table 202 to its starting position, if the components 150 are supplied also when the table 202 is rotated in the reverse direction.

Thus, the component-supplying efficiency is improved.

Meanwhile, it is possible to attach, to the circular table 202, a plurality of groups of CC feeders corresponding to a plurality of sorts of PCBs 20, respectively. In this case, the table 202 may be rotated in both directions for supplying components 150 from each group of feeders to the corresponding sort of PCBs 20. The sectorial table or tables 602, 604 may be operated in a similar manner that the feeders 200 held thereby supply the components 150 not only when the table or tables is or are rotated in one direction but also when the table or tables is or are rotated in the reverse direction.

In each of the illustrated embodiments, the reel holders 310, 780, 800 and the bucket 400, 660, 662 are delayed from the main portions 254, 782, 816 and the table 202, 602, 604, respectively, and accordingly the vibration of the holders and the bucket is reduced, irrespective of in which direction the table is rotated. However, in the case where it is made a general rule to rotate the table in one direction only, it is possible to employ only one biasing device and only one damping device. In this case, the biasing device and the damping device are provided between the bucket and the table such that the biasing device is located on the upstream side of the damping device in the direction of rotation of the table. The damping device may be a directional damper which controls the speed of movement of the reel-holder binder 400, 660, 662 when the binder returns to its reference phase, at a value smaller than that when the binder moves away from the reference phase.

In each of the illustrated embodiments, each reel holder 310, 780, 800 has the axis member 320 which supports the reel 308 around which the CC carrier tape 242 is wound, such that the reel is rotatable about the axis member. However, the reel 308 may be rotatably supported by, e.g., a plurality of rollers which are provided in the reel container 314, 786, 802 such that the rollers are rotatable about respective axis lines each parallel to the direction of width of the reel holder.

The embossed-type CC carrier tape 242 may be one which includes a pair of side base tapes and a central base tape which is supported by the two side base tapes. The central base tape has a number of CC-accommodating portions which project downward from the two side base tapes and which define a number of CC-accommodating pockets, respectively, at a regular interval of distance. However, the embossed-type CC carrier tape 242 may be replaced by a different CC carrier tape. For example, the CC carrier tape may be one which includes (a) a CC-accommodating tape having a constant thickness and having a number of CC-accommodating pockets at a regular interval in which a number of circuit components 150 are accommodated, respectively; and (b) a cover tape which covers respective upper openings of the CC-accommodating pockets for preventing the components 150 from jumping out of the pockets. In the last case, the CC carrier tape is fed forward in the state in which the entire width of the CC-accommodating tape is entirely supported on the guide surface of the main portion 254, 782, 802 of each feeder.

The present invention may be embodied in such a manner that one or more elements of each one of the illustrated embodiments are combined with one or more elements of one or more other embodiments.

It is to be understood that the present invention may be embodied with other changes, improvements, and modifications that may occur to those skilled in the art without departing from the scope and spirit of the invention.

What is claimed is:

1. A feeder for storing a plurality of circuit components of a same sort and supplying the components one by one from a component-supply portion thereof, the feeder comprising:

a tape-feeding mechanism which engages a tape carrying the circuit components and unwinds and feeds the tape from a reel to the component-supply portion;

an elongate frame which is adapted to be held by a table such that the elongate frame extends in a substantially horizontal direction and includes a central portion in said substantially horizontal direction, and which includes the component-supply portion, supports the tape-feeding mechanism, and additionally includes a tape-guide portion which guides the tape fed from the reel to the component-supply portion, along a tape-guide path a portion of which extends in a lengthwise direction of the elongate frame; and a reel-holding portion which is connected to, and pendent from, the elongate frame so as to be mounted independently of the table, and which holds the reel around which the tape is wound, such that all of the reel is vertically positioned below the elongate frame and a majority of the reel is within vertical planes defined by opposite end portions of the elongate frame.

2. A feeder according to claim 1, wherein the table on which the elongate frame is adapted to be held is a movable table, and wherein the feeder further comprises a reel-holding portion connecting device which connects the reel-holding portion to the elongate frame such that a center of gravity of the reel-holding portion and the reel held thereby is movable relative to the elongate frame in a first direction substantially parallel to a second direction in which the elongate frame is moved with the movable table.

3. A feeder according to claim 2, wherein the reel-holding portion connecting device comprises connecting means for connecting the reel-holding portion to the elongate frame such that a whole of the reel-holding portion is substantially parallel-translatable relative to the elongate frame in the first direction.

4. A feeder according to claim 3, wherein the connecting means comprises:

at least one connecting member which extends in a substantially vertical direction;

a first hinge device which connects one of opposite end portions of the connecting member to the elongate frame, such that the connecting member is pivotable about a first axis line which is perpendicular to the second direction; and a second hinge device which connects the other end portion of the connecting member to the reel-holding portion, such that the connecting member is pivotable about a second axis line which is perpendicular to the second direction and which is distant from the first axis line in a vertical direction.

5. A feeder according to claim 2, wherein the reel-holding portion connecting device comprises means for connecting the reel-holding portion to the elongate frame such that the reel-holding portion is pivotable relative to the elongate frame about an axis line which is perpendicular to the second direction.

6. A feeder according to claim 2, wherein the reel-holding portion connecting device comprises relative-rotation allowing means for allowing the reel-holding portion to be rotated relative to the elongate frame about a substantially vertical axis line.

7. A feeder according to claim 6, wherein the relative-rotation allowing means comprises a torsion member which is elastically twistable about a substantially vertical axis line.

8. A feeder according to claim 1, wherein the reel-holding portion is pendent from an intermediate portion of the elongate frame in the lengthwise direction thereof.

9. A feeder according to claim 8, wherein the elongate frame includes a held portion which is located on a first of two opposite sides of the intermediate portion thereof and which is adapted to be held by the table.

10. A feeder according to claim 9, wherein the component-supply portion of the elongate frame is located on the other of the opposite sides of the intermediate portion of the elongate frame.

11. A feeder according to claim 1, wherein the table on which the elongate frame is adapted to be held is a movable table, and wherein the feeder further comprises a reel-holding portion connecting device which connects the reel-holding portion to the elongate frame such that the reel-holding portion is pendent from the elongate frame and, when the reel-holding portion is subjected to a force exerted thereto in a horizontal direction, the reel-holding portion is moved, by the force, relative to the elongate frame in the horizontal direction.

* * * * *